(12) United States Patent
Chida

(10) Patent No.: US 10,734,596 B2
(45) Date of Patent: Aug. 4, 2020

(54) LIGHT-EMITTING DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Akihiro Chida, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 16/580,432

(22) Filed: Sep. 24, 2019

(65) Prior Publication Data

US 2020/0020875 A1 Jan. 16, 2020

Related U.S. Application Data

(63) Continuation of application No. 15/948,223, filed on Apr. 9, 2018, now Pat. No. 10,490,766, which is a
(Continued)

(30) Foreign Application Priority Data

Mar. 14, 2013 (JP) ................................ 2013-051231
Apr. 26, 2013 (JP) ................................ 2013-093328
Jun. 7, 2013 (JP) ................................ 2013-120369

(51) Int. Cl.
*H01L 27/32* (2006.01)
*H01L 51/56* (2006.01)
(Continued)

(52) U.S. Cl.
CPC ...... *H01L 51/5203* (2013.01); *H01L 27/1214* (2013.01); *H01L 27/1266* (2013.01);
(Continued)

(58) Field of Classification Search
CPC ... H01L 51/003; H01L 51/5203; H01L 51/56; H01L 27/3276; H01L 27/1266;
(Continued)

(56) References Cited

U.S. PATENT DOCUMENTS 6,127,199 A 10/2000 Inoue et al.
6,894,431 B2 5/2005 Yamazaki et al.
(Continued)

FOREIGN PATENT DOCUMENTS

EP 1109224 A 6/2001
JP 2000-150143 A 5/2000
(Continued)

OTHER PUBLICATIONS

Specification, Claims, Abstract and Drawings of U.S. Appl. No. 14/202,828.
(Continued)

*Primary Examiner* — Michael M Trinh
(74) *Attorney, Agent, or Firm* — Robinson Intellectual Property Law Office; Eric J. Robinson

(57) ABSTRACT

A highly reliable light-emitting device and a manufacturing method thereof are provided. A light-emitting element and a terminal electrode are formed over an element formation substrate; a first substrate having an opening is formed over the light-emitting element and the terminal electrode with a bonding layer provided therebetween; an embedded layer is formed in the opening; a transfer substrate is formed over the first substrate and the embedded layer; the element formation substrate is separated; a second substrate is formed under the light-emitting element and the terminal electrode; and the transfer substrate and the embedded layer are removed. In addition, an anisotropic conductive connection layer is formed in the opening, and an electrode is formed over the anisotropic conductive connection layer. The ter-
(Continued)

minal electrode and the electrode are electrically connected to each other through the anisotropic conductive connection layer.

6 Claims, 30 Drawing Sheets

Related U.S. Application Data continuation of application No. 15/259,325, filed on Sep. 8, 2016, now Pat. No. 9,978,981, which is a continuation of application No. 14/943,330, filed on Nov. 17, 2015, now Pat. No. 9,444,020, which is a continuation of application No. 14/620,425, filed on Feb. 12, 2015, now Pat. No. 9,196,813, which is a continuation of application No. 14/202,810, filed on Mar. 10, 2014, now Pat. No. 8,956,891.

(51) Int. Cl.
  *H01L 51/52* (2006.01)
  *H01L 33/62* (2010.01)
  *H01L 51/00* (2006.01)
  *H01L 27/12* (2006.01)
  *H01L 33/20* (2010.01)
  *H01L 33/48* (2010.01)
  *H01L 33/00* (2010.01)

(52) U.S. Cl.
  CPC ........ *H01L 27/3276* (2013.01); *H01L 33/005* (2013.01); *H01L 33/20* (2013.01); *H01L 33/483* (2013.01); *H01L 33/62* (2013.01); *H01L 51/003* (2013.01); *H01L 51/0024* (2013.01); *H01L 51/0097* (2013.01); *H01L 51/56* (2013.01); *H01L 2224/4847* (2013.01); *H01L 2227/323* (2013.01); *H01L 2227/326* (2013.01); *H01L 2251/5338* (2013.01); *H01L 2924/0002* (2013.01); *H01L 2924/12044* (2013.01); *H01L 2933/0033* (2013.01); *H01L 2933/0066* (2013.01)

(58) Field of Classification Search
  CPC ..... H01L 33/483; H01L 33/005; H01L 33/62; H01L 2251/5338; H01L 2227/326; H01L 2227/323
  See application file for complete search history.

(56) References Cited

U.S. PATENT DOCUMENTS

| | | | |
|---|---|---|---|
| 7,129,523 B2 | 10/2006 | Yamazaki et al. |
| 7,145,289 B2 | 12/2006 | Yamazaki et al. |
| 7,342,354 B2 | 3/2008 | Utsunomiya et al. |
| 7,514,864 B2 | 4/2009 | Yamazaki et al. |
| 7,736,964 B2 | 6/2010 | Yamamoto et al. |
| 8,049,419 B2 | 11/2011 | Yamazaki et al. |
| 8,164,099 B2 | 4/2012 | Yamazaki et al. |
| 8,222,666 B2 | 7/2012 | Hatano et al. |
| 8,284,369 B2 | 10/2012 | Chida et al. |
| 8,319,424 B2 | 11/2012 | Yamazaki et al. |
| 8,367,440 B2 | 2/2013 | Takayama et al. |
| 8,415,208 B2 | 4/2013 | Takayama et al. |
| 8,450,769 B2 | 5/2013 | Hatano et al. |
| 8,716,933 B2 | 5/2014 | Yamazaki et al. |
| 8,956,891 B2 | 2/2015 | Chida |
| 9,196,813 B2 | 11/2015 | Chida |
| 9,331,310 B2 | 5/2016 | Chida et al. |
| 9,337,244 B2 | 5/2016 | Hatano et al. |
| 9,368,517 B2 | 6/2016 | Yamazaki et al. |
| 9,444,020 B2 | 9/2016 | Chida |
| 9,515,098 B2 | 12/2016 | Yamazaki et al. |
| 9,843,015 B2 | 12/2017 | Yamazaki et al. |
| 9,923,174 B2 | 3/2018 | Chida et al. |
| 2001/0040645 A1 | 11/2001 | Yamazaki |
| 2003/0034497 A1 | 2/2003 | Yamazaki et al. |
| 2003/0129790 A1 | 7/2003 | Yamazaki et al. |
| 2004/0245924 A1 | 12/2004 | Utsunomiya et al. |
| 2005/0110023 A1* | 5/2005 | Lee ................ H01L 27/3276 257/72 |
| 2008/0303408 A1 | 12/2008 | Yamazaki et al. |
| 2009/0108728 A1 | 4/2009 | Ushimaru et al. |
| 2010/0045919 A1* | 2/2010 | Chida ............ H01L 27/1248 349/149 |
| 2010/0096633 A1* | 4/2010 | Hatano ........... H01L 29/78678 257/59 |
| 2012/0153293 A1 | 6/2012 | Koyama et al. |
| 2012/0206680 A1 | 8/2012 | Onishi |
| 2012/0217516 A1* | 8/2012 | Hatano ............. H01L 51/525 257/88 |
| 2013/0157422 A1 | 6/2013 | Yamazaki |
| 2013/0194550 A1 | 8/2013 | Tanigawa et al. |
| 2013/0240855 A1* | 9/2013 | Chida ............. H01L 51/5203 257/40 |
| 2014/0240637 A1 | 8/2014 | Onishi |
| 2014/0264425 A1* | 9/2014 | Chida ............. H01L 51/5203 257/99 |
| 2018/0205042 A1 | 7/2018 | Chida et al. |

FOREIGN PATENT DOCUMENTS

| | | |
|---|---|---|
| JP | 2000-164353 A | 6/2000 |
| JP | 2001-236025 A | 8/2001 |
| JP | 2003-174153 A | 6/2003 |
| JP | 2009-109770 A | 5/2009 |
| JP | 2011-192567 A | 9/2011 |
| JP | 2012-003988 A | 1/2012 |
| JP | 2012-178262 A | 9/2012 |
| JP | 2013-251255 A | 12/2013 |
| KR | 2012-0072710 A | 7/2012 |
| TW | 201244204 | 11/2012 |
| WO | WO-2012/115016 | 8/2012 |

OTHER PUBLICATIONS

Taiwanese Office Action (Application No. 103109055) dated Jul. 11, 2017.

* cited by examiner

LIGHT-EMITTING DEVICE AND METHOD FOR MANUFACTURING THE SAME

BACKGROUND OF THE INVENTION

1. Field of the Invention

The present invention relates to a light-emitting device. The present invention also relates to a method for manufacturing the light-emitting device.

In this specification, a semiconductor device means all types of devices that can function by utilizing semiconductor characteristics, and an electro-optical device, a light-emitting device, a display device, a semiconductor circuit, and an electronic appliance are all semiconductor devices.

2. Description of the Related Art

In recent years, research and development have been extensively conducted on light-emitting elements utilizing electroluminescence (EL). In a basic structure of such a light-emitting element, a layer containing a light-emitting substance is interposed between a pair of electrodes. By applying voltage to the element, light emission from the light-emitting substance can be obtained.

The above light-emitting element is a self-luminous element; thus, a light-emitting device including the light-emitting element has advantages such as high visibility, no necessity of a backlight, and low power consumption. In addition, the light-emitting device has advantages in that it can be manufactured to be thin and lightweight and has fast response speed.

Since a light-emitting device including the above light-emitting element can be flexible, use of the light-emitting device for a flexible substrate has been proposed.

As a method for manufacturing a light-emitting device using a flexible substrate, a technique has been developed in which a semiconductor element such as a thin film transistor is manufactured over a substrate such as a glass substrate or a quartz substrate, for example, a space between the semiconductor element and another substrate is filled with an organic resin, and then the semiconductor element is transferred from the glass substrate or the quartz substrate to the other substrate (e.g., a flexible substrate) (Patent Document 1).

In some cases, over a light-emitting element that has been formed over a flexible substrate, another flexible substrate is provided in order to protect a surface of the light-emitting element or prevent entry of moisture or impurities from the outside.

Patent Document 2 and Patent Document 3 each disclose technological thought in which a groove is formed in a flexible substrate and part of the flexible substrate is removed along the groove in order to expose a terminal electrode to which an external signal is input.

PATENT DOCUMENT

Patent Document 1: Japanese Published Patent Application No. 2003-174153
Parent Document 2: Japanese Published Patent Application No. 2000-150143
Patent Document 3: Japanese Published Patent Application No. 2009-109770

SUMMARY OF THE INVENTION

In order to supply a signal or electric power to a light-emitting device, it is necessary that part of a flexible substrate be removed to expose a terminal electrode so that an electrode such as a flexible printed circuit (FPC) is connected to the terminal electrode. In addition, it is preferable that the terminal electrode be provided near a display area in order to suppress signal attenuation, electric power attenuation, or the like due to wiring resistance.

In the case where a flexible substrate is provided over a light-emitting element or a terminal electrode, the flexible substrate is often provided over the light-emitting element or the terminal electrode with a bonding layer provided therebetween. Thus, in the above-described methods disclosed in the patent documents, the bonding layer might remain on the terminal electrode at the time of removal of a portion of the flexible substrate that overlaps the terminal electrode. In addition, the terminal electrode is damaged easily at the time of removal of the bonding layer.

A method in which part of a flexible substrate is removed by laser light or with an edged tool has a problem in that a terminal electrode included in a light-emitting device is damaged easily and the reliability and manufacturing yield of the light-emitting device are reduced easily. In addition, a display area and a terminal electrode need to be provided with a sufficient space therebetween in order to prevent damage to the display area due to the above-described method; for this reason, signal attenuation, electric power attenuation, or the like due to an increase in wiring resistance is caused easily.

An object of one embodiment of the present invention is to provide a method for manufacturing a light-emitting device that does not easily damage a terminal electrode.

Another object of one embodiment of the present invention is to provide a method for manufacturing a light-emitting device that does not easily damage a display area.

Another object of one embodiment of the present invention is to provide a highly reliable light-emitting device and a method for manufacturing the same.

Another object of one embodiment of the present invention is to provide a novel light-emitting device and a method for manufacturing the same.

One embodiment of the present invention is a method for manufacturing a light-emitting device that includes the steps of: forming a light-emitting element and a terminal electrode over an element formation substrate with a separation layer provided therebetween; forming a first substrate having a first opening over the light-emitting element and the terminal electrode with a bonding layer having a second opening provided therebetween; forming an embedded layer in the openings; forming a transfer substrate over the first substrate and the embedded layer; separating the element formation substrate from the light-emitting element and the terminal electrode; forming a second substrate below the light-emitting element and the terminal electrode; removing the transfer substrate and the embedded layer; forming an anisotropic conductive connection layer in the first opening and the second opening; and forming an external electrode electrically connected to the terminal electrode through the anisotropic conductive connection layer.

In the method for manufacturing the light-emitting device, the first opening of the first substrate and the second opening of the bonding layer overlap the terminal electrode.

Using a flexible substrate as the first substrate enables a flexible light-emitting device to be manufactured. Using a flexible substrate as the second substrate enables a flexible light-emitting device to be manufactured.

It is preferable that the embedded layer be formed using a soluble resin.

Another embodiment of the present invention is a method for manufacturing a light-emitting device that includes the steps of: forming a light-emitting element and a terminal electrode over an element formation substrate with a separation layer provided therebetween; forming a first substrate over the light-emitting element and the terminal electrode with a first bonding layer provided therebetween; separating the element formation substrate from the light-emitting element and the terminal electrode; forming a second substrate having an opening under the light-emitting element with a second bonding layer provided therebetween; forming an anisotropic conductive connection layer so as to overlap the opening; and forming an external electrode electrically connected to the terminal electrode through the anisotropic conductive connection layer.

Another embodiment of the present invention is a method for manufacturing a light-emitting device that includes: a first step of forming a separation layer over an element formation substrate; a second step of forming an insulating layer over the separation layer; a third step of selectively removing part of the insulating layer to form a first opening, in which part of the separation layer is exposed; a fourth step of oxidizing an exposed surface of the separation layer; a fifth step of forming a terminal electrode overlapping the first opening; a sixth step of forming a light-emitting element; a seventh step of forming a first substrate over the light-emitting element and the terminal electrode with a first bonding layer provided therebetween; an eighth step of separating the element formation substrate; a ninth step of forming a second substrate having a second opening under the light-emitting element and the terminal electrode with a second bonding layer provided therebetween; and a tenth step of forming an external electrode electrically connected to the terminal electrode in the second opening. Note that overlap of the first opening with the second opening enables electrical connection between the terminal electrode and the external electrode.

Using a flexible substrate as the first substrate enables a flexible light-emitting device to be manufactured. Using a flexible substrate as the second substrate enables a flexible light-emitting device to be manufactured.

When attachment of the second substrate having the opening is performed so that the opening overlaps the terminal electrode, a region of the second substrate that overlaps the terminal electrode does not need to be removed by laser light, with an edged tool, or the like; for this reason, a display area and the terminal electrode are not easily damaged. In addition, the distance between the display area and the opening can be shortened; thus, signal attenuation or electrical power attenuation can be suppressed. In addition, the manufacturing process is simplified; thus, the productivity of the light-emitting device can be increased.

One embodiment of the present invention is a light-emitting device that includes a light-emitting element and a terminal electrode over a first substrate, a first layer over the terminal electrode, a second layer over the first layer, and a second substrate having a first portion over the light-emitting element, the first layer, the second layer, and a metal layer with a bonding layer therebetween. The first portion overlaps the terminal electrode, the first layer, and the second layer.

A flexible substrate is used as the first substrate. A flexible substrate is used as the second substrate.

The first layer is formed using an organic material. The second layer is formed using a metal material.

Another embodiment of the present invention is a method for manufacturing a light-emitting device that includes the steps of: forming a light-emitting element and a terminal electrode over an element formation substrate with a separation layer provided therebetween; forming a first layer over the terminal electrode; forming a second layer over the first layer; forming a second substrate having a first portion over the light-emitting element, the terminal electrode, the first layer, and the second layer with a bonding layer provided therebetween so that the first portion overlaps the terminal electrode, the first layer, and the second layer; separating the element formation substrate from the light-emitting element and the terminal electrode; and forming a first substrate under the light-emitting element and the terminal electrode.

A flexible substrate is used as the first substrate. A flexible substrate is used as the second substrate.

The first layer is formed using an organic material. The second layer is formed using a metal material.

Surrounding the first portion with perforations can facilitate separation of the first portion from the second substrate. In addition, the first portion overlaps the first layer and the second layer, whereby the bonding layer that the first portion overlaps can also be removed at the time of the separation of the first portion and the terminal electrode can be exposed easily.

The exposed terminal electrode can be electrically connected to an external electrode.

An FPC or a metal wire can be used as the external electrode. In the case of using a metal wire as the external electrode, the metal wire and the terminal electrode can be connected to each other by a wire bonding method or a soldering method without using an anisotropic conductive connection layer.

One embodiment of the present invention can provide a method for manufacturing a light-emitting device that does not easily damage a terminal electrode.

One embodiment of the present invention can provide a method for manufacturing a light-emitting device that does not easily damage a display area.

One embodiment of the present invention can provide a highly reliable light-emitting device and a method for manufacturing the same.

One embodiment of the present invention can provide a novel light-emitting device and a method for manufacturing the same.

DETAILED DESCRIPTION OF THE INVENTION

Figure 1A:
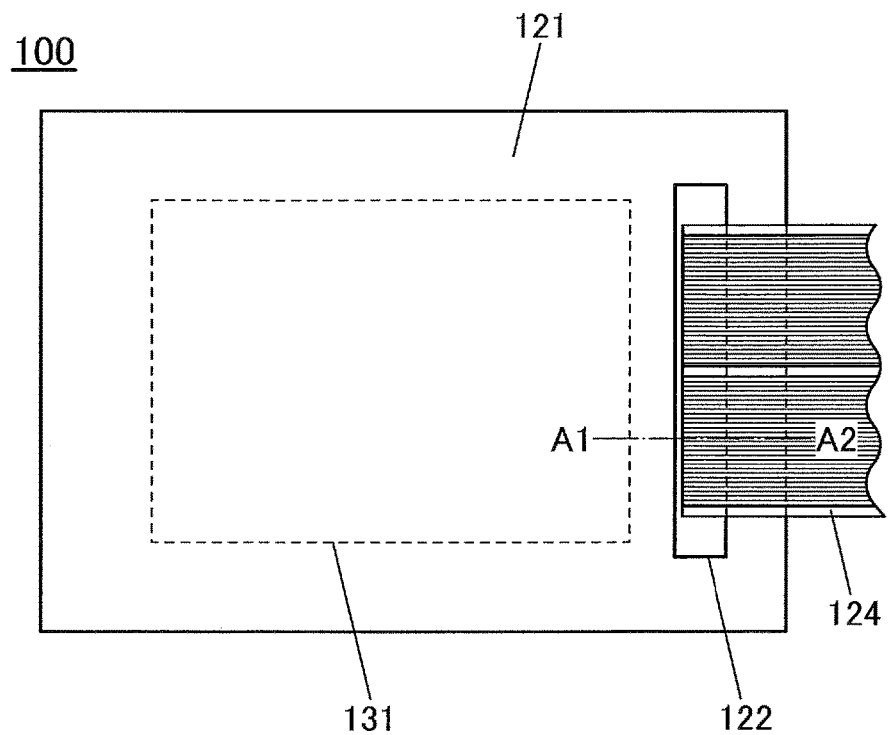
FIG. 1A is a top view illustrating a light-emitting device and FIG. 1B is a cross-sectional view illustrating the same.

Embodiments will be described in detail with reference to the accompanying drawings. Note that the present invention is not limited to the description below, and it is understood easily by those skilled in the art that various changes and modifications can be made without departing from the spirit and scope of the present invention. Therefore, the present invention should not be construed as being limited to the description in the following embodiments. In the structures of the present invention to be described below, the same portions or portions having similar functions are denoted by the same reference numerals in different drawings, and explanation thereof will not be repeated.

Note that in each drawing referred to in this specification, the size of each component or the thickness of each layer might be exaggerated or a region might be omitted for clarity of the invention. Therefore, embodiments of the invention are not limited to such scales. Especially in a top view, some components might not be illustrated for easy understanding.

The position, size, range, and the like of each component illustrated in the drawings and the like are not accurately represented in some cases to facilitate understanding of the invention. Therefore, the disclosed invention is not necessarily limited to the position, the size, range, and the like disclosed in the drawings and the like.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim. Moreover, an ordinal number provided for a term in this specification and the like might be omitted in a claim.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Embodiment 1

Figure 1B:
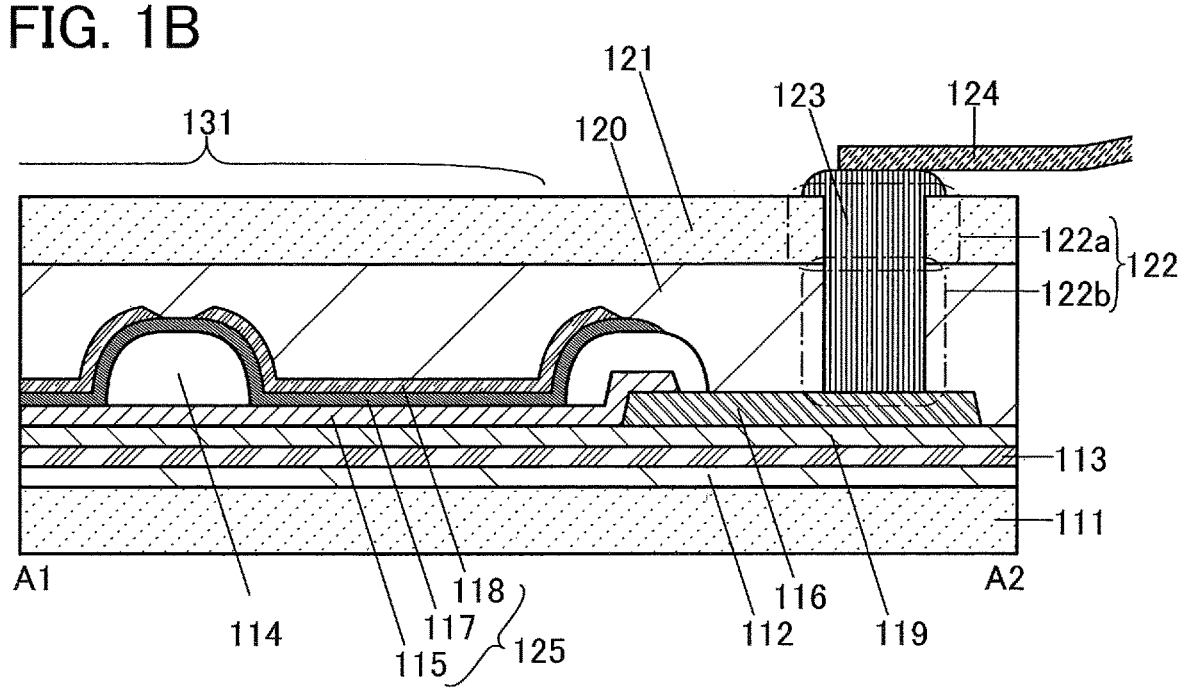

A structure example of a light-emitting device 100 of one embodiment of the present invention is described with reference to FIGS. 1A and 1B. FIG. 1A is a top view of the light-emitting device 100 and FIG. 1B is a cross-sectional view taken along the dashed-dotted line A1-A2 in FIG. 1A. Note that the light-emitting device 100 disclosed in this specification is a display device in which a light-emitting element is used as a display element.

<Structure of Light-Emitting Device>

The light-emitting device 100 described in this embodiment includes an electrode 115, an EL layer 117, an electrode 118, a partition 114, and a terminal electrode 116. The electrode 115 and the terminal electrode 116 are electrically connected to each other. In addition, in the light-emitting device 100, the partition 114 is formed over the electrode 115, the EL layer 117 is formed over the electrode 115 and the partition 114, and the electrode 118 is formed over the EL layer 117.

A light-emitting element 125 includes the electrode 115, the EL layer 117, and the electrode 118. In addition, the light-emitting element 125 is formed over a substrate 111 with a bonding layer 112, a separation layer 113, and a base layer 119 provided therebetween. Note that a plurality of light-emitting elements 125 are provided in a display area 131.

In the light-emitting device 100 described in this embodiment, a substrate 121 is formed over the electrode 118 with a bonding layer 120 provided therebetween. The substrate 121 has an opening 122a overlapping the terminal electrode 116. The bonding layer 120 has an opening 122b that the opening 122a overlaps. In this specification, the opening 122a and the opening 122b are collectively called an opening 122. In the opening 122, an external electrode 124 and the terminal electrode 116 are electrically connected to each other through an anisotropic conductive connection layer 123.

A switching element for controlling a signal supplied to the light-emitting element 125 may be provided between the light-emitting element 125 and the terminal electrode 116. For example, a transistor may be provided between the light-emitting element 125 and the terminal electrode 116.

A transistor is a kind of semiconductor element and enables amplification of current or voltage, switching operation for controlling conduction or non-conduction, or the like. By providing a transistor between the light-emitting element 125 and the terminal electrode 116, the area of the display area 131 can be increased easily and a higher-resolution display can be achieved easily. Note that a resistor, an inductor, a capacitor, or the like, without limitation to a switching element such as a transistor, can be provided in the display area 131.

<Substrates>

An organic resin material, a glass material that is thin enough to have flexibility, or the like can be used for the substrate 111 and the substrate 121. In the case where the light-emitting device 100 is a bottom-emission light-emitting device or a dual-emission light-emitting device, a material that transmits light emitted from the EL layer 117 is used for the substrate 111. In the case where the light-emitting device 100 is a top-emission light-emitting device or a dual-emission light-emitting device, a material that transmits light emitted from the EL layer 117 is used for the substrate 121.

As a material that has flexibility and transmits visible light, which can be used for the substrate 111 and the substrate 121, the following can be used: a polyethylene terephthalate resin, a polyethylene naphthalate resin, a polyacrylonitrile resin, a polyimide resin, a polymethylmethacrylate resin, a polycarbonate resin, a polyethersulfone resin, a polyamide resin, a cycloolefin resin, a polystyrene resin, a polyamide imide resin, a polyvinylchloride resin, or the like.

The thermal expansion coefficients of the substrate 111 and the substrate 121 are preferably less than or equal to 30 ppm/K, more preferably less than or equal to 10 ppm/K. In addition, on surfaces of the substrate 111 and the substrate 121, a protective film having low water permeability may be formed in advance; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the substrate 111 and the substrate 121.

<Base Layer>

The base layer 119 is preferably formed as a single layer or a multilayer using silicon oxide, silicon nitride, silicon oxynitride, silicon nitride oxide, aluminum oxide, aluminum oxynitride, aluminum nitride oxide, or the like. The base layer 119 can be formed by a sputtering method, a CVD method, a thermal oxidation method, a coating method, a printing method, or the like.

The base layer 119 can prevent or reduce diffusion of impurity elements from the substrate 111, the bonding layer 112, or the like to the light-emitting element 125.

<Terminal Electrode>

The terminal electrode 116 can be formed using a conductive material. For example, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. A semiconductor typified by polycrystalline silicon including an impurity element such as phosphorus, or silicide such as nickel silicide may also be used. There is no particular limitation on the formation method of the conductive material, and a variety of formation methods such as an evaporation method, a CVD method, a sputtering method, and a spin coating method can be employed.

The terminal electrode 116 can also be formed using a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to use a stacked-layer structure formed using the above conductive material containing oxygen and a material containing the above metal element.

The terminal electrode 116 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure in which a titanium layer, an aluminum layer, and a titanium layer are stacked in this order are given. Alternatively, a layer, an alloy layer, or a nitride layer containing aluminum and one or more elements selected from titanium, tantalum, tungsten, molybdenum, chromium, neodymium, and scandium may be used.

<Electrode 115>

The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an indium tin oxide layer, having a work function higher than that of the EL layer 117 and a layer having high reflectance (e.g., aluminum, an alloy containing aluminum, or silver) may be provided in contact with the layer.

The light-emitting device having a top emission structure is described as an example in this embodiment. In the case of a light-emitting device having a bottom emission structure or a dual emission structure, the electrode 115 may be formed using a light-transmitting conductive material.

<Partition>

The partition 114 is provided in order to prevent an electrical short circuit between the adjacent electrodes 118. In the case of using a metal mask for formation of the EL layer 117 described later, the partition 114 has a function of preventing the contact of metal mask with a region where the light-emitting element 125 is formed. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

<EL Layer>

A structure of the EL layer 117 is described in Embodiment 9.

<Electrode 118>

The electrode 118 is used as a cathode in this embodiment, and thus is preferably formed using a material that has a low work function and can inject electrons into the EL layer 117 described later. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used as the electrode 118. As the buffer layer, an oxide of an alkaline earth metal, a halide, a magnesium-silver alloy, or the like can also be used.

In the case where light emitted from the EL layer 117 is extracted through the electrode 118, the electrode 118 preferably has a property of transmitting visible light.

<Bonding Layers>

The bonding layer 120 is in contact with the electrode 118 in this embodiment. The substrate 121 is fixed by the bonding layer 120. The bonding layer 112 is in contact with the separation layer 113. The substrate 111 is fixed by the bonding layer 112. A light curable adhesive, a reaction curable adhesive, a thermosetting adhesive, or an anaerobic adhesive can be used as the bonding layer 120 and the bonding layer 112. For example, an epoxy resin, an acrylic resin, or an imide resin can be used. A drying agent (e.g., zeolite) having a size less than or equal to the wavelength of light or a filler (e.g., titanium oxide or zirconium) with a high refractive index is preferably mixed into the bonding layer 120 in the case of a top emission structure or into the bonding layer 112 in the case of a bottom emission structure, in which case the efficiency of extracting light emitted from the EL layer 117 can be improved.

<Separation Layer>

The separation layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The separation layer 113 can also be formed to have a single-layer structure or a stacked-layer structure using any of the materials. Note that the crystalline structure of the separation layer 113 may be amorphous, microcrystalline, or polycrystalline. The separation layer 113 can also be formed using a metal oxide such as aluminum oxide, gallium oxide, zinc oxide, titanium dioxide, indium oxide, indium tin oxide, indium zinc oxide, or InGaZnO (IGZO).

The separation layer 113 can be formed by a sputtering method, a CVD method, a coating method, a printing method, or the like. Note that the coating method includes a spin coating method, a droplet discharge method, and a dispensing method.

In the case where the separation layer 113 has a single-layer structure, the separation layer 113 is preferably formed using tungsten, molybdenum, or a tungsten-molybdenum alloy. Alternatively, the separation layer 113 is preferably formed using an oxide or oxynitride of tungsten, an oxide or oxynitride of molybdenum, or an oxide or oxynitride of a tungsten-molybdenum alloy.

In the case where the separation layer 113 has a stacked-layer structure including, for example, a layer containing tungsten and a layer containing an oxide of tungsten, the layer containing an oxide of tungsten may be formed as follows: the layer containing tungsten is formed first and then an insulating oxide layer is formed in contact therewith, so that the layer containing an oxide of tungsten is formed at the interface between the layer containing tungsten and the insulating oxide layer. Alternatively, the layer containing an oxide of tungsten may be formed by performing thermal oxidation treatment, oxygen plasma treatment, treatment with a highly oxidizing solution such as ozone water, or the like on the surface of the layer containing tungsten.

<Anisotropic Conductive Connection Layer>

The anisotropic conductive connection layer 123 can be formed using any of various kinds of anisotropic conductive films (ACF), anisotropic conductive pastes (ACP), and the like.

The anisotropic conductive connection layer 123 is formed by curing a paste-form or sheet-form material that is obtained by mixing conductive particles to a thermosetting resin or a thermosetting, light curable resin. The anisotropic conductive connection layer 123 exhibits an anisotropic conductive property by light irradiation or thermocompression bonding. As the conductive particles used for the anisotropic conductive connection layer 123, for example, particles of a spherical organic resin coated with a thin-film metal such as Au, Ni, or Co can be used.

<Method for Manufacturing Light-Emitting Device>

Next, a method for manufacturing the light-emitting device 100 is described with reference to FIGS. 2A to 2E, FIGS. 3A to 3C, FIGS. 4A and 4B, FIGS. 5A and 5B, and FIGS. 6A and 6B. FIGS. 2A to 6B are cross-sectional views taken along the dashed-dotted line A1-A2 in FIG. 1A.

<Formation of Separation Layer>

Figure 2A:
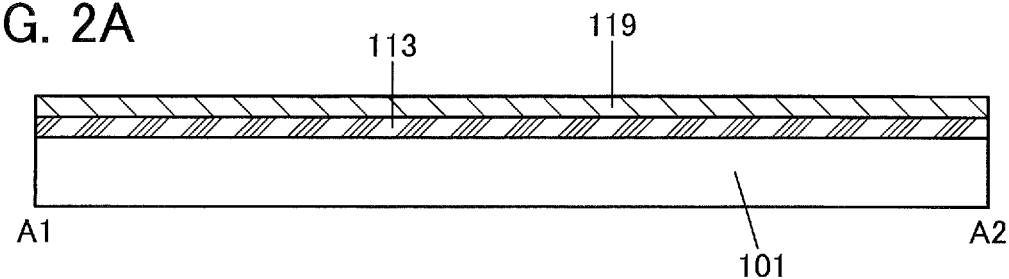
FIGS. 2A to 2E are cross-sectional views illustrating a method for manufacturing a light-emitting device.
Figure 2B:
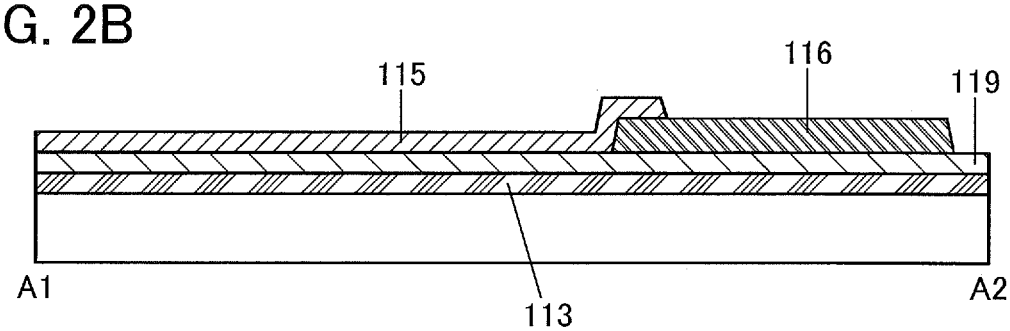

First, the separation layer 113 is formed over an element formation substrate 101 (see FIG. 2A). Note that the element formation substrate 101 may be a glass substrate, a quartz substrate, a sapphire substrate, a ceramic substrate, a metal substrate, or the like. Alternatively, the element formation substrate 101 may be a plastic substrate having heat resistance to the processing temperature in this embodiment.

As the glass substrate, for example, a glass material such as aluminosilicate glass, aluminoborosilicate glass, or barium borosilicate glass is used. Note that when the glass substrate contains a large amount of barium oxide (BaO), the glass substrate can be heat-resistant and more practical. Alternatively, crystallized glass or the like may be used.

In this embodiment, the separation layer 113 is formed of tungsten by a sputtering method.

<Formation of Base Layer>

Next, the base layer 119 is formed over the separation layer 113 (see FIG. 2A). In this embodiment, the base layer 119 is formed of silicon oxide by a plasma CVD method.

<Formation of Terminal Electrode>

Next, the terminal electrode 116 is formed over the base layer 119. First, a three-layer metal film in which aluminum is interposed between two layers of molybdenum is formed over the base layer 119 by a sputtering method. After that, a resist mask is formed over the metal film, and the metal film is etched into a desired shape with the use of the resist mask. In the above-described manner, the terminal electrode 116 can be formed. The resist mask can be formed by a photolithography method, a printing method, an inkjet method, or the like as appropriate. Formation of the resist mask by an inkjet method needs no photomask; thus, manufacturing costs can be reduced.

The metal film may be etched by either a dry etching method or a wet etching method, or by both a dry etching method and a wet etching method. In the case where the metal film is etched by a wet etching method, a solution obtained by mixing phosphoric acid, acetic acid, and nitric acid, a solution containing oxalic acid, a solution containing phosphoric acid, or the like can be used as an etchant. After the etching treatment, the resist mask is removed (see FIG. 2B).

<Formation of Electrode 115>

Next, the electrode 115 is formed over the base layer 119. The electrode 115 can be formed in a manner similar to that of the terminal electrode 116. In this embodiment, the electrode 115 is formed using a material in which indium tin oxide is stacked over silver. The electrode 115 and the terminal electrode 116 are electrically connected to each other (see FIG. 2B).

<Formation of Partition>

Figure 2C:
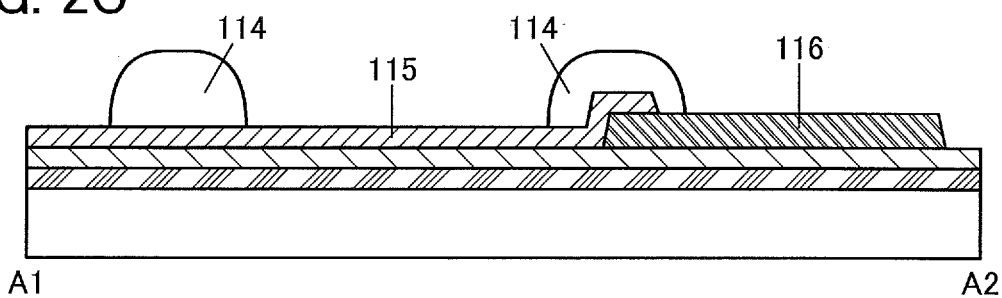

Next, the partition 114 is formed (see FIG. 2C). In this embodiment, the partition 114 is formed in such a manner that a photosensitive organic resin material is applied by a coating method and processed into a desired shape. In this embodiment, the partition 114 is formed using a photosensitive imide resin.

<Formation of EL layer>

Figure 2D:
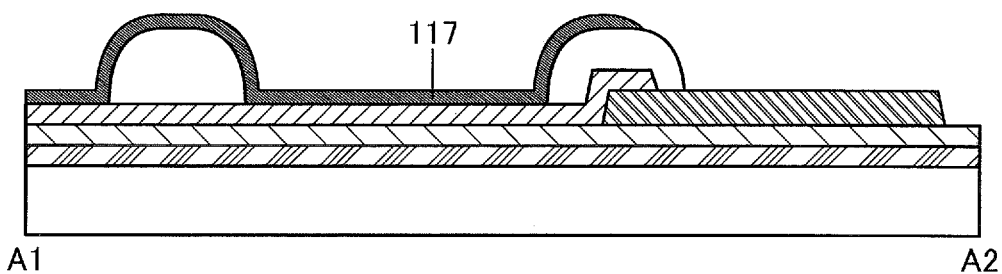
Figure 2E:
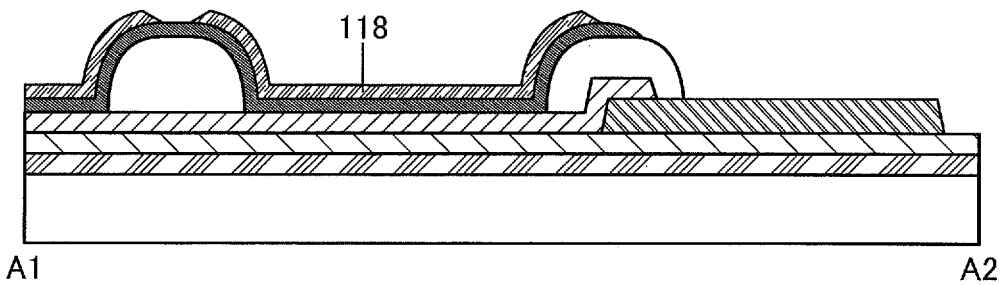

Next, the EL layer 117 is formed over the electrode 115 and the partition 114 (see FIG. 2D).

<Formation of Electrode 118>

Next, the electrode 118 is formed in contact with the EL layer 117. The electrode 118 can be formed by an evaporation method, a sputtering method, or the like (see FIG. 2E).

<Formation of Substrate>

Next, the substrate 121 having the opening 122a is formed over the electrode 118 with the bonding layer 120 provided therebetween. At this time, the opening 122a of the substrate 121 is positioned so as to overlap the terminal electrode 116. The bonding layer 120 has the opening 122b that the opening 122a overlaps. As described above, the opening 122a and the opening 122b are collectively called the opening 122 in this specification (see FIG. 3A).

<Formation of Embedded Layer>

Figure 3A:
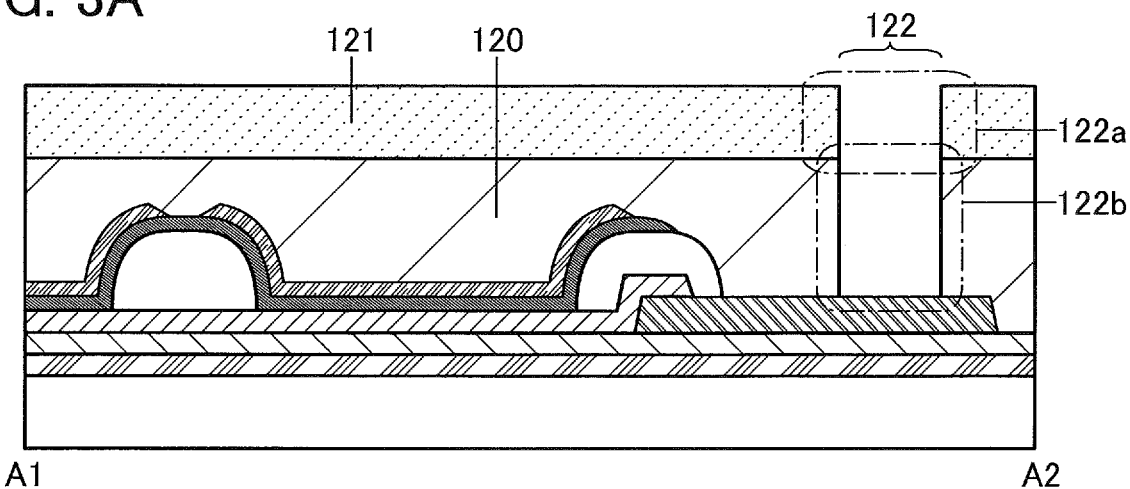
FIGS. 3A to 3C are cross-sectional views illustrating a method for manufacturing a light-emitting device.
Figure 3B:
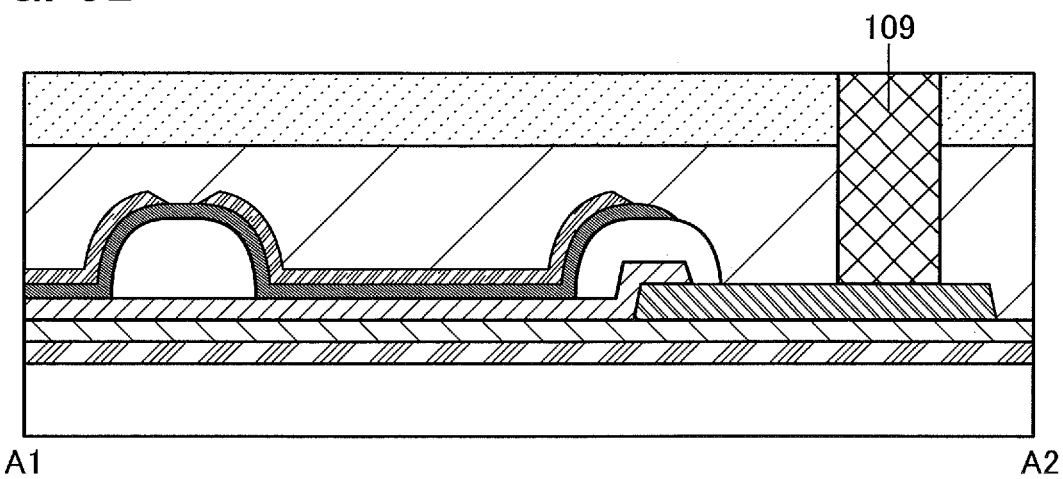

Next, an embedded layer 109 is formed in the opening 122 (see FIG. 3B). In the case where the embedded layer 109 is not formed in the opening 122, a region of the terminal electrode 116 that the opening 122 overlaps might be damaged at the time of separation of the element formation substrate 101 performed later. Note that the embedded layer 109 is removed later, and thus is preferably formed using a material that is soluble in water or an organic solvent. As such a material, a soluble resin such as a soluble acrylic resin, a soluble polyimide resin, or a soluble epoxy resin can be used. In addition, it is preferable that the level of a surface of the embedded layer 109 be substantially the same as that of a surface of the substrate 121. A soluble acrylic resin is used as the embedded layer 109 in this embodiment.

<Formation of Transfer Substrate>

Figure 3C:
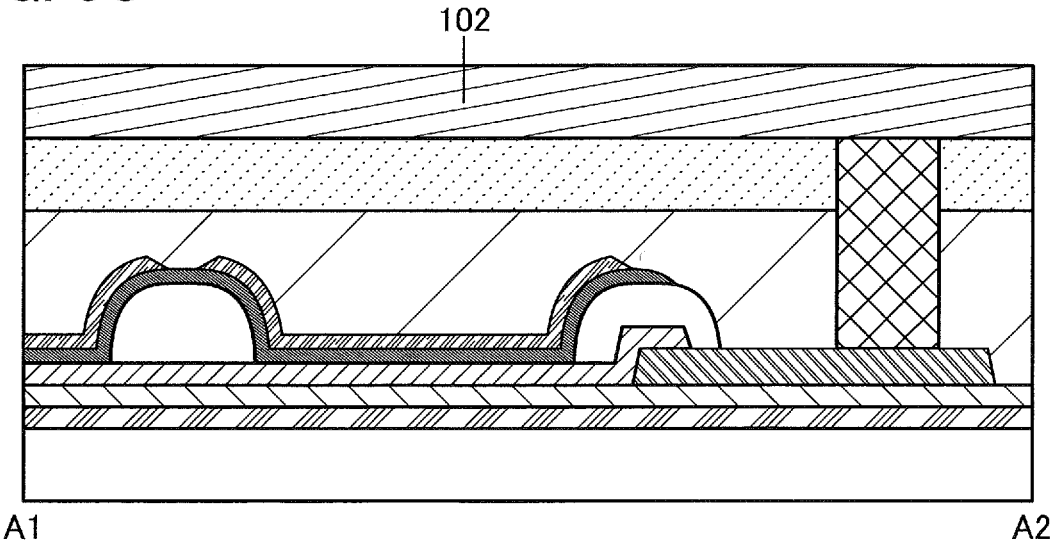

Next, a transfer substrate 102 is attached onto the substrate 121 (see FIG. 3C). The transfer substrate 102 is removed later, and thus can be formed of a UV tape or a dicing tape whose adhesion is reduced by irradiation with ultraviolet light, a tape whose adhesion is reduced by heating, or a low-viscosity tape. In this embodiment, a UV tape is used as the transfer substrate 102.

<Separation of Substrate>

Figure 4A:
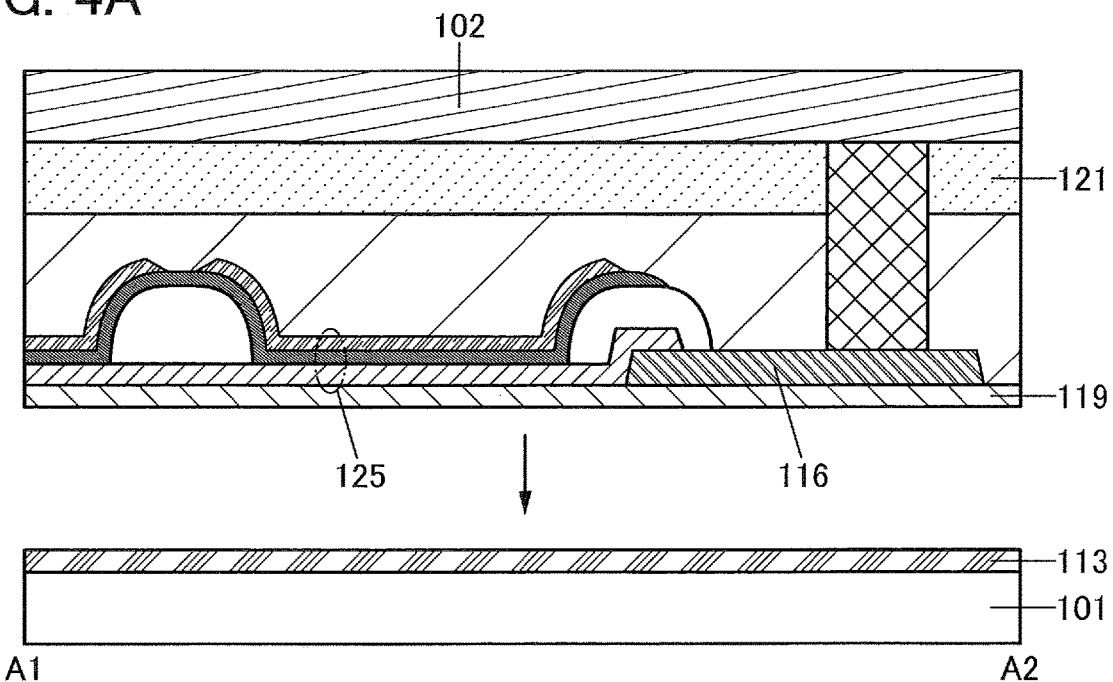
FIGS. 4A and 4B are cross-sectional views illustrating a method for manufacturing a light-emitting device.

Next, the element formation substrate 101 and the separation layer 113 are separated from the base layer 119 (see FIG. 4A). As a separation method, mechanical force (a separation process with a human hand or a gripper, a separation process by rotation of a roller, ultrasonic waves, or the like) may be used. For example, a cut is made in the separation layer 113 with a sharp edged tool, by laser light irradiation, or the like and water is injected into the cut. A portion between the separation layer 113 and the base layer 119 absorbs water through capillarity action, so that the element formation substrate 101 can be separated easily.

<Attachment of Light-Emitting Device and Substrate>

Figure 4B:
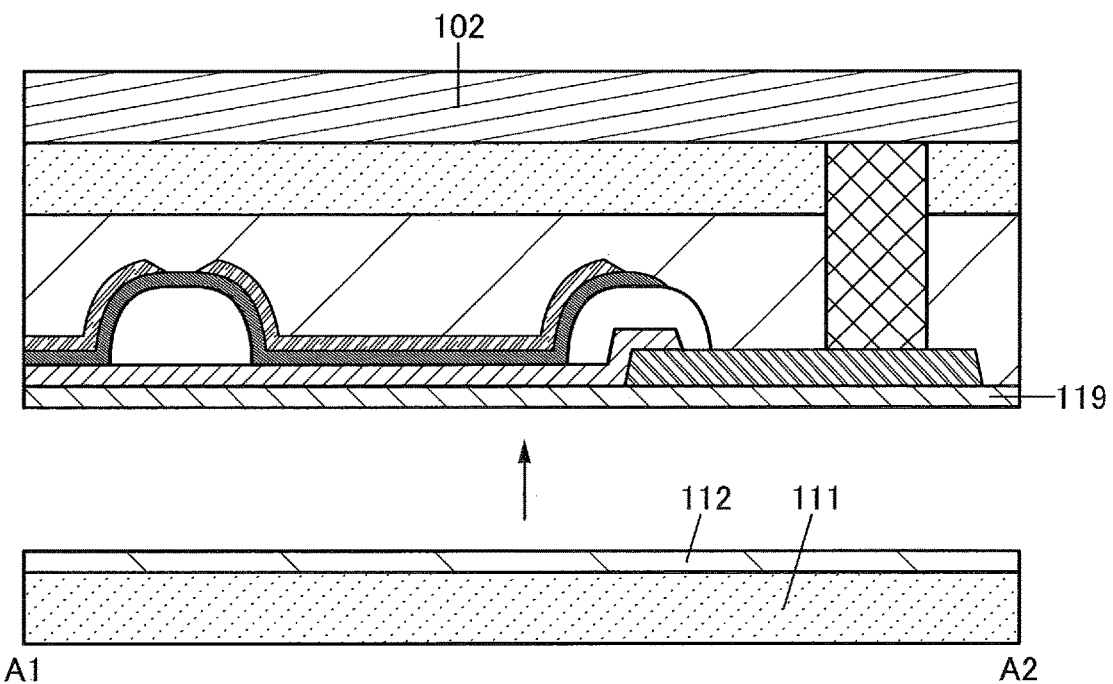
Figure 5A:
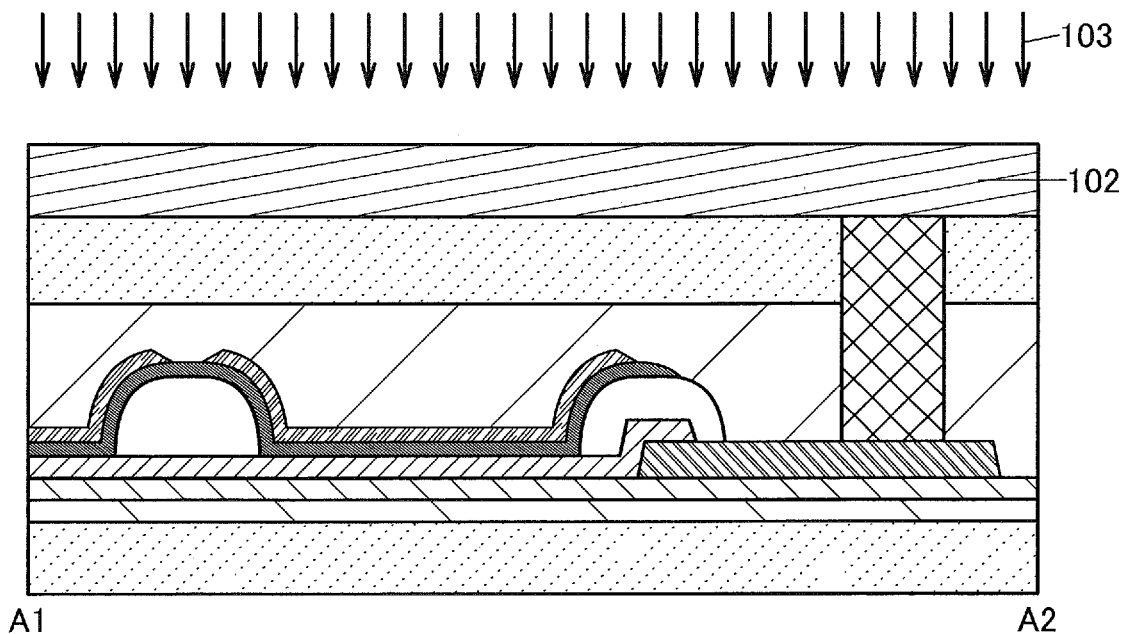
FIGS. 5A and 5B are cross-sectional views illustrating a method for manufacturing a light-emitting device.
Figure 5B:
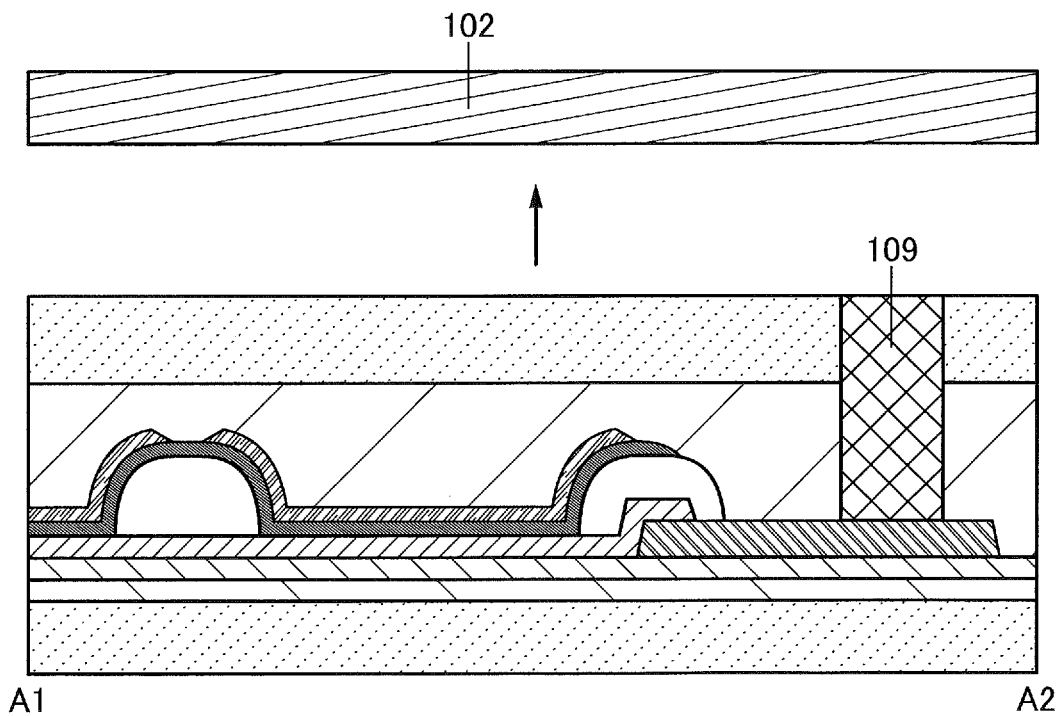

Next, the substrate 111 is attached to the base layer 119 with the bonding layer 112 provided therebetween (see FIG. 4B).

<Separation of Transfer Substrate>

Next, the transfer substrate 102 is separated. The transfer substrate 102 is formed of a UV tape in this embodiment. Thus, by irradiation with ultraviolet light 103 (see FIG. 5A), the transfer substrate 102 can be separated easily (see FIG. 5B).

<Removal of Embedded Layer>

Figure 6A:
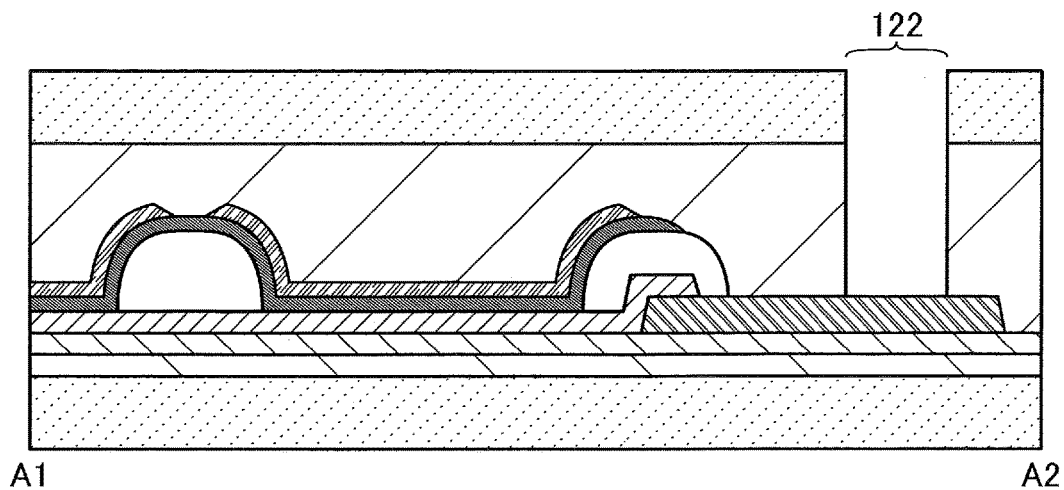
FIGS. 6A and 6B are cross-sectional views illustrating a method for manufacturing a light-emitting device.
Figure 6B:
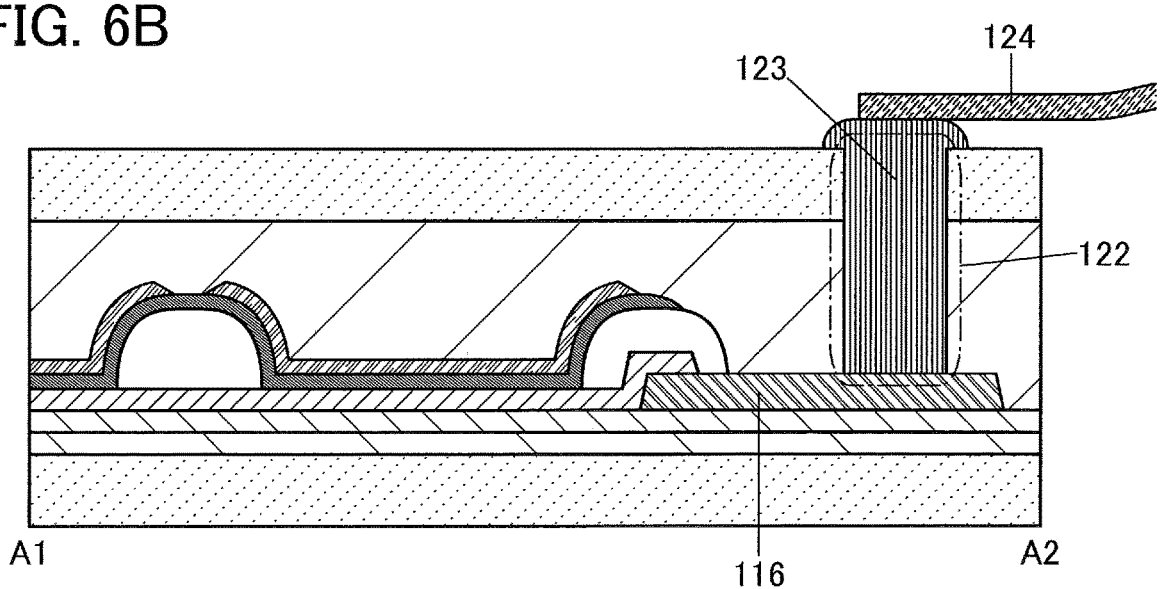

Next, the embedded layer 109 is removed with a solvent that is suitable for removal of the embedded layer 109, such as water or an organic solvent (see FIG. 6A).

<Formation of External Electrode>

Next, the anisotropic conductive connection layer 123 is formed in the opening 122. In addition, the external electrode 124 for inputting electric power or a signal to the light-emitting device 100 is formed at the position over the opening 122, which overlaps the terminal electrode 116 (see FIG. 6B). The external electrode 124 is electrically connected to the terminal electrode 116 through the anisotropic conductive connection layer 123. Thus, electric power or a signal can be input to the light-emitting device 100. Note that an FPC can be used as the external electrode 124.

Note that a metal wire can also be used as the external electrode 124. The metal wire and the terminal electrode 116 can be connected to each other by a wire bonding method without using the anisotropic conductive connection layer 123. Alternatively, the metal wire and the terminal electrode 116 can be connected to each other by a soldering method.

In one embodiment of the present invention, removal of part of the substrate 121 by laser light or with an edged tool for inputting electric power or a signal to the light-emitting device 100 is not needed; thus, the light-emitting device 100 and the terminal electrode 116 are not easily damaged. One embodiment of the present invention can provide a highly reliable light-emitting device having high manufacturing yield.

This embodiment can be implemented in an appropriate combination with any of the structures described in the other embodiments.

Embodiment 2

In this embodiment, a method for manufacturing the light-emitting device 100, which is different from the method disclosed in Embodiment 1, is described. Note that description is made mainly on portions different from those in Embodiment 1 to avoid repeated description.

<Method for Manufacturing Light-Emitting Device>

The manufacturing method can be performed in a manner similar to that described in Embodiment 1 until the formation of the partition 114 (see FIG. 2C).

<Formation of EL layer>

Figure 7A:
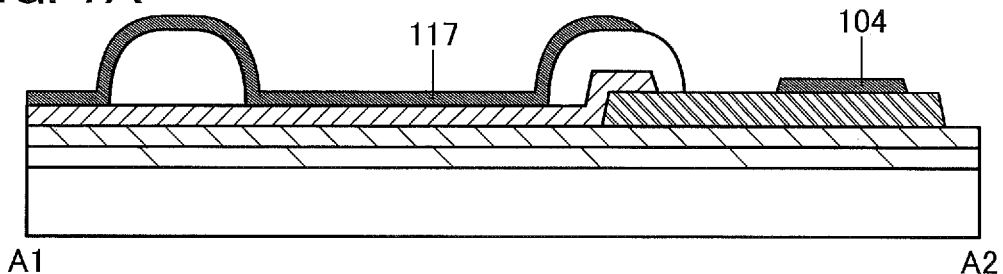
FIGS. 7A to 7D are cross-sectional views illustrating a method for manufacturing a light-emitting device.

Next, the EL layer 117 is formed over the electrode 115 and the partition 114. At the same time as the EL layer 117, a layer 104 is formed in a region on the terminal electrode 116 that the opening 122 is to overlap (see FIG. 7A). The layer 104 can be formed using a material and a method similar to those of the EL layer 117.

<Formation of Electrode 118>

Figure 7B:
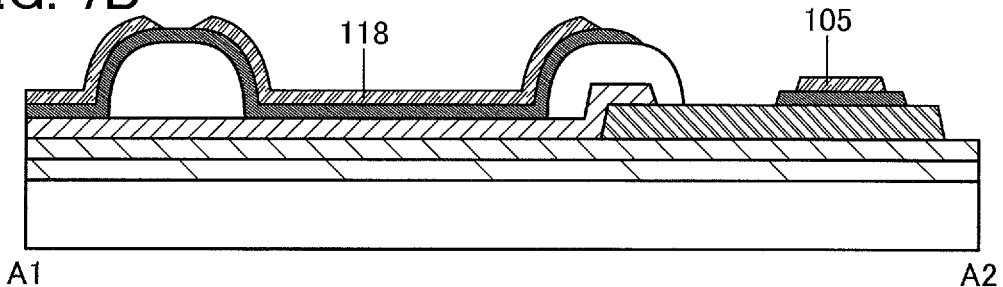

Next, the electrode 118 is formed in contact with the EL layer 117. At this time, a layer 105 is formed in a region on the layer 104 that the opening 122 is to overlap. The layer 105 can be formed using part of a layer formed at the same time as the electrode 118 (see FIG. 7B).

<Formation of Substrate 121>

Figure 7C:
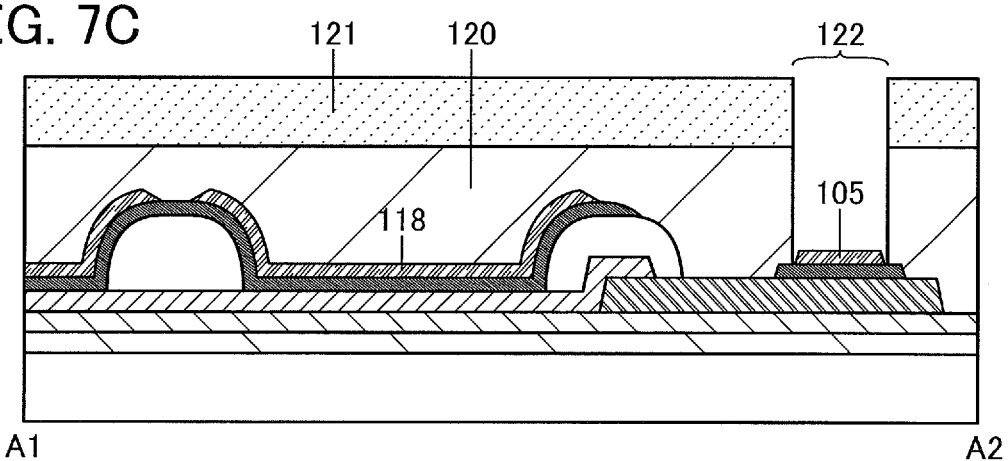

Next, the substrate 121 is formed over the electrode 118 with the bonding layer 120 provided therebetween. At this time, the opening 122 of the substrate 121 is positioned so as to overlap the terminal electrode 116, the layer 105, and the layer 104 (see FIG. 7C). Note that the bonding layer 120 is not formed in a region that the opening 122 overlaps, which means that the bonding layer 120 also has an opening that the opening 122 overlaps.

Note that the layer 104 is formed to have a size with which the outer edge of the layer 104 is located outside the opening of the bonding layer when seen from the top. In addition, the layer 105 is formed to have a size with which the outer edge of the layer 105 is located inside the opening of the bonding layer when seen from the top.

<Formation of Embedded Layer and Transfer Substrate>

Figure 7D:
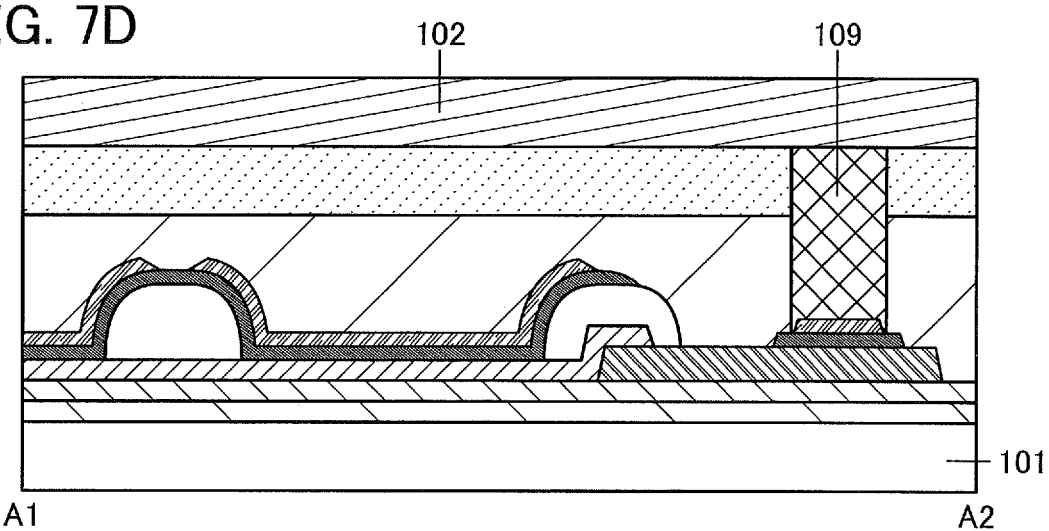

Next, the embedded layer 109 and the transfer substrate 102 are each formed in a manner similar to that in Embodiment 1 (see FIG. 7D). Then, the element formation substrate 101 is separated, and the substrate 111 is attached to the base layer 119 with the bonding layer 112 provided therebetween.

<Separation of Transfer Substrate>

Figure 8A:
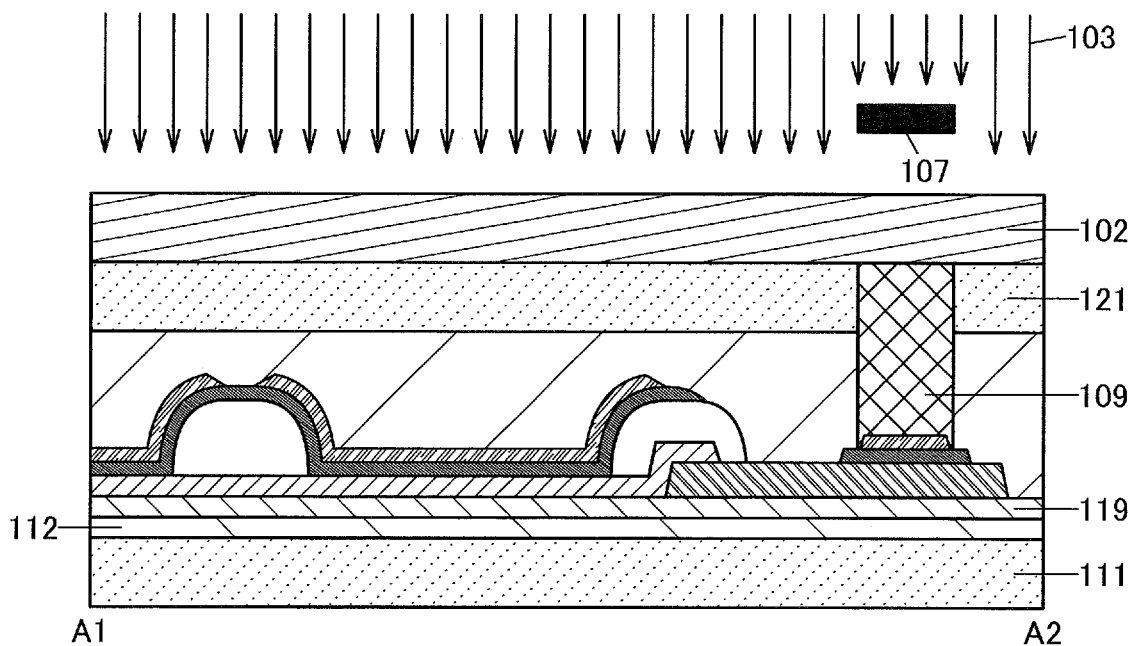
FIGS. 8A and 8B are cross-sectional views illustrating a method for manufacturing a light-emitting device.

Next, the transfer substrate 102 is irradiated with ultraviolet light 103 to weaken the adhesion of the transfer substrate 102, so that the transfer substrate 102 is separated. Before the irradiation with the ultraviolet light 103, a mask 107 is provided in a region of the transfer substrate 102 that overlaps the embedded layer 109 in order to prevent irradiation of the region with the ultraviolet light 103 (see FIG. 8A).

Figure 8B:
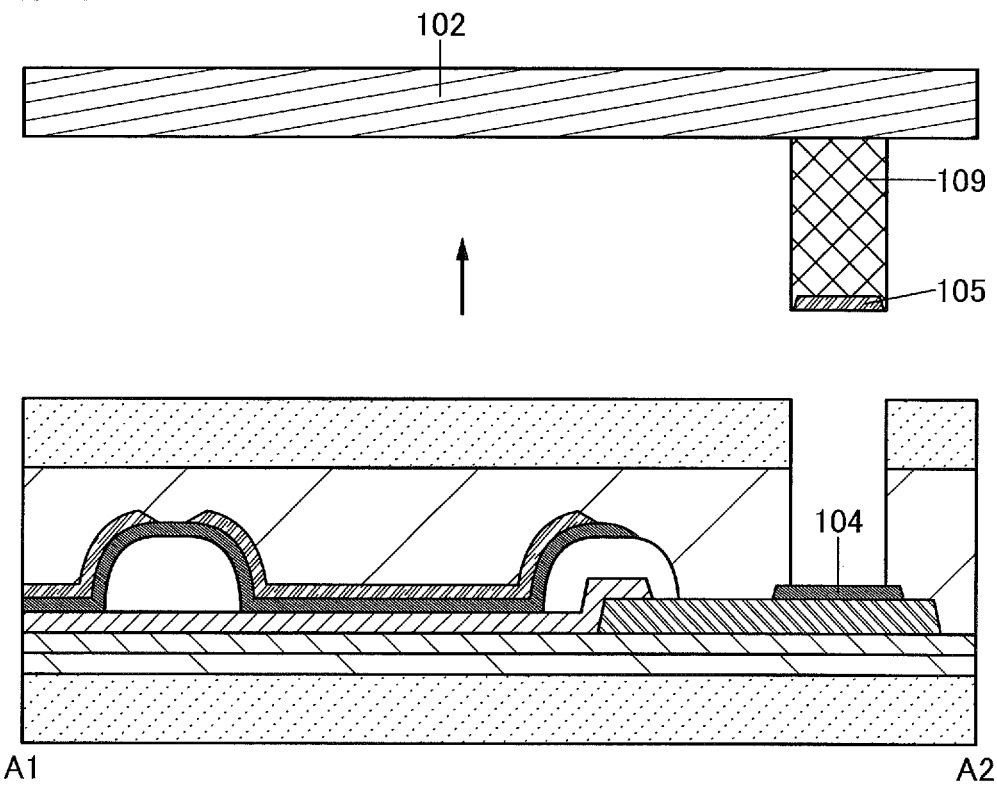

By providing the mask 107 in the above-described manner, the adhesion of the region of the transfer substrate 102 that overlaps the embedded layer 109 is maintained without being reduced. Since the adhesion of the interface between the layer 104 and the layer 105 is low, the embedded layer 109 and the layer 105 can also be removed at the time of the separation of the transfer substrate 102 (see FIG. 8B).

<Removal of Layer 104>

Figure 9A:
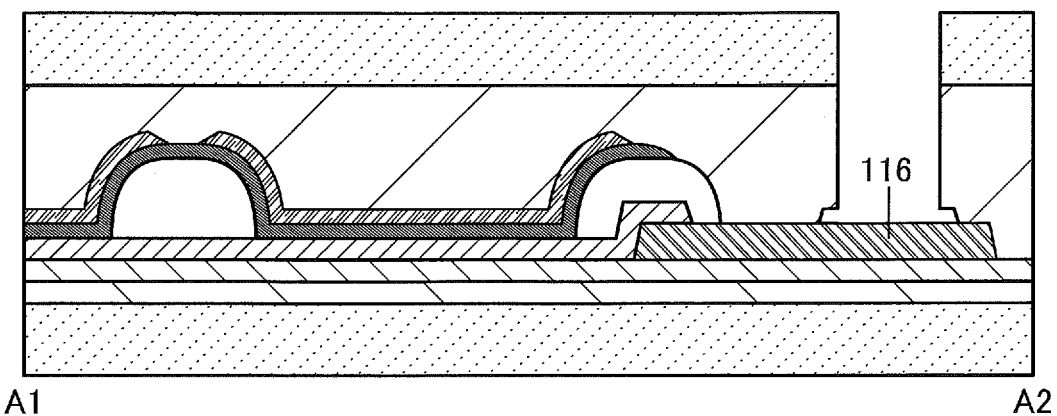
FIGS. 9A and 9B are cross-sectional views illustrating a method for manufacturing a light-emitting device.

Next, the layer 104 is removed with an organic solvent such as ethyl alcohol to expose part of a surface of the terminal electrode 116 (see FIG. 9A).

<Formation of External Electrode>

Figure 9B:
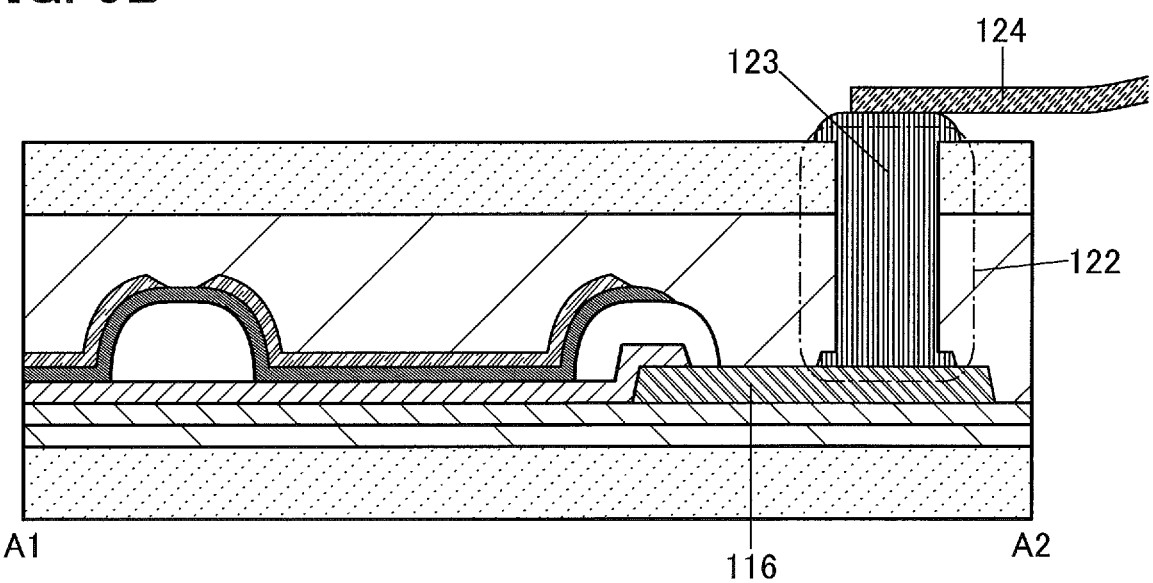

Next, the anisotropic conductive connection layer 123 is formed in the opening 122, and the external electrode 124 for inputting electric power or a signal to the light-emitting device 100 is formed over the anisotropic conductive connection layer 123 (see FIG. 9B). The external electrode 124 and the terminal electrode 116 are electrically connected to each other through the anisotropic conductive connection layer 123. Thus, electric power or a signal can be supplied or input to the light-emitting device 100. Note that an FPC can be used as the external electrode 124.

In one embodiment of the present invention, removal of part of the substrate 121 for inputting electric power or a signal to the light-emitting device 100 is not needed; thus, the light-emitting device 100 and the terminal electrode 116 are not easily damaged. One embodiment of the present invention can provide a highly reliable light-emitting device having high manufacturing yield.

This embodiment can be implemented in an appropriate combination with any of the structures described in the other embodiments.

Embodiment 3

Figure 10A:
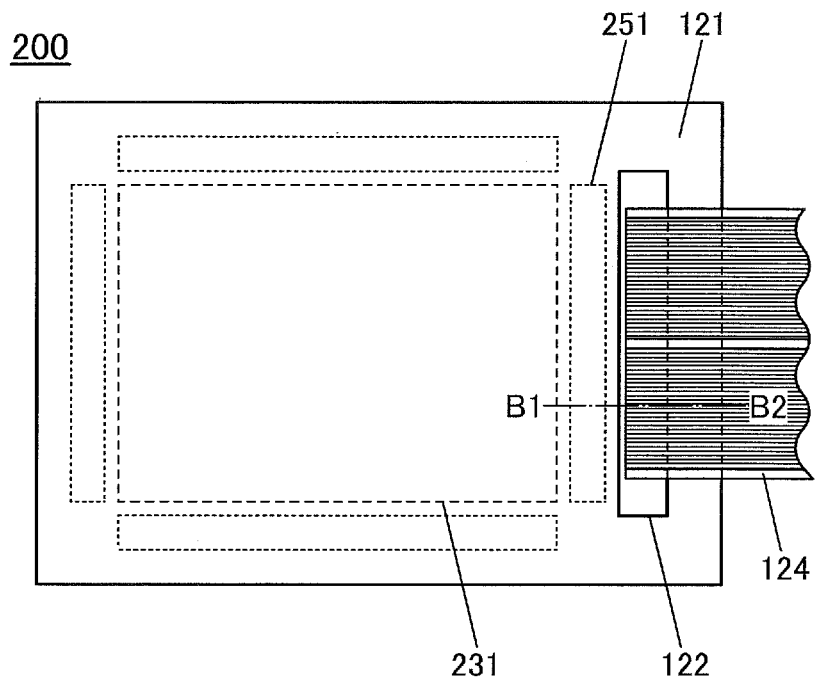
FIG. 10A is a top view illustrating a light-emitting device and FIG. 10B is a cross-sectional view illustrating the same.
Figure 10B:
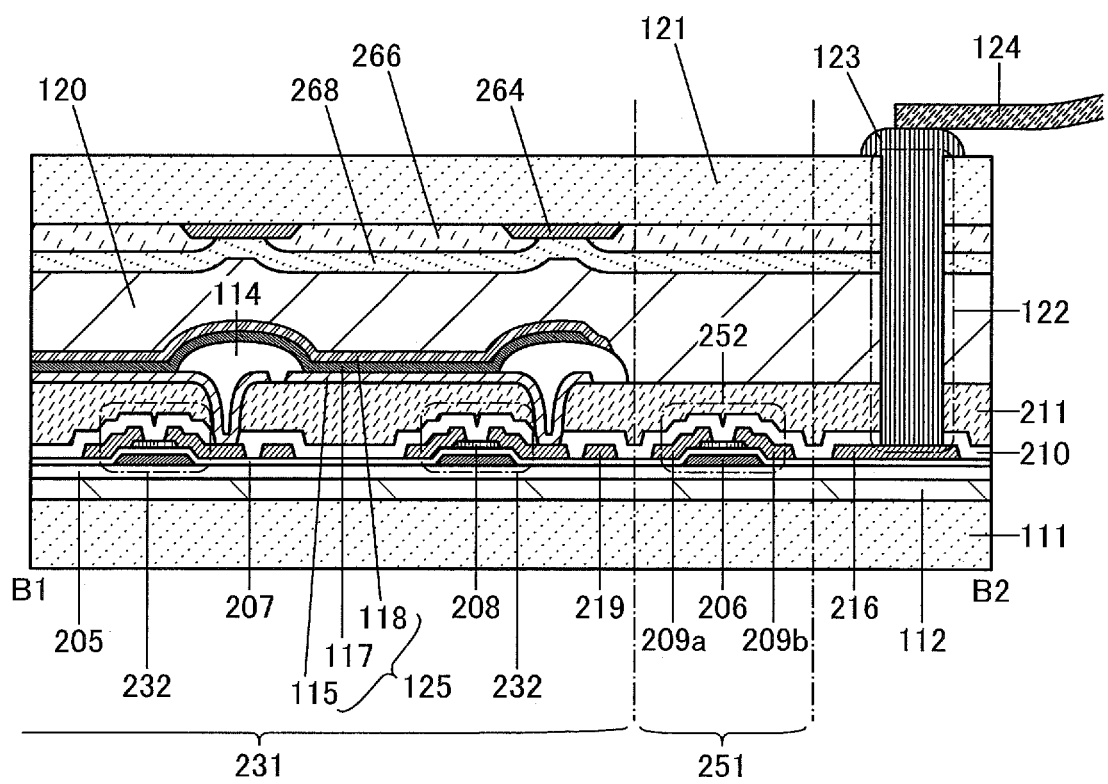

In this embodiment, a light-emitting device 200 having a structure different from the structure of the light-emitting device 100 described in the above embodiment is described with reference to FIGS. 10A and 10B. FIG. 10A is a top view of the light-emitting device 200, and FIG. 10B is a cross-sectional view taken along the dashed-dotted line B1-B2 in FIG. 10A.

<Structure of Light-Emitting Device>

The light-emitting device 200 described in this embodiment includes a display area 231 and a peripheral circuit 251. The light-emitting device 200 also includes a terminal electrode 216 and the light-emitting element 125 including the electrode 115, the EL layer 117, and the electrode 118. A plurality of light-emitting elements 125 are formed in the display area 231. A transistor 232 for controlling the amount of light emitted from the light-emitting element 125 is connected to each light-emitting element 125.

The terminal electrode 216 is electrically connected to the external electrode 124 through the anisotropic conductive connection layer 123 formed in the opening 122. In addition, the terminal electrode 216 is electrically connected to the peripheral circuit 251.

The peripheral circuit 251 includes a plurality of transistors 252. The peripheral circuit 251 has a function of determining which of the light-emitting elements 125 in the display area 231 is supplied with a signal from the external electrode 124.

In the light-emitting device 200 illustrated in FIGS. 10A and 10B, the substrate 111 and the substrate 121 are attached to each other with the bonding layer 120 provided therebetween. An insulating layer 205 is formed over the substrate 111 with the bonding layer 112 provided therebetween. The insulating layer 205 is preferably formed as a single layer or a multilayer using any of silicon oxide, silicon nitride, silicon oxynitride, silicon nitride oxide, aluminum oxide, aluminum oxynitride, and aluminum nitride oxide. The insulating layer 205 can be formed by a sputtering method, a CVD method, a thermal oxidation method, a coating method, a printing method, or the like.

Note that the insulating layer 205 functions as a base layer and can prevent or reduce diffusion of impurity elements from the substrate 111, the bonding layer 112, or the like to the transistor or the light-emitting element.

In addition, the transistor 232, the transistor 252, the terminal electrode 216, and a wiring 219 are formed over the insulating layer 205. Note that although a channel-etched transistor that is a type of bottom-gate transistor is illustrated as the transistor 232 and the transistor 252 in this embodiment, a channel-protective transistor, a top-gate transistor, or the like can also be used. It is also possible to use a dual-gate transistor, in which a semiconductor layer in which a channel is formed is interposed between two gate electrodes.

The transistor 232 and the transistor 252 may have the same structure. However, the size (e.g., channel length and channel width) or the like of each transistor can be adjusted as appropriate.

The transistor 232 and the transistor 252 each include a gate electrode 206, a gate insulating layer 207, a semiconductor layer 208, a source electrode 209a, and a drain electrode 209b.

The terminal electrode 216, the wiring 219, the gate electrode 206, the source electrode 209a, and the drain electrode 209b can be formed using a material and a method similar to those of the terminal electrode 116. In addition, the gate insulating layer 207 can be formed using a material and a method similar to those of the insulating layer 205.

The semiconductor layer 208 can be formed using an amorphous semiconductor, a microcrystalline semiconductor, a polycrystalline semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

Note that an oxide semiconductor has an energy gap as wide as 3.0 eV or more and high visible-light transmissivity. In a transistor obtained by processing an oxide semiconductor under appropriate conditions, the off-state current at ambient temperature (e.g., 25° C.) can be less than or equal to 100 zA ($1\times10^{-19}$ A), less than or equal to 10 zA ($1\times10^{-20}$ A), and further less than or equal to 1 zA ($1\times10^{-21}$ A). Therefore, a light-emitting device with low power consumption can be achieved.

In the case where an oxide semiconductor is used for the semiconductor layer 208, an insulating layer containing oxygen is preferably used as an insulating layer that is in contact with the semiconductor layer 208.

In addition, an insulating layer 210 is formed over the transistor 232 and the transistor 252, and an insulating layer 211 is formed over the insulating layer 210. The insulating layer 210 functions as a protective insulating layer and can prevent or reduce diffusion of impurity elements from a layer above the insulating layer 210 to the transistor 232 and the transistor 252. The insulating layer 210 can be formed using a material and a method similar to those of the insulating layer 205.

Planarization treatment may be performed on the insulating layer 211 to reduce unevenness of a surface on which the light-emitting element 125 is formed. The planarization treatment may be, but not particularly limited to, polishing treatment (e.g., chemical mechanical polishing (CMP)) or dry etching treatment.

Forming the insulating layer 211 using an insulating material with a planarization function can omit polishing treatment. As the insulating material with a planarization function, for example, an organic material such as a polyimide resin or an acrylic resin can be used. Other than the above-described organic materials, it is also possible to use a low-dielectric constant material (low-k material) or the like. Note that the insulating layer 211 may be formed by stacking a plurality of insulating films formed of these materials.

In addition, over the insulating layer 211, the light-emitting element 125 and the partition 114 for separating the adjacent light-emitting elements 125 are formed.

In addition, the substrate 121 is provided with a light-shielding film 264, a coloring layer 266, and an overcoat layer 268. The light-emitting device 200 is a top-emission light-emitting device, in which light emitted from the light-emitting element 125 is extracted from the substrate 121 side through the coloring layer 266.

The light-emitting element 125 is electrically connected to the transistor 232 through openings formed in the insulating layer 211 and the insulating layer 210.

Although an active matrix light-emitting device is described as an example of the light-emitting device in this embodiment, the present invention can also be applied to a passive matrix light-emitting device.

One embodiment of the present invention can be applied to display devices such as a liquid crystal display device including a liquid crystal element as a display element, an electronic paper, a digital micromirror device (DMD), a plasma display panel (PDP), a field emission display (FED), and a surface-conduction electron-emitter display (SED), without limitation to a light-emitting device including a light-emitting element as a display element.

An example of a liquid crystal element is an element that controls transmission and non-transmission of light by optical modulation action of a liquid crystal. The element can include a pair of electrodes and a liquid crystal layer. Note that optical modulation action of a liquid crystal is controlled by an electric field applied to the liquid crystal (including a horizontal electric field, a vertical electric field, and an oblique electric field). The following are specific examples of the liquid crystal: nematic liquid crystal, cholesteric liquid crystal, smectic liquid crystal, discotic liquid crystal, thermotropic liquid crystal, lyotropic liquid crystal, low-molecular liquid crystal, polymer liquid crystal, polymer dispersed liquid crystal (PDLC), ferroelectric liquid crystal, anti-ferroelectric liquid crystal, main-chain liquid crystal, side-chain polymer liquid crystal, and banana-shaped liquid crystal. Moreover, the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, an ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, and a blue phase mode. Note that the present invention is not limited to these examples and any of a variety of liquid crystal elements and driving methods can be applied to the liquid crystal element and the driving method thereof.

Display of electronic paper can be performed using, for example, molecules (a method utilizing optical anisotropy, dye molecular orientation, or the like), particles (a method utilizing electrophoresis, particle movement, particle rotation, phase change, or the like), movement of one end of a film, coloring properties or phase change of molecules, optical absorption by molecules, or self-light emission by combination of electrons and holes. Specific examples of a display method of electronic paper include microcapsule electrophoresis, horizontal electrophoresis, vertical electrophoresis, a spherical twisting ball, a magnetic twisting ball, a columnar twisting ball, a charged toner, electronic liquid powder, magnetic electrophoresis, a magnetic thermosensitive type, electro wetting, light-scattering (transparent-opaque change), a cholesteric liquid crystal and a photoconductive layer, cholesteric liquid crystal, bistable nematic liquid crystal, ferroelectric liquid crystal, a liquid crystal dispersed type with a dichroic dye, a movable film, coloring and decoloring properties of a leuco dye, photochromism, electrochromism, electrodeposition, and flexible organic EL.

Note that the present invention is not limited to these examples, and various electronic paper and display methods can be used as electronic paper and a display method thereof. Here, with the use of microcapsule electrophoresis, aggregation and precipitation of phoresis particles can be prevented. Electronic liquid powder has advantages such as high-speed response, high reflectivity, wide viewing angle, low power consumption, and memory properties.

This embodiment can be implemented in an appropriate combination with any of the structures described in the other embodiments.

Embodiment 4

Figure 11A:
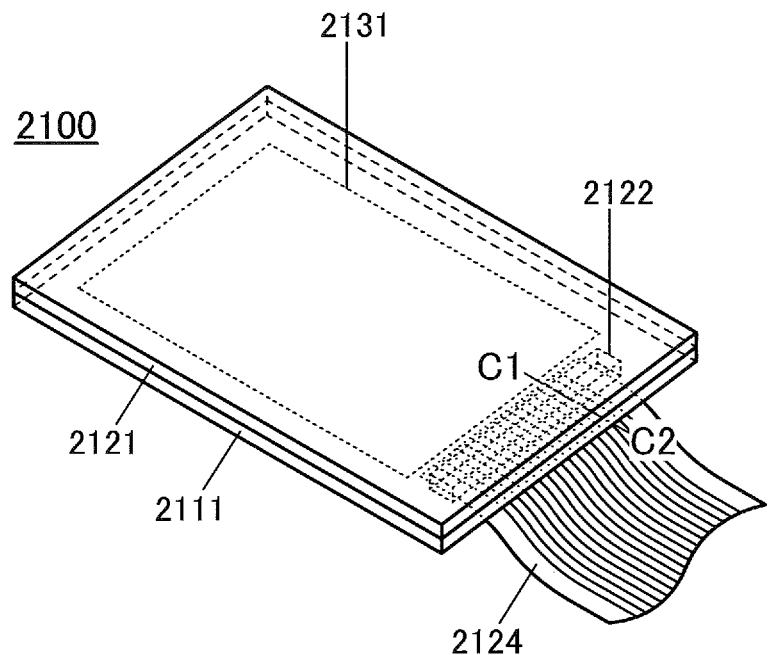
FIG. 11A is a perspective view illustrating a light-emitting device and FIG. 11B is a top view illustrating the same.
Figure 11B:
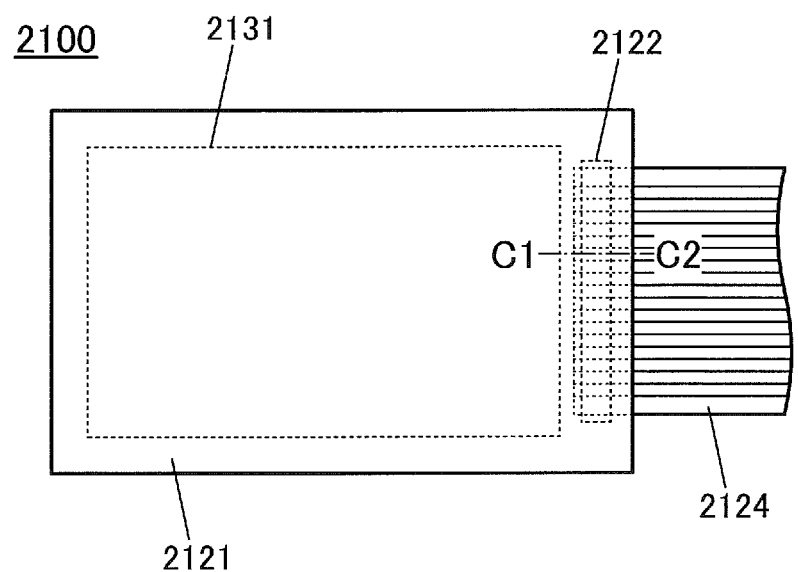
Figure 12:
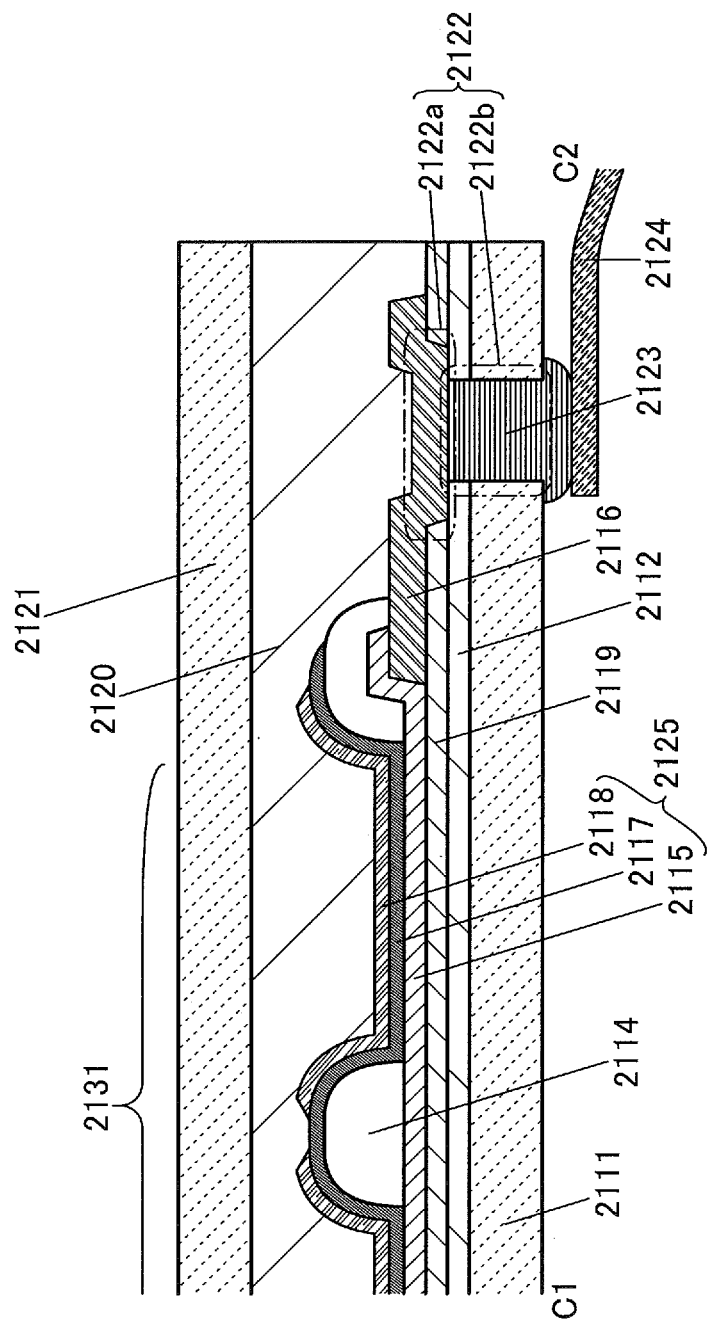
FIG. 12 is a cross-sectional view illustrating a light-emitting device.

A structure example of a light-emitting device 2100 of one embodiment of the present invention is described with reference to FIGS. 11A and 11B and FIG. 12. FIG. 11A is a perspective view illustrating an outer appearance of the light-emitting device 2100, and FIG. 11B is a top view of the light-emitting device 2100. FIG. 12 is a cross-sectional view taken along the dashed-dotted line C1-C2 in FIG. 11A. Note that the light-emitting device 2100 disclosed in this specification is a display device in which a light-emitting element is used as a display element.

<Structure of Light-Emitting Device>

The light-emitting device 2100 described in this embodiment includes an electrode 2115, an EL layer 2117, an electrode 2118, a partition 2114, and a terminal electrode 2116. The electrode 2115 and the terminal electrode 2116 are electrically connected to each other. In the light-emitting device 2100, the partition 2114 is provided over the electrode 2115, the EL layer 2117 is provided over the electrode 2115 and the partition 2114, and the electrode 2118 is provided over the EL layer 2117.

A light-emitting element 2125 includes the electrode 2115, the EL layer 2117, and the electrode 2118. The light-emitting element 2125 is formed over a substrate 2111 with a bonding layer 2112 and a base layer 2119 provided therebetween. Note that a plurality of light-emitting elements 2125 are provided in a display area 2131.

In addition, in the light-emitting device 2100 described in this embodiment, a substrate 2121 is formed over the electrode 2118 with a bonding layer 2120 provided therebetween.

The base layer 2119 has an opening 2122a that the terminal electrode 2116 overlaps. The bonding layer 2112 and the substrate 2111 have an opening 2122b that the opening 2122a overlaps. In this specification, the opening 2122a and the opening 2122b are collectively called an opening 2122. An external electrode 2124 and the terminal electrode 2116 are electrically connected to each other through an anisotropic conductive connection layer 2123 in the opening 2122.

A switching element for controlling a signal supplied to the light-emitting element 2125 may be provided between the light-emitting element 2125 and the terminal electrode 2116. For example, a transistor may be provided between the light-emitting element 2125 and the terminal electrode 2116. A transistor is a kind of semiconductor element and enables amplification of current or voltage, switching operation for controlling conduction or non-conduction, or the like. By providing a transistor between the light-emitting element 2125 and the terminal electrode 2116, the area of the display area 2131 can be increased easily and a higher-resolution display can be achieved easily. Note that without limitation to a switching element such as a transistor, a resistor, an inductor, a capacitor, or the like can be provided in the display area 2131.

<Substrates>

The substrate 2121 and the substrate 2111 can be formed using materials similar to those of the substrate 121 and the substrate 111 disclosed in the above embodiment. In the case where the light-emitting device 2100 is a bottom-emission light-emitting device or a dual-emission light-emitting device, a material that transmits light emitted from the EL layer 2117 is used for the substrate 2111. In the case where the light-emitting device 2100 is a top-emission light-emitting device or a dual-emission light-emitting device, a material that transmits light emitted from the EL layer 2117 is used for the substrate 2121.

<Base Layer>

The base layer 2119 can be formed using a material and a method similar to those of the base layer 119 disclosed in the above embodiment.

The base layer 2119 can prevent or reduce diffusion of impurity elements from the substrate 2111, the bonding layer 2112, or the like to the light-emitting element 2125.

<Terminal Electrode>

The terminal electrode 2116 can be formed using a material and a method similar to those of the terminal electrode 116 disclosed in the above embodiment.

<Electrode 2115>

The electrode 2115 is preferably formed using a conductive material that efficiently reflects light emitted from the EL layer 2117 formed later. The electrode 2115 can be formed using a material and a method similar to those of the electrode 115 disclosed in the above embodiment.

The light-emitting device having a top emission structure is described as an example in this embodiment. In the case of a light-emitting device having a bottom emission structure or a dual emission structure, the electrode 2115 may be formed using a light-transmitting conductive material.

<Partition>

The partition 2114 is provided in order to prevent an electrical short circuit between the adjacent electrodes 2118. In the case of using a metal mask for formation of the EL layer 2117 described later, the partition 2114 has a function of preventing contact of the metal mask with a region where the light-emitting element 2125 is formed. The partition 2114 can be formed using a material and a method similar to those of the partition 114 disclosed in the above embodiment. The partition 2114 is preferably formed so that its sidewall has a tapered shape or a tiled surface with a continuous curvature. The sidewall of the partition 2114 having the above-described shape enables favorable coverage with the EL layer 2117 and the electrode 2118 formed later.

<EL Layer>

A structure of the EL layer 2117 is described in Embodiment 9.

<Electrode 2118>

The electrode 2118 is used as a cathode in this embodiment, and thus is preferably formed using a material that has a low work function and can inject electrons into the EL layer 2117 described later. The electrode 2118 can be formed using a material and a method similar to those of the electrode 118 disclosed in the above embodiment.

In the case where light emitted from the EL layer 2117 is extracted through the electrode 2118, the electrode 2118 preferably has a property of transmitting visible light.

<Bonding Layers>

The bonding layer 2120 is in contact with the electrode 2118 in this embodiment. The substrate 2121 is fixed by the bonding layer 2120. The bonding layer 2112 is in contact with the base layer 2119. The substrate 2111 is fixed by the bonding layer 2112. The bonding layer 2120 and the bonding layer 2112 can be formed using a material and a method similar to those of the bonding layer 120 and the bonding layer 112 disclosed in the above embodiment. A drying agent (e.g., zeolite) having a size less than or equal to the wavelength of light or a filler (e.g., titanium oxide or zirconium) with a high refractive index is preferably mixed into the bonding layer 2120 in the case of a top emission structure or into the bonding layer 2112 in the case of a bottom emission structure, in which case the efficiency of extracting light emitted from the EL layer 2117 can be improved.

<Anisotropic Conductive Connection Layer>

The anisotropic conductive connection layer 2123 can be formed using a material and a method similar to those of the anisotropic conductive connection layer 123 disclosed in the above embodiment.

<Method for Manufacturing Light-Emitting Device>

Next, an example of a method for manufacturing the light-emitting device 2100 is described with reference to FIGS. 13A to 13D, FIGS. 14A to 14D, and FIGS. 15A to 15C. FIGS. 13A to 15C are cross-sectional views taken along the dashed-dotted line C1-C2 in FIGS. 11A and 11B.

<Formation of Separation Layer>

Figure 13A:
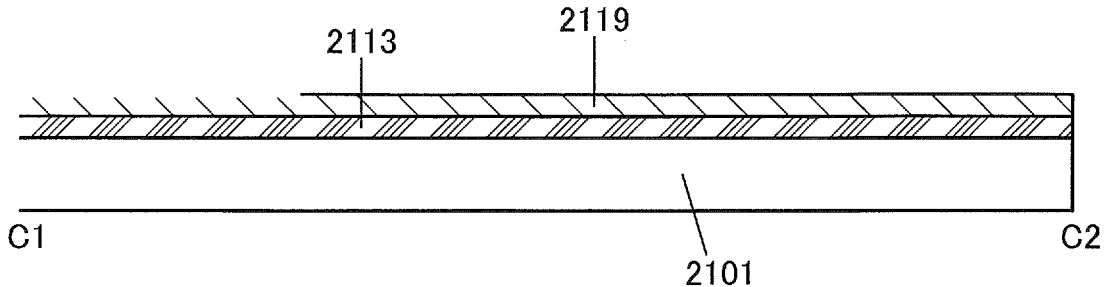
FIGS. 13A to 13D are cross-sectional views illustrating a method for manufacturing a light-emitting device.

First, a separation layer 2113 is formed over an element formation substrate 2101 (see FIG. 13A). Note that the element formation substrate 2101 can be formed using a material similar to that of the element formation substrate 101 disclosed in the above embodiment.

The separation layer 2113 can be formed using a material and a method similar to those of the separation layer 113 disclosed in the above embodiment.

In this embodiment, the separation layer 2113 is formed of tungsten by a sputtering method.

<Formation of Base Layer>

Next, the base layer 2119 is formed over the separation layer 2113 (see FIG. 13A). In this embodiment, the base layer 2119 is formed of silicon oxide by a plasma CVD method.

<Formation of Opening>

Figure 13B:
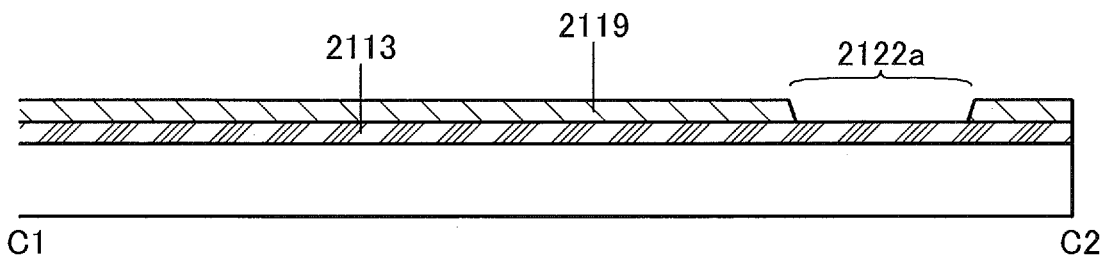
Figure 13C:
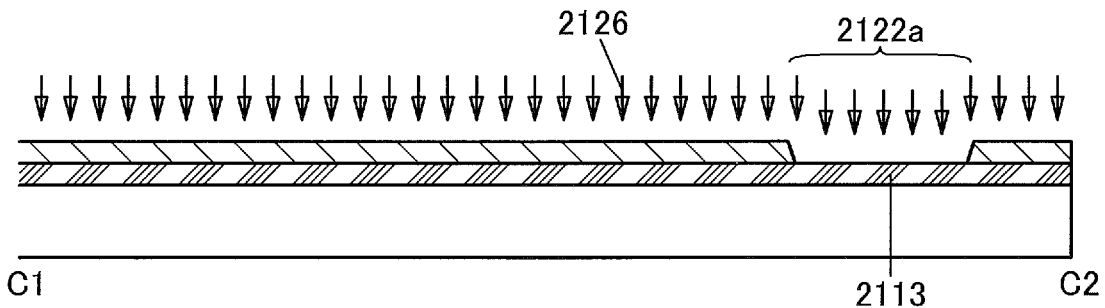

Next, part of the base layer 2119 is selectively removed to form the opening 2122a (see FIG. 13B). Specifically, a resist mask is formed over the base layer 2119, and the part of the base layer 2119 is selectively etched with the use of the resist mask. The resist mask can be formed by a photolithography method, a printing method, an inkjet method, or the like as appropriate. Formation of the resist mask by an inkjet method needs no photomask; thus, manufacturing costs can be reduced. The base layer 2119 may be etched by either a dry etching method or a wet etching method, or by both a dry etching method and a wet etching method. The base layer 2119 is preferably etched under the condition that the etching rate of the base layer 2119 is higher than that of the separation layer 2113.

<Oxidation Treatment in Opening>

Next, a surface of the separation layer 2113 that is exposed because of the formation of the opening 2122a is oxidized. The exposed surface of the separation layer 2113 can be oxidized by being in contact with a solution having oxidizability such as a hydrogen peroxide solution or water containing ozone. Alternatively, the exposed surface of the separation layer 2113 can be oxidized by being exposed to an oxygen atmosphere and furthermore being irradiated with ultraviolet light. Further alternatively, the exposed surface of the separation layer 2113 may be exposed to oxygen plasma. In this embodiment, the surface of the separation layer 2113 that is exposed because of the formation of the opening 2122a is oxidized by being exposed to oxygen plasma 2126 (see FIG. 13C).

Forming an oxide layer on the surface of the separation layer 2113 can facilitate separation of the element formation substrate 2101 performed later.

<Formation of Terminal Electrode>

Figure 13D:
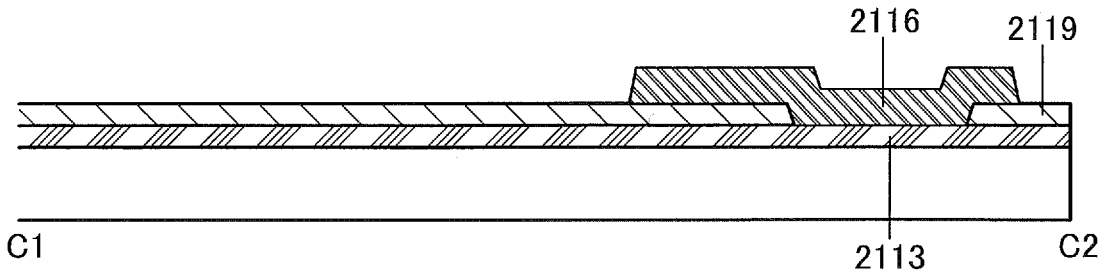

Next, the terminal electrode 2116 overlapping the base layer 2119 and the opening 2122a is formed (see FIG. 13D). The terminal electrode 2116 can be formed using a material and a method similar to those of the terminal electrode 116 disclosed in the above embodiment.

Note that the separation layer 2113 and the terminal electrode 2116 are in contact with each other in the opening 2122a through the surface of the separation layer 2113 that is oxidized by the former oxidation treatment. The oxide layer formed at the interface between the separation layer 2113 and the terminal electrode 2116 can prevent separation of the terminal electrode 2116 with the separation layer 2113 at the time of separation of the element formation substrate 2101 performed later.

<Formation of Electrode 2115>

Next, the electrode 2115 is formed over the base layer 2119. The electrode 2115 can be formed in a manner similar to that of the terminal electrode 2116. In this embodiment, the electrode 2115 is formed using a material in which indium tin oxide is stacked over silver. The electrode 2115 and the terminal electrode 2116 are electrically connected to each other (see FIG. 14A).

<Formation of Partition>

Figure 14A:
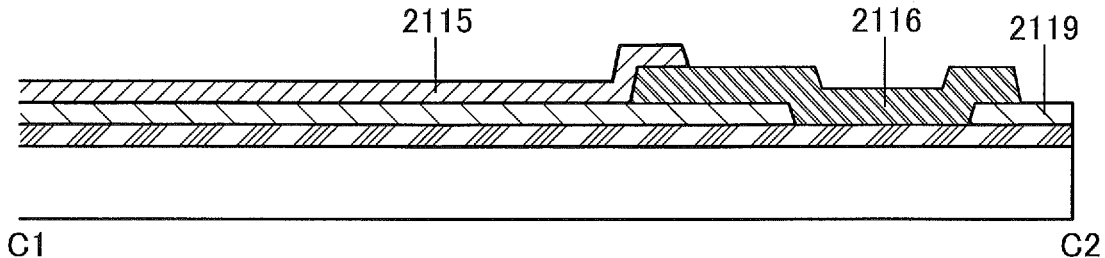
FIGS. 14A to 14D are cross-sectional views illustrating a method for manufacturing a light-emitting device.
Figure 14B:
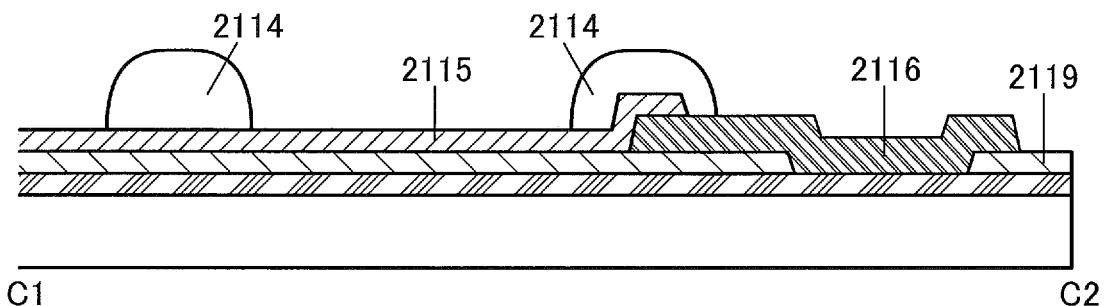

Next, the partition 2114 is formed (see FIG. 14B). In this embodiment, the partition 2114 is formed in such a manner that a photosensitive organic resin material is applied by a coating method and processed into a desired shape. In this embodiment, the partition 2114 is formed using a photosensitive imide resin.

<Formation of EL layer>

Figure 14C:
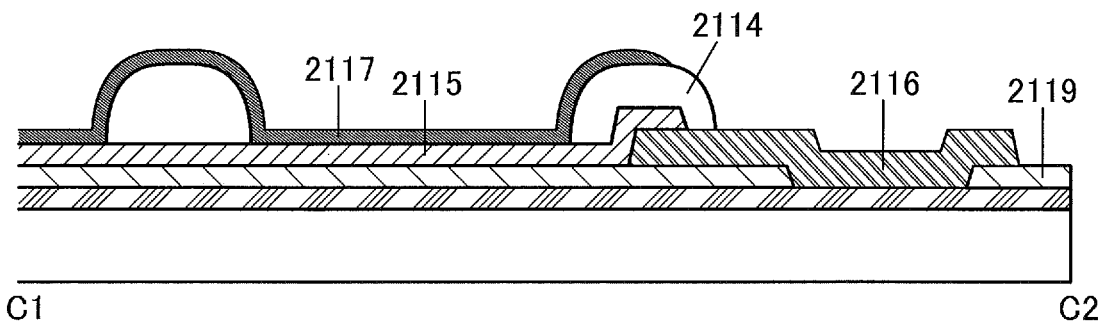
Figure 14D:
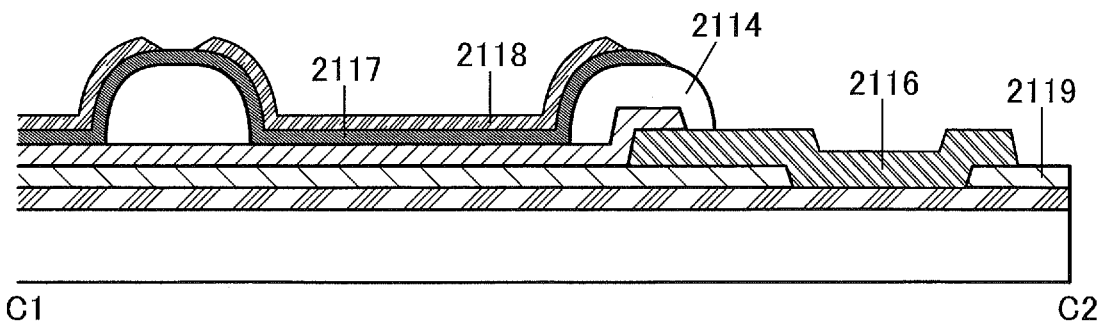

Next, the EL layer 2117 is formed over the electrode 2115 and the partition 2114 (see FIG. 14C).

<Formation of Electrode 2118>

Next, the electrode 2118 is formed so as to be in contact with the EL layer 2117. The electrode 2118 can be formed by an evaporation method, a sputtering method, or the like (see FIG. 14D).

<Formation of Substrate 2121>

Figure 15A:
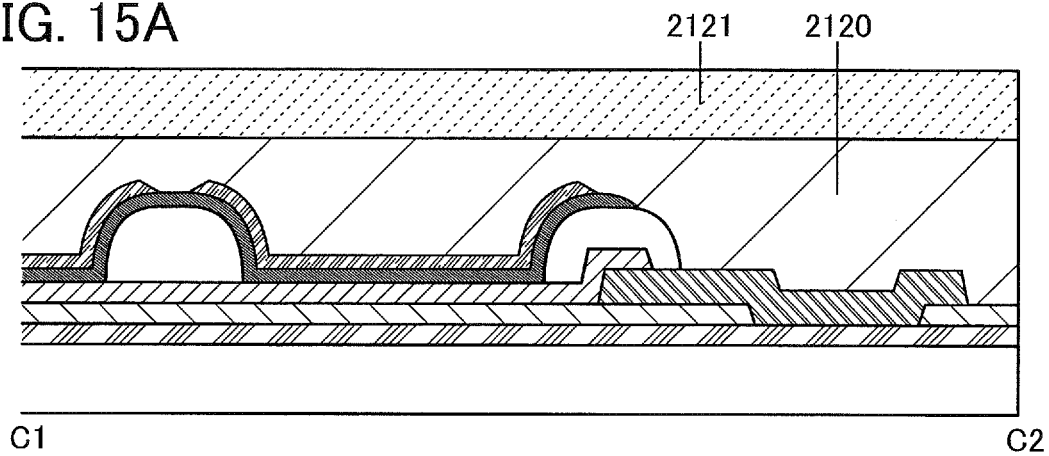
FIGS. 15A to 15C are cross-sectional views illustrating a method for manufacturing a light-emitting device.

Next, the substrate 2121 is formed over the electrode 2118 with the bonding layer 2120 provided therebetween (see FIG. 15A).

<Separation of Substrate>

Figure 15B:
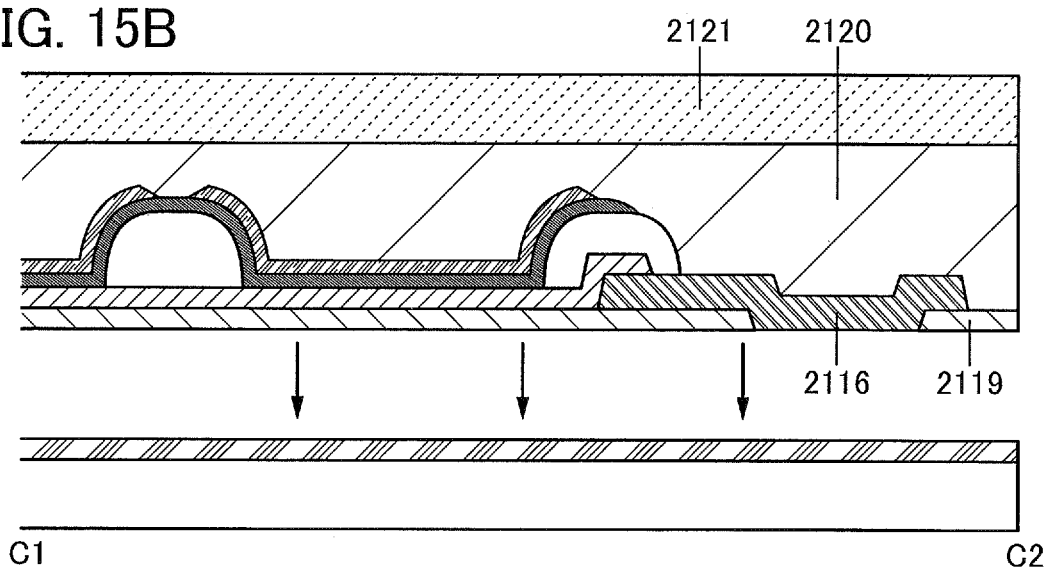

Next, the element formation substrate 2101 and the separation layer 2113 are separated from the base layer 2119 and the terminal electrode 2116 (see FIG. 15B). The separation can be performed by a method similar to the separation method of the substrate disclosed in the above embodiment.

<Attachment of Substrate to Light-Emitting Device>

Figure 15C:
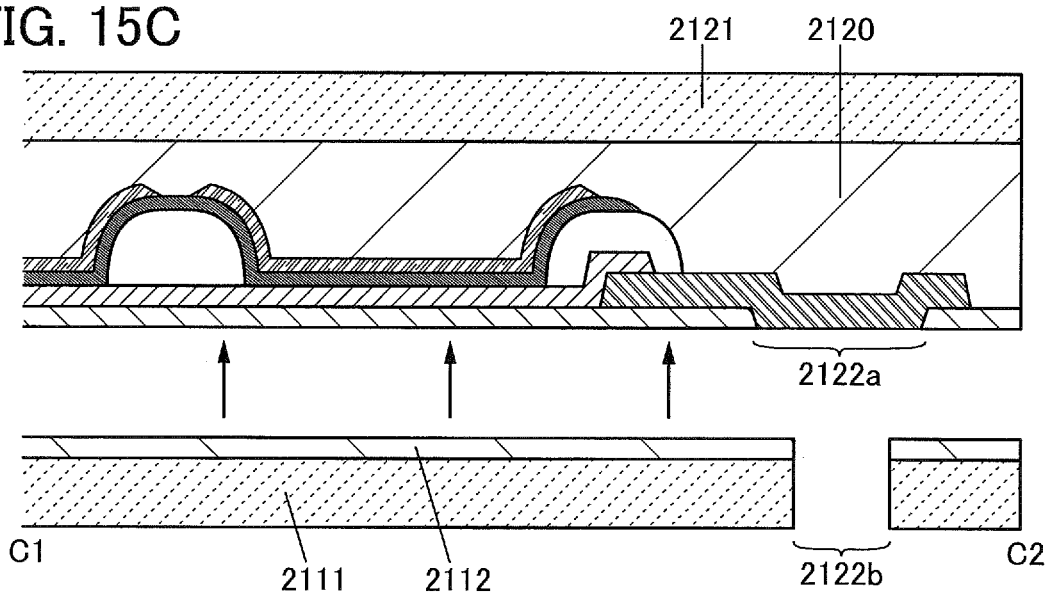

Next, the substrate 2111 having the opening 2122b is attached to the base layer 2119 with the bonding layer 2112 provided therebetween (see FIG. 15C). At this time, the opening 2122b of the substrate 2111 is positioned so that the opening 2122b and the opening 2122a overlap. The bonding layer 2112 is not formed in a region overlapping the opening 2122b. As described above, the opening 2122a and the opening 2122b are collectively called the opening 2122 in this specification.

<Formation of External Electrode>

Next, the anisotropic conductive connection layer 2123 is formed in the opening 2122. In addition, the external electrode 2124 for inputting electric power or a signal to the light-emitting device 2100 is formed at the position under the opening 2122, which the terminal electrode 2116 overlaps (see FIG. 12). The external electrode 2124 is electrically connected to the terminal electrode 2116 through the anisotropic conductive connection layer 2123. Thus, electric power a signal can be input to the light-emitting device 2100. Note that the external electrode 2124 can be formed using a material and a method similar to those of the external electrode 124 disclosed in the above embodiment.

In one embodiment of the present invention, part of the substrate 2121 does not need to be removed by laser light, with an edged tool, or the like; thus, the display area 2131 and the terminal electrode 2116 are not easily damaged. In addition, the distance between the display area 2131 and the opening 2122 can be shortened; thus, signal attenuation or electrical power attenuation can be suppressed. In addition, the manufacturing process is simplified; thus, the productivity of the light-emitting device can be increased. One embodiment of the present invention can provide a highly reliable light-emitting device having high manufacturing yield. In addition, one embodiment of the present invention can provide a light-emitting device with excellent display quality.

Modification Example

Figure 16A:
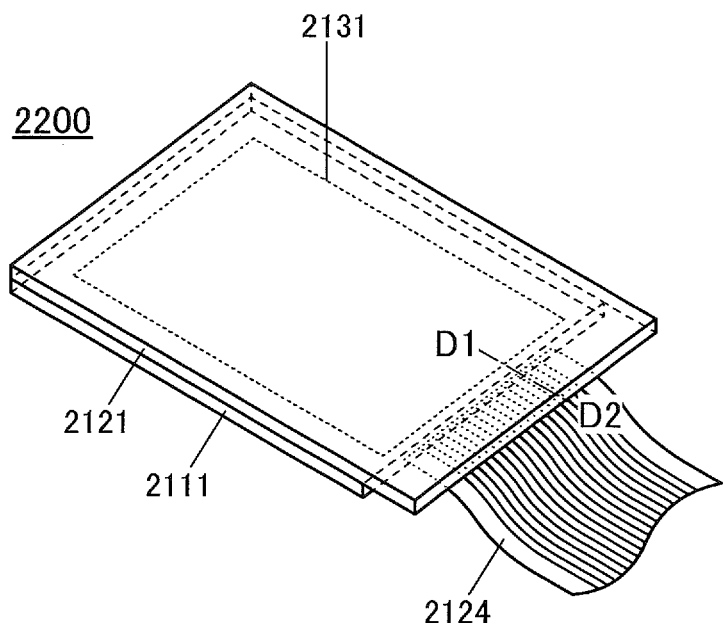
FIG. 16A is a perspective view illustrating a light-emitting device and FIG. 16B is a cross-sectional view illustrating the same.
Figure 16B:
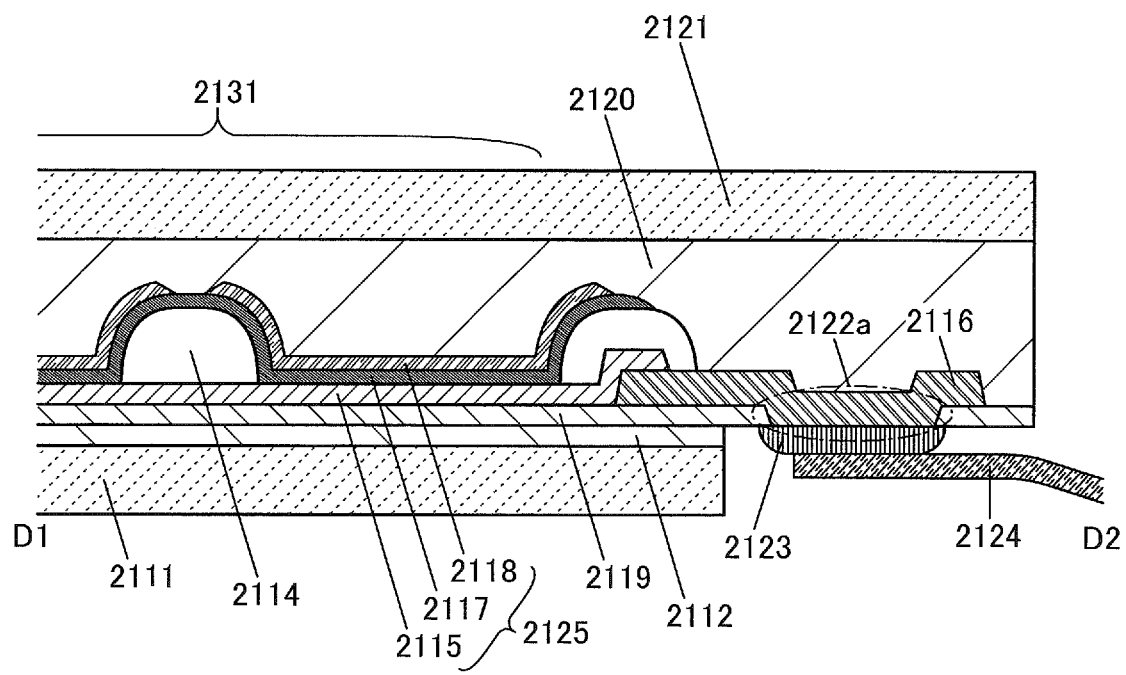

One embodiment of the present invention can be a structure of a light-emitting device 2200 illustrated in FIGS. 16A and 16B. FIG. 16A is a perspective view illustrating an outer appearance of the light-emitting device 2200, and FIG. 16B is a cross-sectional view taken along the dashed-dotted line D1-D2 in FIG. 16A.

In the light-emitting device 2200, the shape of the substrate 2111 is different from that in the light-emitting device 2100. The substrate 2111 included in the light-emitting device 2200 does not have the opening 2122b. In addition, the substrate 2111 is attached to the base layer 2119 so that the substrate 2111 and the opening 2122a overlap. Thus, the light-emitting device 2200 illustrated in FIGS. 16A and 16B has a structure in which edges of the substrate 2121 and the substrate 2111 do not align.

This embodiment can be implemented in an appropriate combination with any of the structures described in the other embodiments.

Embodiment 5

Figure 17A:
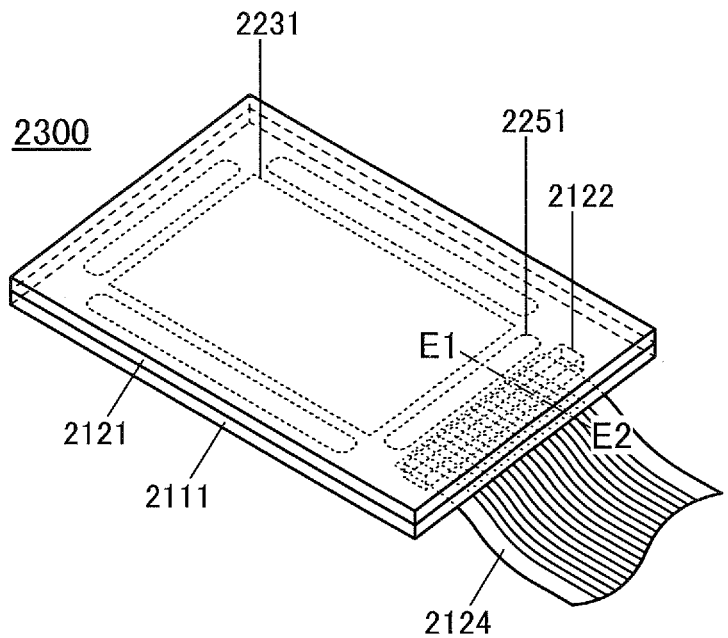
FIG. 17A is a perspective view illustrating a light-emitting device and FIG. 17B is a cross-sectional view illustrating the same.
Figure 17B:
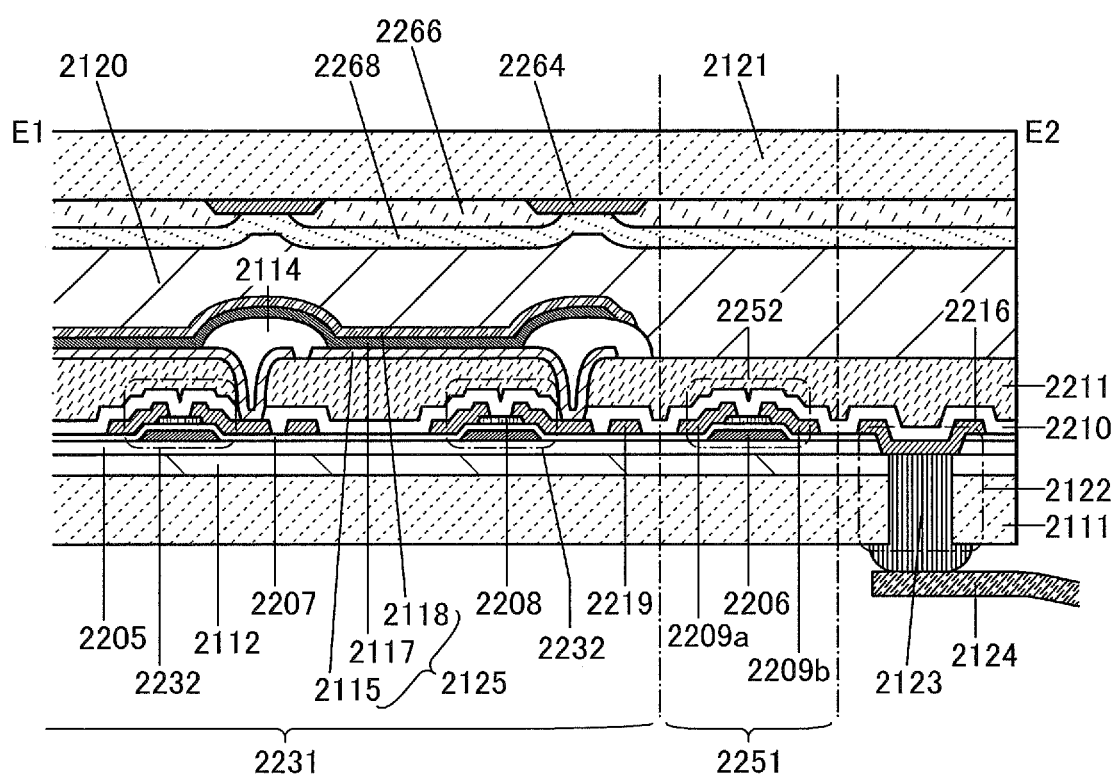

In this embodiment, a light-emitting device 2300 having a structure different from the structure of the light-emitting device 2100 described in the above embodiment is described with reference to FIGS. 17A and 17B. FIG. 17A is a perspective view of the light-emitting device 2300, and FIG. 17B is a cross-sectional view taken along the dashed-dotted line E1-E2 in FIG. 17A.

<Structure of Light-Emitting Device>

The light-emitting device 2300 described in this embodiment includes a display area 2231 and a peripheral circuit 2251. The light-emitting device 2300 also includes a terminal electrode 2216 and the light-emitting element 2125 including the electrode 2115, the EL layer 2117, and the electrode 2118. A plurality of light-emitting elements 2125 are formed in the display area 2231. A transistor 2232 for controlling the amount of light emitted from the light-emitting element 2125 is connected to each light-emitting element 2125.

The terminal electrode 2216 is electrically connected to the external electrode 2124 through the anisotropic conductive connection layer 2123 formed in the opening 2122. In addition, the terminal electrode 2216 is electrically connected to the peripheral circuit 2251.

The peripheral circuit 2251 includes a plurality of transistors 2252. The peripheral circuit 2251 has a function of determining which of the light-emitting elements 2125 in the display area 2231 is supplied with a signal from the external electrode 2124. Although a structure in which four peripheral circuits 2251 are provided outside the display area 2231 is illustrated in FIG. 17A, one embodiment of the present invention is not limited to the structure.

In the light-emitting device 2300 illustrated in FIGS. 17A and 17B, the substrate 2111 and the substrate 2121 are attached to each other with the bonding layer 2120 provided therebetween. An insulating layer 2205 is formed over the substrate 2111 with the bonding layer 2112 provided therebetween. The insulating layer 2205 can be formed using a material and a method similar to those of the insulating layer 205 disclosed in the above embodiment.

Note that the insulating layer 2205 functions as a base layer and can prevent or reduce diffusion of impurity elements from the substrate 2111, the bonding layer 2112, or the like to the transistor or the light-emitting element.

In addition, the transistor 2232, the transistor 2252, the terminal electrode 2216, and a wiring 2219 are formed over the insulating layer 2205. Note that although a channel-etched transistor that is a type of bottom-gate transistor is illustrated as the transistor 2232 and the transistor 2252 in this embodiment, a channel-protective transistor, a top-gate transistor, or the like can also be used.

The transistor 2232 and the transistor 2252 have the same structure. However, the size (e.g., channel length and channel width) or the like of each transistor can be adjusted as appropriate.

The transistor 2232 and the transistor 2252 each include a gate electrode 2206, a gate insulating layer 2207, a semiconductor layer 2208, a source electrode 2209a, and a drain electrode 2209b.

The terminal electrode 2216, the wiring 2219, the gate electrode 2206, the source electrode 2209a, and the drain electrode 2209b can be formed using a material and a method similar to those of the terminal electrode 2116. In addition, the gate insulating layer 2207 can be formed using a material and a method similar to those of the insulating layer 2205.

The semiconductor layer 2208 can be formed using a material and a method similar to those of the semiconductor layer 208 disclosed in the above embodiment.

In the case where an oxide semiconductor is used for the semiconductor layer 2208, an insulating layer containing oxygen is preferably used as an insulating layer that is in contact with the semiconductor layer 2208.

In addition, an insulating layer 2210 is formed over the transistor 2232 and the transistor 2252, and an insulating layer 2211 is formed over the insulating layer 2210. The insulating layer 2210 functions as a protective insulating layer and can prevent or reduce diffusion of impurity elements from a layer above the insulating layer 2210 to the transistor 2232 and the transistor 2252. The insulating layer 2210 can be formed using a material and a method similar to those of the insulating layer 2205.

Planarization treatment may be performed on the insulating layer 2211 to reduce unevenness of a surface on which the light-emitting element 2125 is formed. The planarization treatment may be, but not particularly limited to, polishing treatment (e.g., chemical mechanical polishing) or dry etching treatment.

Forming the insulating layer 2211 using an insulating material with a planarization function can omit polishing treatment. As the insulating material with a planarization function, for example, an organic material such as a polyimide resin or an acrylic resin can be used. Other than the above-described organic materials, it is also possible to use a low-dielectric constant material (low-k material) or the like. Note that the insulating layer 2211 may be formed by stacking a plurality of insulating films formed of these materials.

In addition, over the insulating layer 2211, the light-emitting element 2125 and the partition 2114 for separating the adjacent light-emitting elements 2125 are formed.

In addition, the substrate 2121 is provided with a light-shielding film 2264, a coloring layer 2266, and an overcoat layer 2268. The light-emitting device 2300 is a top-emission light-emitting device, in which light emitted from the light-emitting element 2125 is extracted from the substrate 2121 side through the coloring layer 2266.

The light-emitting element 2125 is electrically connected to the transistor 2232 through openings formed in the insulating layer 2211 and the insulating layer 2210.

Although an active matrix light-emitting device is described as an example of the light-emitting device in this embodiment, the present invention can also be applied to a passive matrix light-emitting device.

One embodiment of the present invention can be applied to display devices such as a liquid crystal display device including a liquid crystal element as a display element, an electronic paper, DMD, PDP, FED, and SED, without limitation to a light-emitting device including a light-emitting element as a display element.

Materials of a liquid crystal element can be similar to those given as examples in the above embodiment. A driving method of a liquid crystal element can be similar to any of the driving methods of the liquid crystal element disclosed in the above embodiment.

A display method of an electronic paper can be similar to any of the display methods of the electronic paper disclosed in the above embodiment.

This embodiment can be implemented in an appropriate combination with any of the structures described in the other embodiments.

Embodiment 6

Figure 18A:
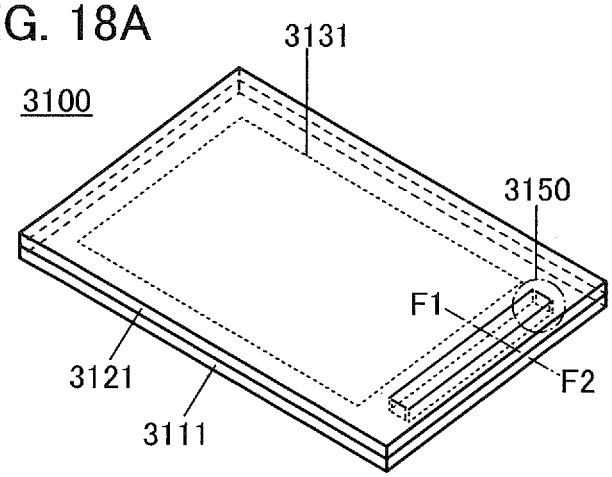
FIGS. 18A and 18B are perspective views illustrating a light-emitting device and FIGS. 18C and 18D are cross-sectional views illustrating the same.
Figure 18B:
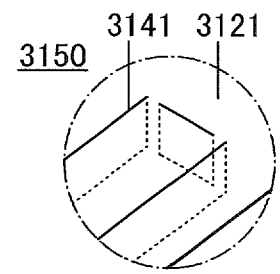
Figure 18C:
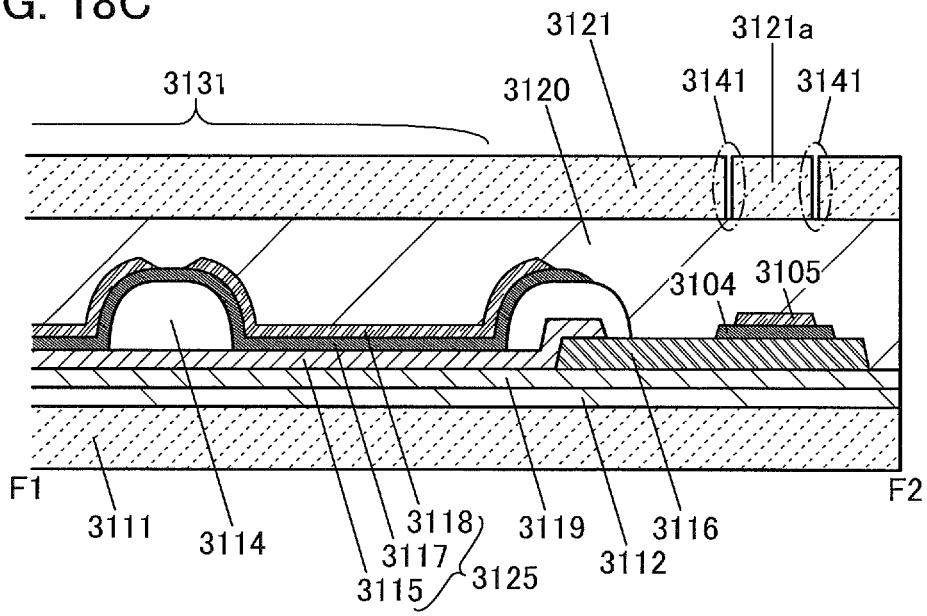
Figure 18D:
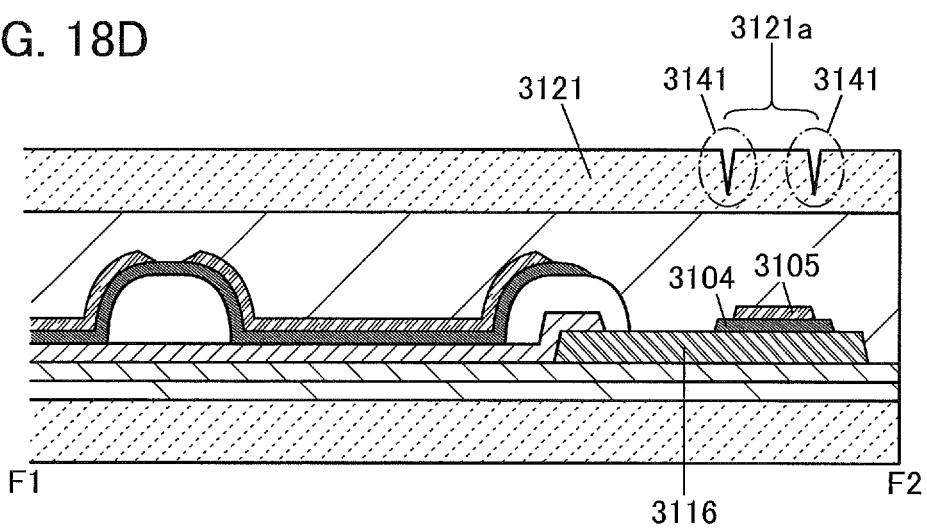

Structure examples of a light-emitting device 3100 of one embodiment of the present invention are described with reference to FIGS. 18A to 18D, FIGS. 19A to 19C, and FIGS. 20A and 20B. FIG. 18A is a perspective view illustrating the light-emitting device 3100, and FIG. 18B is an enlarged view of a portion 3150 in FIG. 18A. FIGS. 18C and 18D are cross-sectional views taken along the dashed-dotted line F1-F2 in FIG. 18A. Note that the light-emitting device 3100 disclosed in this specification is a display device in which a light-emitting element is used as a display element.
<Structure of Light-Emitting Device>
The light-emitting device 3100 described in this embodiment includes an electrode 3115, an EL layer 3117, an electrode 3118, a partition 3114, and a terminal electrode 3116. The electrode 3115 and the terminal electrode 3116 are electrically connected to each other. In the light-emitting device 3100, the partition 3114 is provided over the electrode 3115, the EL layer 3117 is provided over the electrode 3115 and the partition 3114, and the electrode 3118 is provided over the EL layer 3117.

A light-emitting element 3125 includes the electrode 3115, the EL layer 3117, and the electrode 3118. The light-emitting element 3125 is formed over a substrate 3111 with a bonding layer 3112 and a base layer 3119 provided therebetween. Note that a plurality of light-emitting elements 3125 are provided in a display area 3131.

In addition, in the light-emitting device 3100 described in this embodiment, a substrate 3121 is formed over the electrode 3118 with a bonding layer 3120 provided therebetween.

The substrate 3121 has a groove 3141. Although the groove 3141 illustrated in FIGS. 18A to 18C penetrate the substrate 3121 in the thickness direction, the groove 3141 does not necessarily penetrate the substrate 3121 in the thickness direction. As illustrated in FIG. 18D, the groove 3141 may have a given depth without penetrating the substrate 3121. When the groove 3141 does not penetrate the substrate 3121, the depth of the groove 3141 is preferably ½ or more, more preferably ⅔ or more, of the thickness of the substrate 3121. Note that in a plan view, a region of the substrate 3121 that is surrounded with the groove 3141 is called a portion 3121a.

In addition, a layer 3104 is formed over the terminal electrode 3116, and a layer 3105 is formed over the layer 3104. The layer 3104 and the layer 3105 over the terminal electrode 3116 are formed in a position that the portion 3121a overlaps.

Figure 19A:
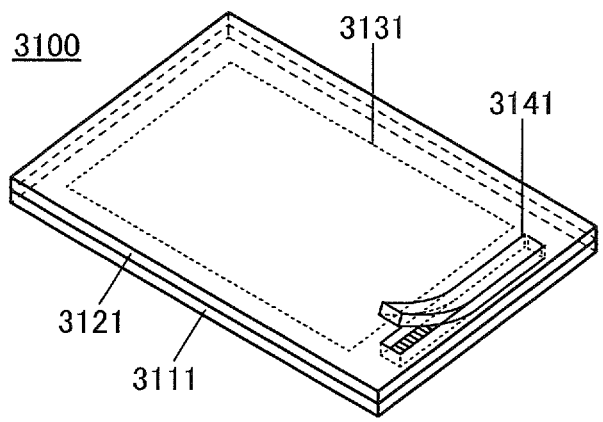
FIGS. 19A and 19B are perspective views illustrating a light-emitting device and FIG. 19C is a cross-sectional view illustrating the same.
Figure 19B:
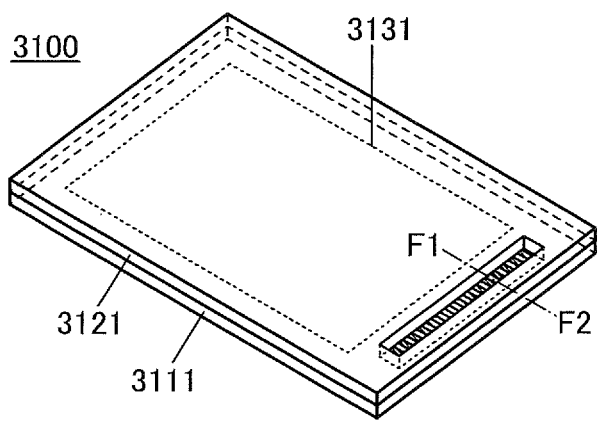
Figure 19C:
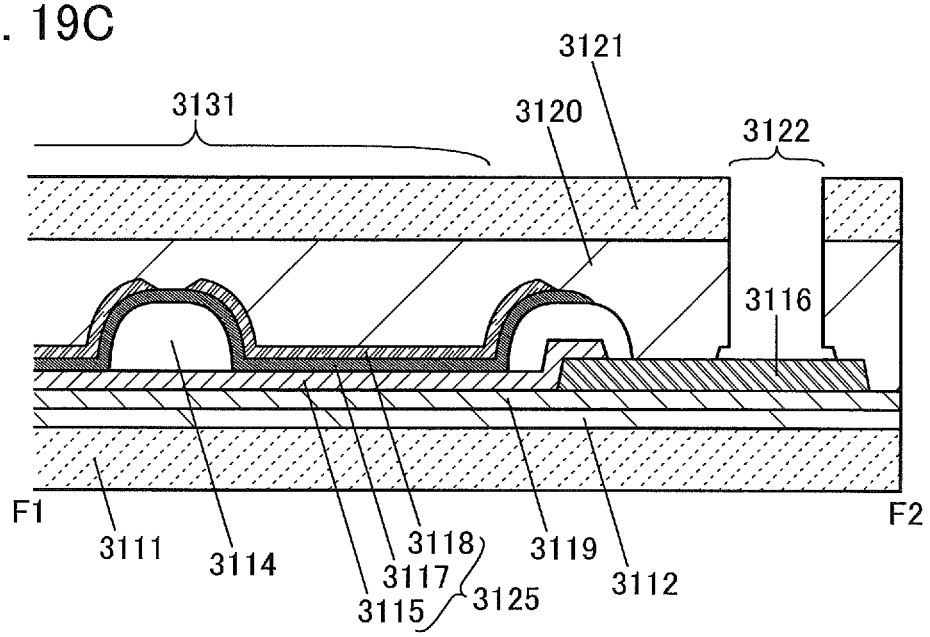

As illustrated in FIGS. 19A to 19C, the portion 3121a and the bonding layer 3120 that the portion 3121a overlaps are separated from the light-emitting device 3100, so that part of the terminal electrode 3116 can be exposed. FIG. 19A is a perspective view illustrating part of a separation step of the portion 3121a and the bonding layer 3120 that the portion 3121a overlaps. FIG. 19B is a perspective view illustrating a state after the separation step. FIG. 19C is a cross-sectional view taken along the dashed-dotted line F1-F2 in FIG. 19B.

The portion 3121a and the bonding layer 3120 that the portion 3121a overlaps are removed to form an opening 3122, so that part of the terminal electrode 3116 can be exposed.

Providing the layer 3104 and the layer 3105 in positions that the portion 3121a overlaps facilitates separation of the portion 3121a with the bonding layer 3120 that the portion 3121a overlaps, so that the terminal electrode 3116 can be exposed. Note that the layer 3104 and the layer 3105 are described in detail later.

Figure 20A:
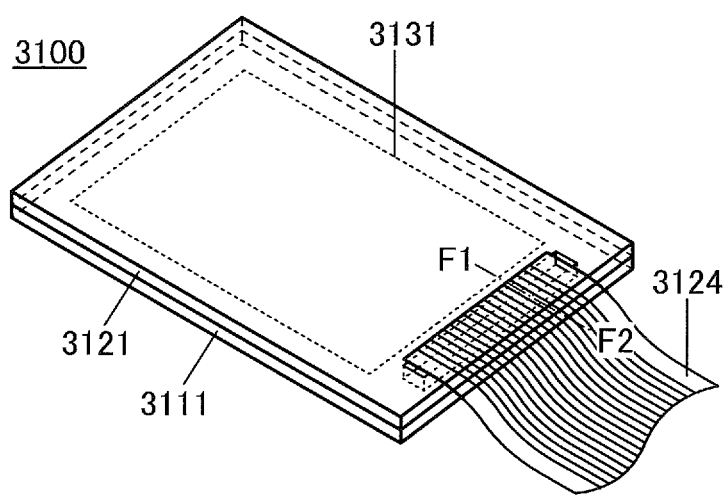
FIG. 20A is a perspective view illustrating a light-emitting device and FIG. 20B is a cross-sectional view illustrating the same.
Figure 20B:
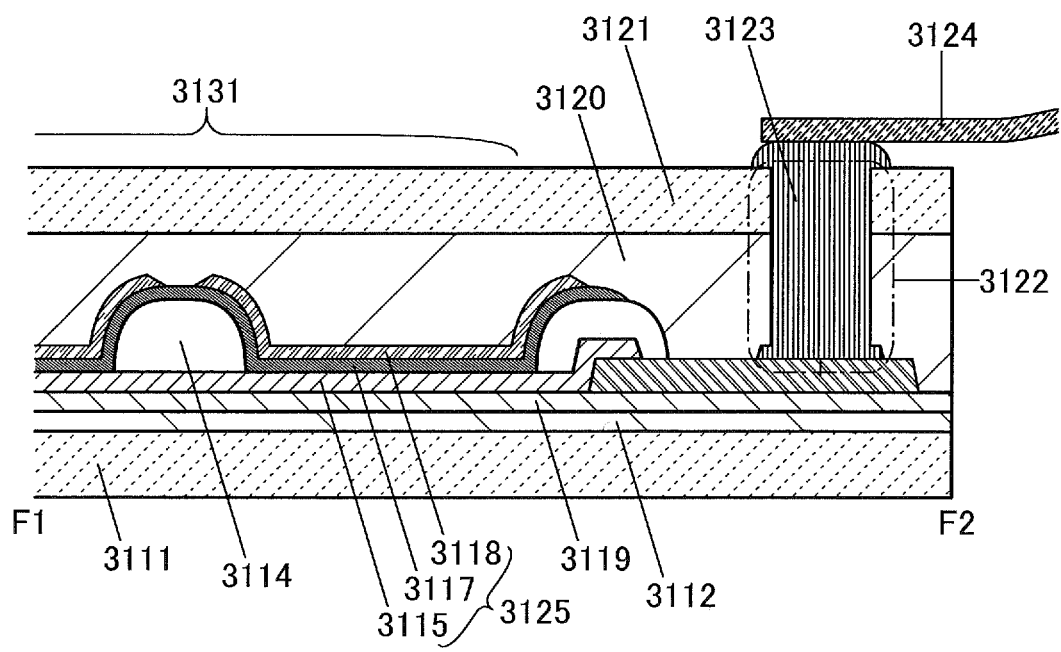

As illustrated in FIGS. 20A and 20B, an external electrode 3124 and the terminal electrode 3116 can be electrically connected to each other through an anisotropic conductive connection layer 3123 in the opening 3122. Thus, a region of the substrate 3121 that overlaps the opening 3122 is also called an external electrode connection region. FIG. 20A is a perspective view of the light-emitting device 3100 to which the external electrode 3124 is connected, and FIG. 20B is a cross-sectional view taken along the dashed-dotted line F1-F2 in FIG. 20A.

A switching element for controlling a signal supplied to the light-emitting element 3125 may be provided between the light-emitting element 3125 and the terminal electrode 3116. For example, a transistor may be provided between the light-emitting element 3125 and the terminal electrode 3116.

A transistor is a kind of semiconductor element and enables amplification of current or voltage, switching operation for controlling conduction or non-conduction, or the like. By providing a transistor between the light-emitting element 3125 and the terminal electrode 3116, the area of the display area 3131 can be increased easily and a higher-resolution display can be achieved easily. Note that a resistor, an inductor, a capacitor, or the like, without limitation to a switching element such as a transistor, can be provided in the display area 3131.

<Substrates>

The substrate 3111 and the substrate 3121 can be formed using materials similar to those of the substrate 121 and the substrate 111 disclosed in the above embodiment. In the case where the light-emitting device 3100 is a bottom-emission light-emitting device or a dual-emission light-emitting device, a material that transmits light emitted from the EL layer 3117 is used for the substrate 3111. In the case where the light-emitting device 3100 is a top-emission light-emitting device or a dual-emission light-emitting device, a material that transmits light emitted from the EL layer 3117 is used for the substrate 3121.

<Base Layer>

The base layer 3119 can be formed using a material and a method similar to those of the base layer 119 disclosed in the above embodiment.

The base layer 3119 can prevent or reduce diffusion of impurity elements from the substrate 3111, the bonding layer 3112, or the like to the light-emitting element 3125.

<Terminal Electrode>

The terminal electrode 3116 can be formed using a material and a method similar to those of the terminal electrode 116 disclosed in the above embodiment.

<Electrode 3115>

The electrode 3115 is preferably formed using a conductive material that efficiently reflects light emitted from the EL layer 3117 formed later. The electrode 3115 can be formed using a material and a method similar to those of the electrode 115 disclosed in the above embodiment.

The light-emitting device having a top emission structure is described as an example in this embodiment. In the case of a light-emitting device having a bottom emission structure or a dual emission structure, the electrode 3115 may be formed using a light-transmitting conductive material.

<Partition>

The partition 3114 is provided in order to prevent an electrical short circuit between the adjacent electrodes 3118. In the case of using a metal mask for formation of the EL layer 3117 described later, the partition 3114 also has a function of preventing the metal mask from being in contact with a region where the light-emitting element 3125 is formed. The partition 3114 can be formed using a material and a method similar to those of the partition 114 disclosed in the above embodiment. The partition 3114 is preferably formed so that its sidewall has a tapered shape or a tilted surface with a continuous curvature. The sidewall of the partition 3114 having the above-described shape enables favorable coverage with the EL layer 3117 and the electrode 3118 formed later.

<EL Layer>

A structure of the EL layer 3117 is described in Embodiment 9.

<Electrode 3118>

The electrode 3118 is used as a cathode in this embodiment, and thus is preferably formed using a material that has a low work function and can inject electrons into the EL layer 3117 described later. The electrode 3118 can be formed using a material and a method similar to those of the electrode 118 disclosed in the above embodiment.

In the case where light emitted from the EL layer 3117 is extracted through the electrode 3118, the electrode 3118 preferably has a property of transmitting visible light.

<Bonding Layer>

The bonding layer 3120 is in contact with the electrode 3118 in this embodiment. The substrate 3121 is fixed by the bonding layer 3120. In addition, the substrate 3111 is fixed by the bonding layer 3112. The bonding layer 3120 and the bonding layer 3112 can be formed using a material and a method similar to those of the bonding layer 120 and the bonding layer 112 disclosed in the above embodiment. A drying agent (e.g., zeolite) having a size less than or equal to the wavelength of light or a filler (e.g., titanium oxide or zirconium) with a high refractive index is preferably mixed into the bonding layer 3120 in the case of a top emission structure or into the bonding layer 3112 in the case of a bottom emission structure, in which case the efficiency of extracting light emitted from the EL layer 3117 can be improved.

<Anisotropic Conductive Connection Layer>

The anisotropic conductive connection layer 3123 can be formed using a material and a method similar to those of the anisotropic conductive connection layer 123 disclosed in the above embodiment.

<Method for Manufacturing Light-Emitting Device>

Next, an example of a method for manufacturing the light-emitting device 3100 is described with reference to FIGS. 21A to 21E, FIGS. 22A and 22B, FIGS. 23A and 23B, and FIGS. 24A to 24C. FIGS. 21A to 24C are cross-sectional views taken along the dashed-dotted line F1-F2 in FIGS. 18A and 18B, FIGS. 19A and 19B, and FIG. 20A.

<Formation of Separation Layer>

Figure 21A:
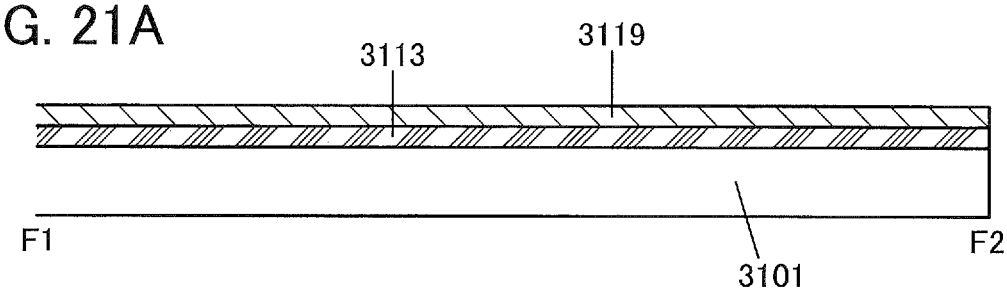
FIGS. 21A to 21E are cross-sectional views illustrating a method for manufacturing a light-emitting device.
Figure 21B:
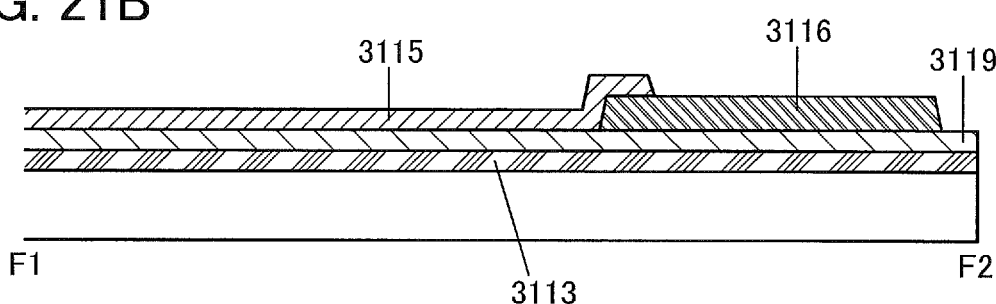

First, the separation layer 3113 is formed over an element formation substrate 3101 (see FIG. 21A). Note that the element formation substrate 3101 can be formed using a material similar to that of the element formation substrate 101 disclosed in the above embodiment.

The separation layer 3113 can be formed using a material and a method similar to those of the separation layer 113 disclosed in the above embodiment.

In this embodiment, the separation layer 3113 is formed of tungsten by a sputtering method.

<Formation of Base Layer>

Next, the base layer 3119 is formed over the separation layer 3113 (see FIG. 21A). In this embodiment, the base layer 3119 is formed of silicon oxide by a plasma CVD method.

<Formation of Terminal Electrode>

Next, the terminal electrode 3116 is formed over the base layer 3119. First, a three-layer metal film in which aluminum is interposed between two layers of molybdenum is formed over the base layer 3119 by a sputtering method. After that, a resist mask is formed over the metal film, and the metal film is etched into a desired shape with the use of the resist mask. In the above-described manner, the terminal electrode 3116 can be formed. The resist mask can be formed by a photolithography method, a printing method, an inkjet method, or the like as appropriate. Formation of the resist mask by an inkjet method needs no photomask; thus, manufacturing costs can be reduced.

The metal film may be etched by either a dry etching method or a wet etching method, or by both a dry etching method and a wet etching method. In the case where the metal film is etched by a wet etching method, a solution obtained by mixing phosphoric acid, acetic acid, and nitric acid, a solution containing oxalic acid, a solution containing phosphoric acid, or the like can be used as an etchant. After the etching treatment, the resist mask is removed (see FIG. 21B).

<Formation of Electrode>

Next, the electrode 3115 is formed over the base layer 3119. The electrode 3115 can be formed in a manner similar to that of the terminal electrode 3116. In this embodiment, the electrode 3115 is formed using a material in which indium tin oxide is stacked over silver. The electrode 3115 and the terminal electrode 3116 are electrically connected to each other (see FIG. 21B).

<Formation of Partition>

Figure 21C:
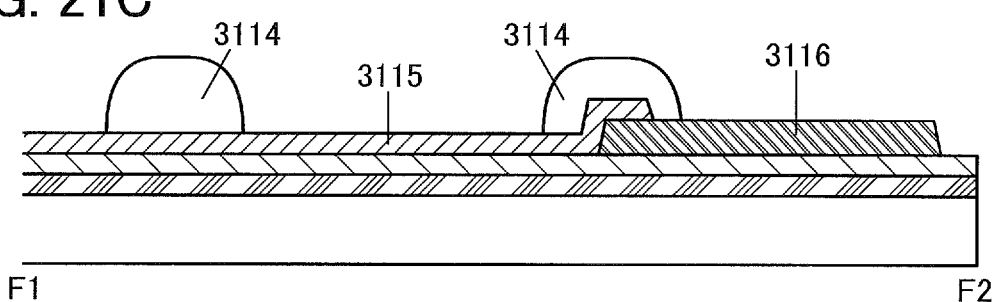
Figure 21D:
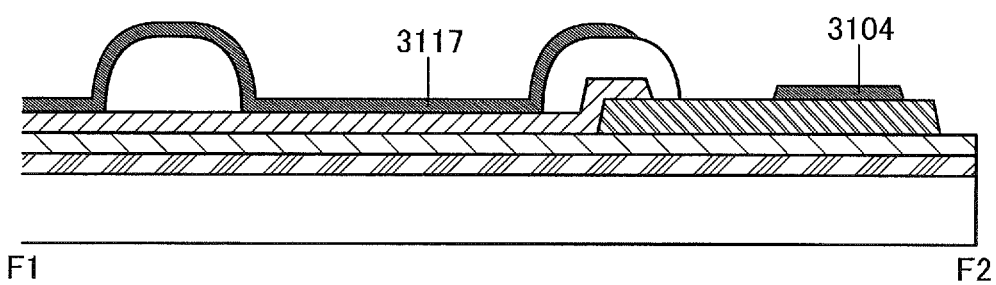
Figure 21E:
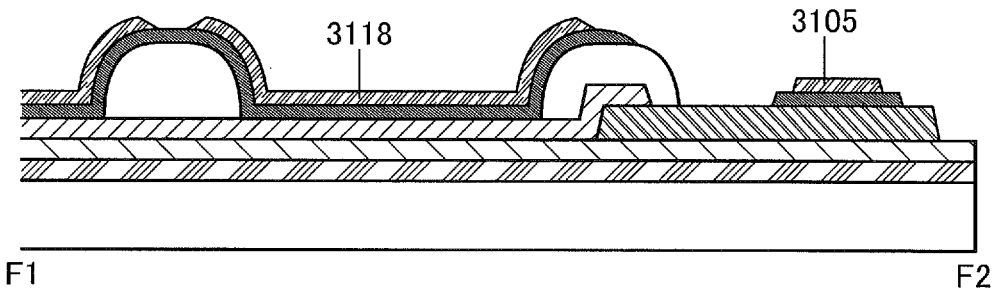

Next, the partition 3114 is formed (see FIG. 21C). In this embodiment, the partition 3114 is formed in such a manner that a photosensitive organic resin material is applied by a coating method and processed into a desired shape. In this embodiment, the partition 3114 is formed using a photosensitive imide resin.

<Formation of EL Layer>

Next, the EL layer 3117 is formed over the electrode 3115 and the partition 3114. At the same time as the EL layer 3117, the layer 3104 is formed in a region on the terminal electrode 3116 that the opening 3122 is to overlap (see FIG. 21D). The layer 3104 can be formed using a material and a method similar to those of the EL layer 3117.

<Formation of Electrode>

Next, the electrode 3118 is formed in contact with the EL layer 3117. At the same time as the electrode 3118, the layer 3105 is formed in a region on the layer 3104 that the opening 3122 is to overlap. The layer 3105 can be formed using part of a layer formed at the same time as the electrode 3118. The electrode 3118 and the layer 3105 can be formed by an evaporation method, a sputtering method, or the like (see FIG. 21E).

<Formation of Substrate>

Next, the substrate 3121 having the groove 3141 penetrating the substrate 3121 in the thickness direction is formed over the electrode 3118 with the bonding layer 3120 provided therebetween. At this time, the substrate 3121 is formed so that the portion 3121a of the substrate 3121 overlaps the terminal electrode 3116, the layer 3104, and the layer 3105 (see FIG. 22A).

Note that the layer 3104 is formed to have a size with which the outer edges of the layer 3104 are located outside the portion 3121a when seen from the top. In addition, the layer 3105 is formed to have a size with which the outer edges of the layer 3105 are located inside the portion 3121a when seen from the top.

Note that in the case where the groove 3141 has a given depth, the groove 3141 may be formed in such a manner that the substrate 3121 without the groove 3141 is formed over the electrode 3118 first and then the groove 3141 is formed in the substrate 3121 with a sharp edged tool or by laser light.

If a sharp edged tool or laser light penetrates the substrate 3121 at this time, the terminal electrode 3116 or another portion might be damaged. For this reason, it is necessary that the groove 3141 does not penetrate the substrate 3121 in the case where the groove 3141 is formed after the substrate 3121 is formed over the electrode 3118.

Meanwhile, in the case where the formed groove 3141 is shallow, it is difficult to separate the portion 3121a in a later step. When the groove 3141 does not penetrate the substrate 3121, the depth of the groove 3141 is preferably ½ or more, more preferably ⅔ or more, of the thickness of the substrate 3121.

<Separation of Substrate>

Figure 22A:
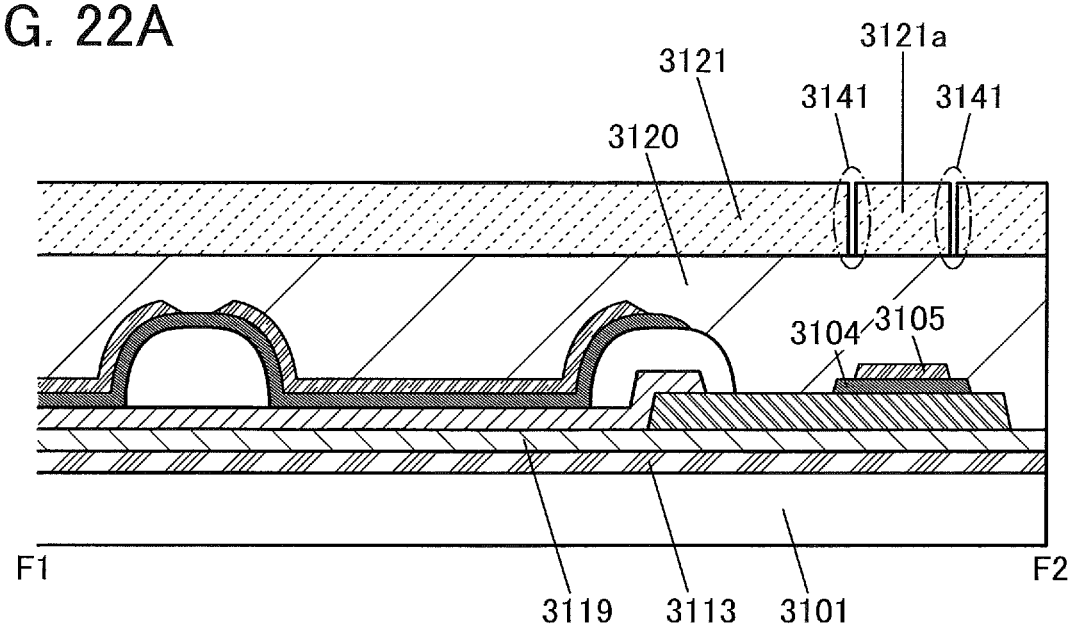
FIGS. 22A and 22B are cross-sectional views illustrating a method for manufacturing a light-emitting device.
Figure 22B:
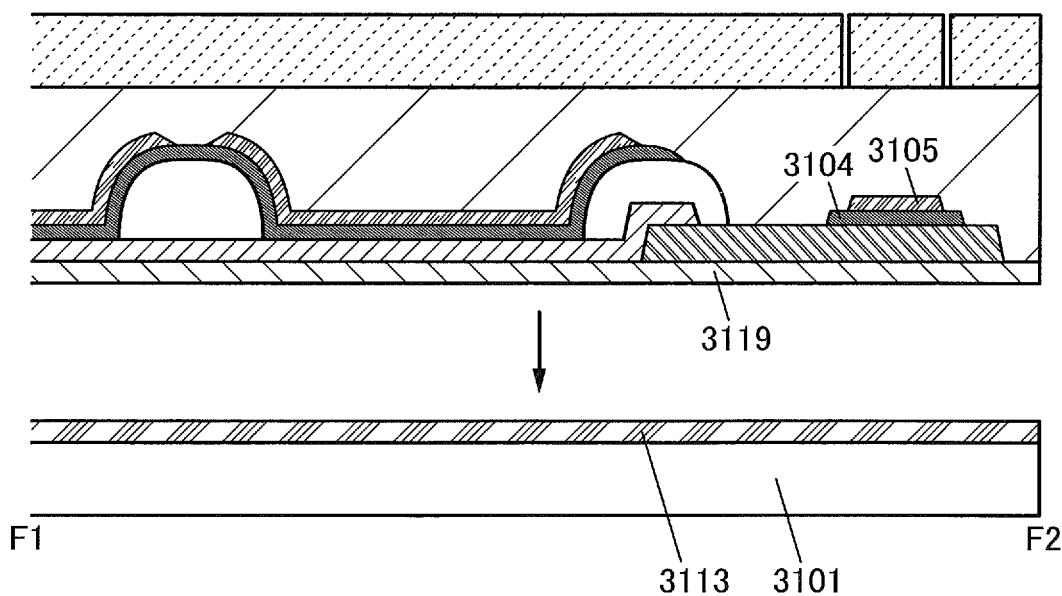

Next, the element formation substrate 3101 and the separation layer 3113 are separated from the base layer 3119 (see FIG. 22B). The separation can be performed by a method similar to the separation method of the substrate disclosed in the above embodiment.

<Attachment of Substrate to Light-Emitting Device>

Figure 23A:
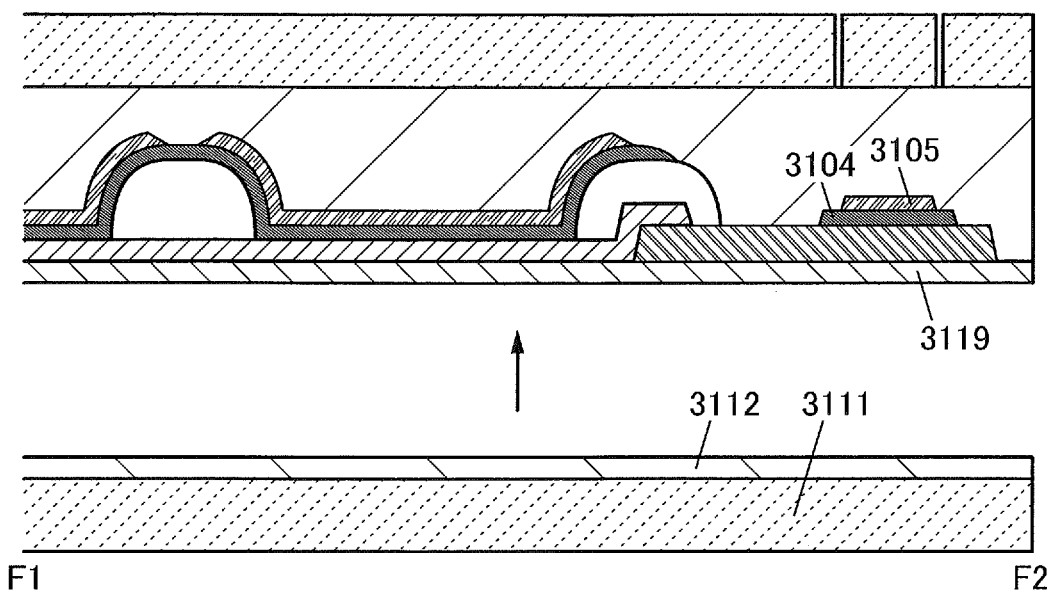
FIGS. 23A and 23B are cross-sectional views illustrating a method for manufacturing a light-emitting device.
Figure 23B:
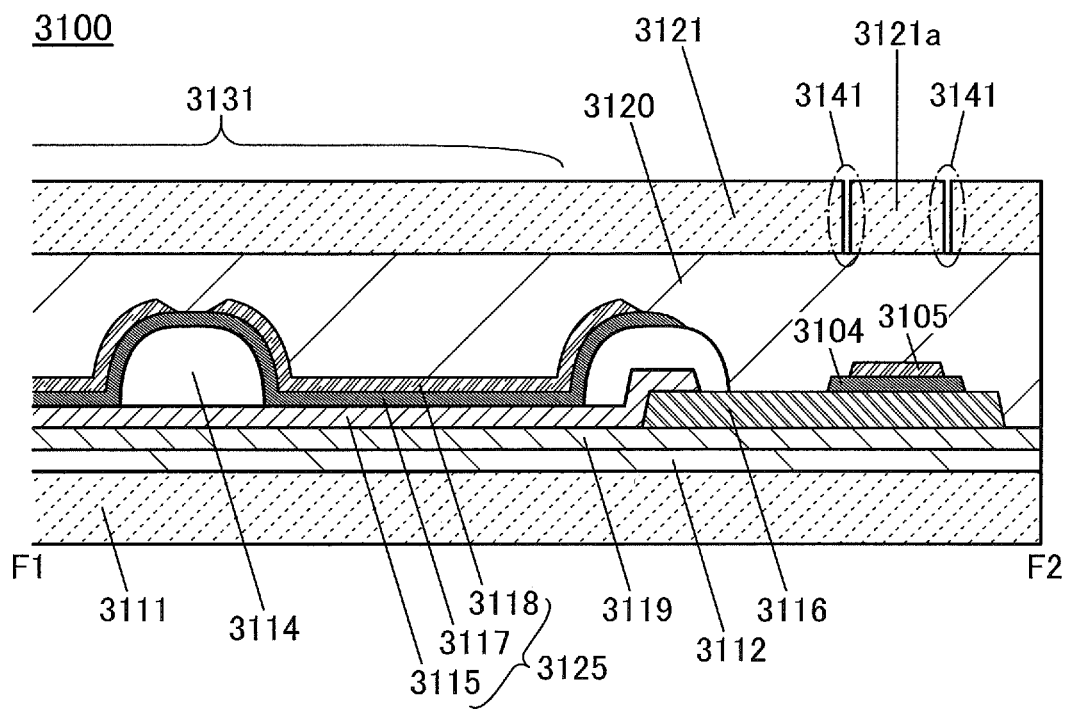

Next, the substrate 3111 is attached to the base layer 3119 with the bonding layer 3112 provided therebetween (see FIG. 23A). In the above-described manner, the light-emitting device 3100 can be manufactured (see FIG. 23B).

Next, steps for electrically connecting the terminal electrode 3116 and the external electrode 3124 are described.

<Exposure of Surface of Terminal Electrode>

An adhesive tape is attached onto the portion 3121a of the substrate 3121, and then the adhesive tape is pulled upward to be removed, so that the portion 3121a is separated from the substrate 3121 along the groove 3141. At this time, the bonding layer 3120 and the layer 3105 that the portion 3121a overlaps can be removed together with the portion 3121a because of low adhesion between the layer 3104 and the layer 3105 (see FIG. 19A and FIG. 24A).

Note that the layer 3105 is not necessarily formed. However, the layer 3105 is formed at the interface between the bonding layer 3120 and the layer 3104, whereby the bonding layer 3120 that the portion 3121a overlaps hardly remains on the light-emitting device 3100 side at the time of the separation of the portion 3121a. Thus, by forming the layer 3105 at the interface between the bonding layer 3120 and the layer 3104, manufacturing yield can be improved.

<Removal of Layer 3104>

Figure 24A:
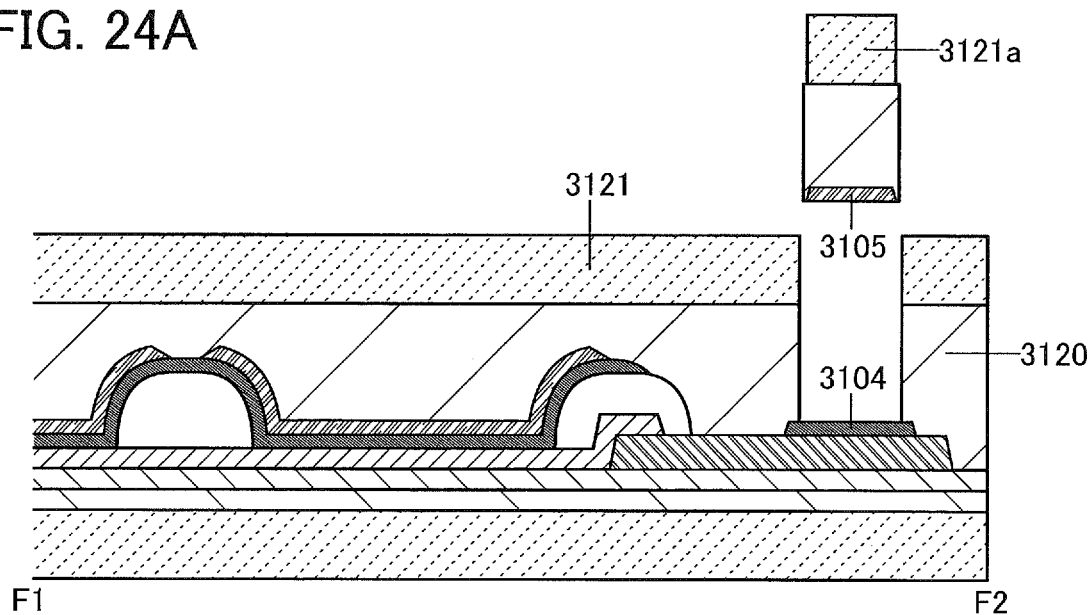
FIGS. 24A to 24C are cross-sectional views illustrating a method for manufacturing a light-emitting device.
Figure 24B:
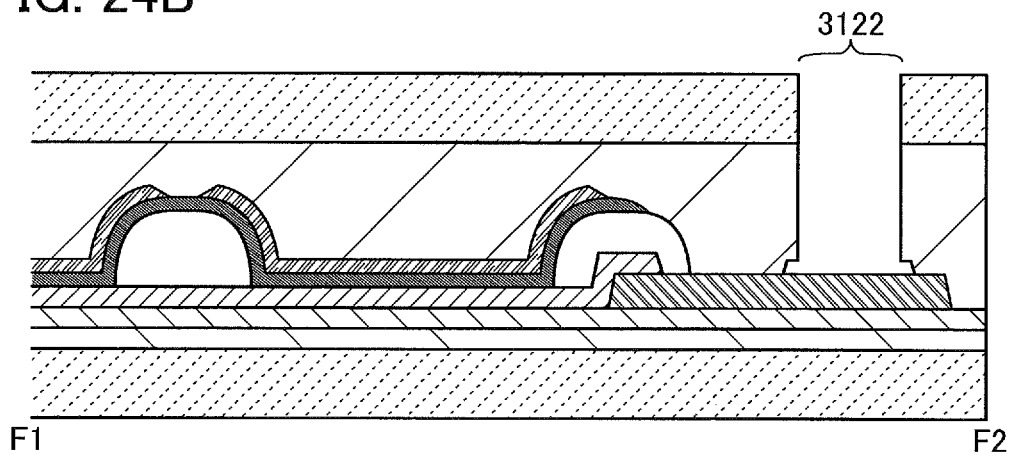

Next, the layer 3104 is removed with an organic solvent such as ethyl alcohol to expose part of a surface of the terminal electrode 3116 (see FIG. 19B and FIG. 24B).

<Formation of External Electrode>

Figure 24C:
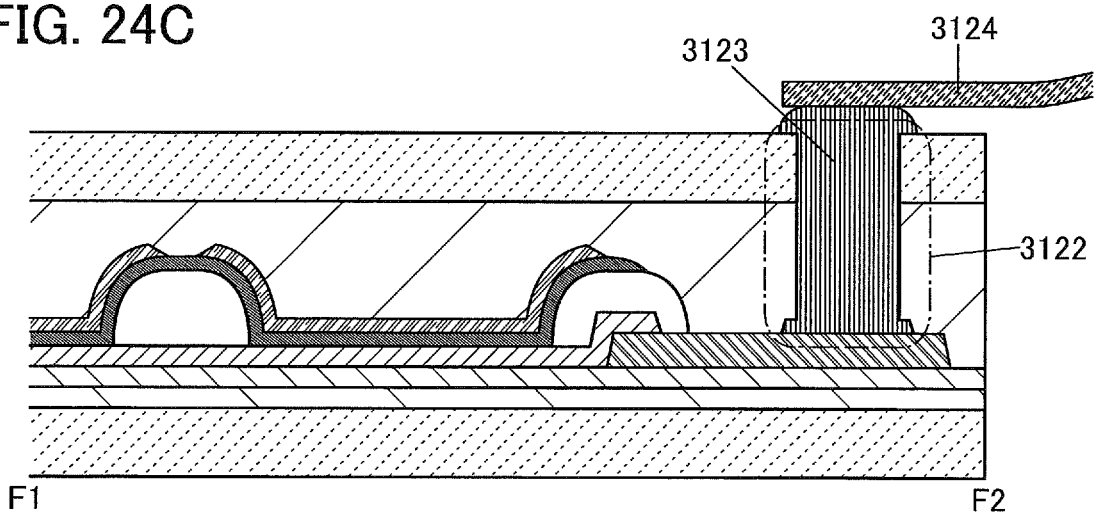

Next, the anisotropic conductive connection layer 3123 is formed in the opening 3122, and the external electrode 3124 for inputting electric power or a signal to the light-emitting device 3100 is formed over the anisotropic conductive connection layer 3123 (see FIG. 24C). The external electrode 3124 and the terminal electrode 3116 are electrically connected to each other through the anisotropic conductive connection layer 3123. Thus, electric power or a signal can be input to the light-emitting device 3100. Note that the external electrode 3124 can be formed using a material and a method similar to those of the external electrode 124 disclosed in the above embodiment.

In one embodiment of the present invention, the groove 3141 is formed in the substrate 3121, and the layer 3104 and the layer 3105 are formed at the interface between the bonding layer 3120 and the terminal electrode 3116, so that the terminal electrode 3116 can be exposed easily. Thus, there is no need to hollow out part of the substrate 3121 with a sharp edged tool or the like for exposure of the terminal electrode 3116; thus, the light-emitting device 3100 and the terminal electrode 3116 are not easily damaged.

The layer 3104 can be formed in the same step as the EL layer 3117. The layer 3105 can be formed in the same step as the electrode 3118. Thus, the portion 3121a can be removed easily without increasing the number of manufacturing steps of the light-emitting device 3100. One embodiment of the present invention can provide a highly reliable light-emitting device having high manufacturing yield.

The portion 3121a has a function of protecting the terminal electrode 3116. The light-emitting device 3100 is stored and transferred without separating the portion 3121a, whereby the terminal electrode 3116 can be protected when stored and transferred, and breakage of the light-emitting device 3100 due to electrostatic electricity or the like can be prevented.

This embodiment can be implemented in an appropriate combination with any of the structures described in the other embodiments.

Embodiment 7

FIGS. 25A to 25E and FIGS. 26A to 26E are each an enlarged plan view of a region of the substrate 3121 that overlaps the terminal electrode 3116. FIGS. 25A to 25E and FIGS. 26A to 26E illustrate arrangement examples of the grooves 3141.

In the plan view, a portion surrounded with the grooves 3141 is the portion 3121a. In other words, the grooves 3141 are formed along the outer edge of the portion 3121a. In the case where the grooves 3141 penetrate the substrate 3121 in the thickness direction, it is necessary to prevent a reduction in manufacturing yield due to unintentional separation of the portion 3121a from the substrate 3121 before attachment of the substrate 3121 onto the substrate 3111. For this reason, it is necessary to form at least two regions without grooves 3141 along the outer edge of the portion 3121a (the region is hereinafter called "gap a").

FIGS. 25A to 25E and FIG. 26A each illustrate an example in which the grooves 3141 are formed in the form of perforations along the outer edge of the rectangular portion 3121a in the plan view. Note that the perforations are continuously formed holes for facilitating separation and the groove 3141 corresponds to the hole.

In the case where the groove 3141 does not penetrate the substrate 3121 in the thickness direction, unintentional separation of the portion 3121a can be prevented even if the grooves 3141 are not formed in the form of perforations. Thus, in the case where the groove 3141 does not penetrate the substrate 3121 in the thickness direction, the outer edge of the portion 3121a can be surrounded with one groove 3141. Note that the grooves 3141 that do not penetrate the substrate 3121 in the thickness direction may be formed in the form of perforations.

Figure 25A:
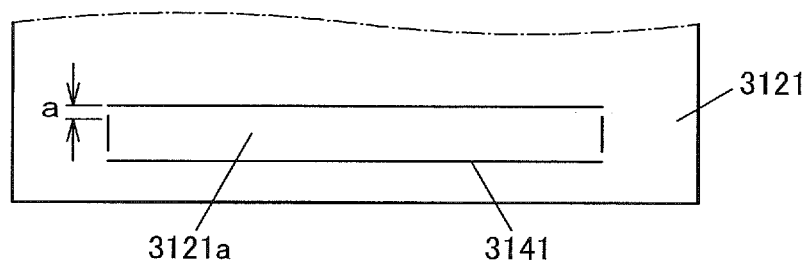
FIGS. 25A to 25E illustrate arrangement examples of grooves.

In FIG. 25A, the groove 3141 is not formed in both ends of each short side of the portion 3121a, and the long side formed of the groove 3141 and the short side formed of the groove 3141 are separated by the gap a.

Figure 25B:
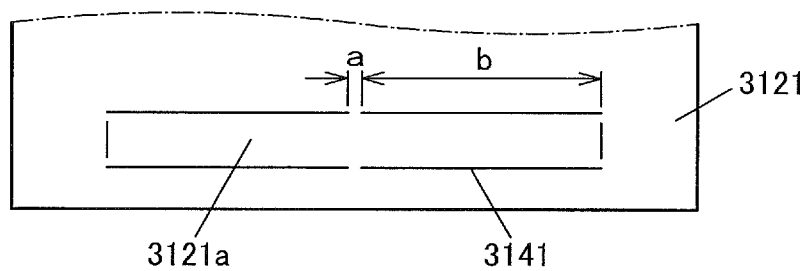

FIG. 25B illustrates a modification example of the structure illustrated in FIG. 25A, in which the long sides of the portion 3121a are each formed of two grooves 3141.

Note that the length of the gap a is the shortest distance between an end of the groove 3141 and an end of the adjacent groove 3141. In the case where a plurality of grooves 3141 are formed in the form of perforations, a too large gap a makes the separation of the portion 3121a difficult. The length of the gap a is preferably 50 times or less, more preferably 20 times or less, still more preferably 10 times or less of the thickness of the substrate 3121. In addition, the longer the length b of one groove 3141 is, the easier the separation of the portion 3121a is. The length b of one groove 3141 is preferably longer than or equal to the length of the gap a.

Figure 25C:
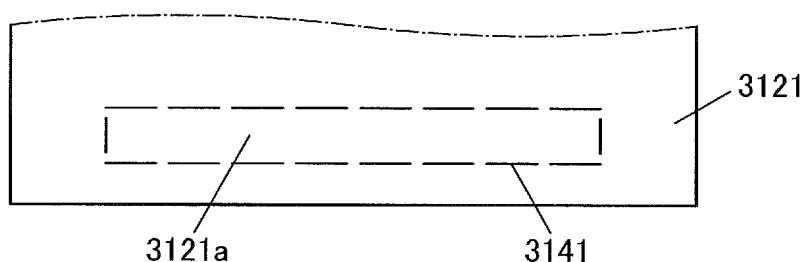

FIG. 25C illustrates another modification example of the structure illustrated in FIG. 25A, in which each long side of the portion 3121a is formed of eight grooves 3141.

Figure 25D:
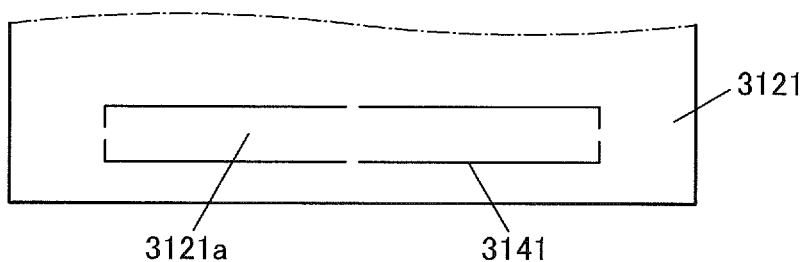

FIG. 25D illustrates an example in which the grooves 3141 along the outer edge of the portion 3121a that are separated in the middle of the four sides of the portion 3121a are provided. In FIG. 25D, the portion 3121a with a rectangular shape is made up of four L-shaped grooves 3141.

Figure 25E:
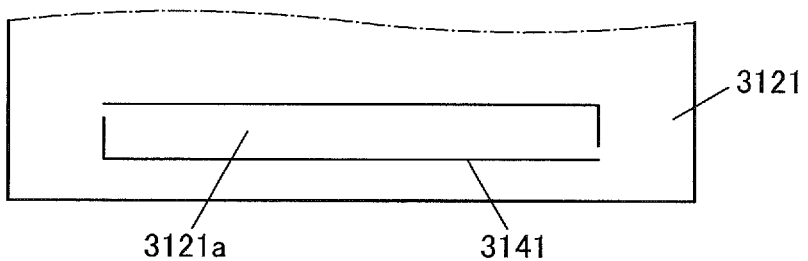

FIG. 25E illustrates an example in which the grooves 3141 are formed along the outer edge of the portion 3121a and the gap a is provided in part of each of the two short sides of the portion 3121a. In FIG. 25E, the portion 3121a is made up of two L-shaped grooves 3141.

Figure 26A:
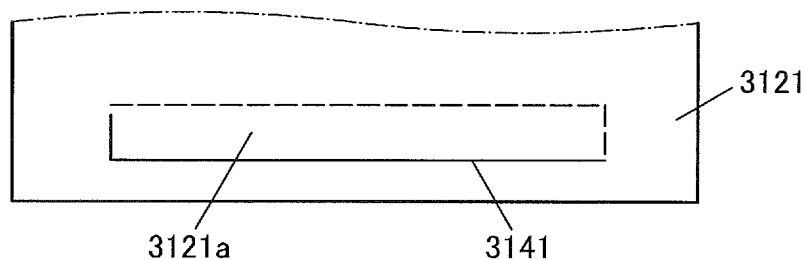
FIGS. 26A to 26E illustrate arrangement examples of grooves.

FIG. 26A illustrates an example in which one long side and one short side of the portion 3121a are formed of the L-shaped groove 3141 and the other long side and short side of the portion 3121a are formed of the grooves 3141 in the form of perforations.

Figure 26B:
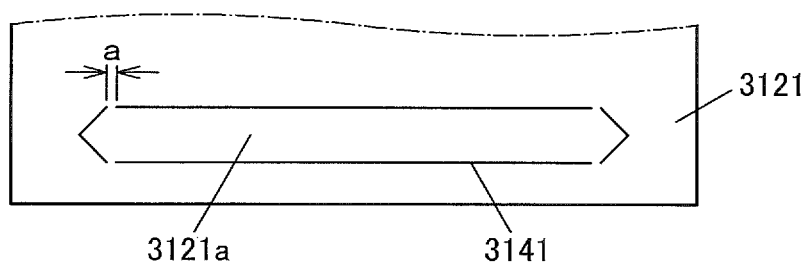

FIG. 26B illustrates an example in which the short sides of the portion 3121a are formed of dogleg grooves 3141.

Figure 26C:
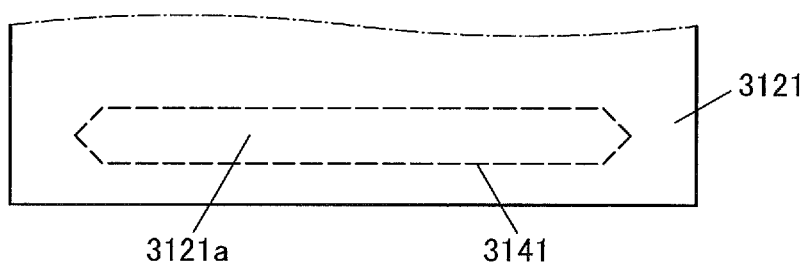

FIG. 26C is a modification example in which the two parallel grooves 3141 in FIG. 26B are formed of each a plurality of grooves 3141.

Figure 26D:
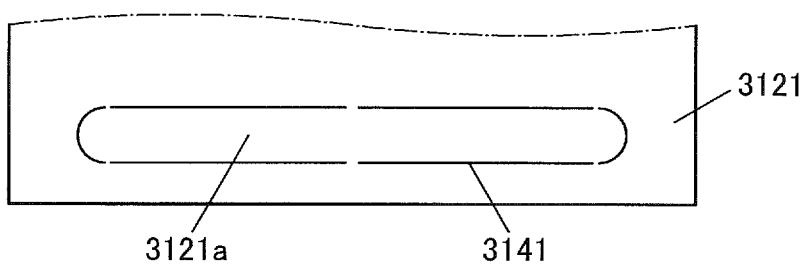

FIG. 26D is another modification example in which the dogleg grooves 3141 in FIG. 26B are arc-shaped grooves 3141.

Ends of the portion 3121a are extended outward in the plan view as illustrated in FIGS. 26B to 26D, whereby the portion 3121a can be separated more easily.

Figure 26E:
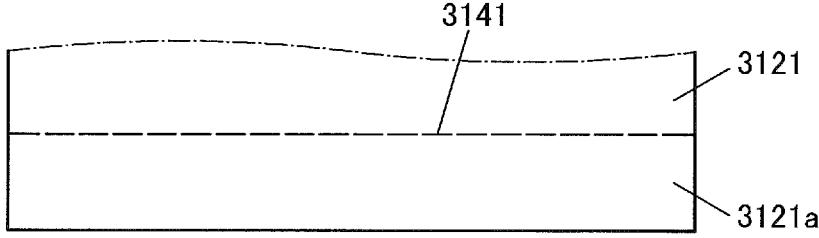

The grooves 3141 may be formed across the substrate 3121 as illustrated in FIG. 26E. However, ends of the portion 3121a are easily in contact with storage equipment, a jig, or the like at the time of storage or transfer of the light-emitting device 3100, which might cause unintentional separation or partial separation of the portion 3121a. In addition, when the portion 3121a is separated to expose the terminal electrode 3116, the mechanical strength of the region, i.e., the external electrode connection region is significantly decreased; thus, the external electrode connection region is easily deformed unintentionally, which easily causes breakage or the like of the light-emitting device 3100.

Meanwhile, the portion 3121a is formed inside edges of the substrate 3121 in a plan view, so that the outer edge of the external electrode connection portion can be supported by the substrate 3111 and the substrate 3121. This can make it difficult to increase the mechanical strength of the external electrode connection region and can reduce unintentional deformation of the external electrode connection region. Thus, breakage of the light-emitting device 3100 can be prevented, and the reliability of the light-emitting device 3100 can be improved.

This embodiment can be implemented in an appropriate combination with any of the structures described in the other embodiments.

Embodiment 8

Figure 27A:
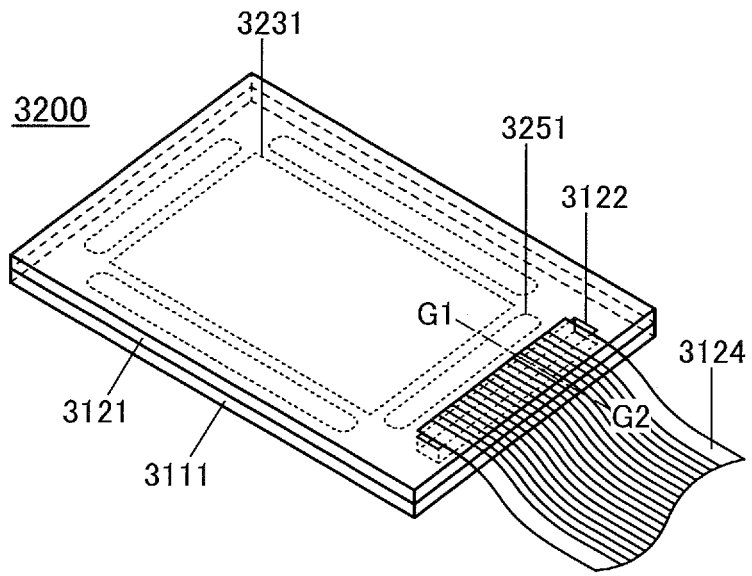
FIG. 27A is a perspective view illustrating a light-emitting device and FIG. 27B is a cross-sectional view illustrating the same.
Figure 27B:
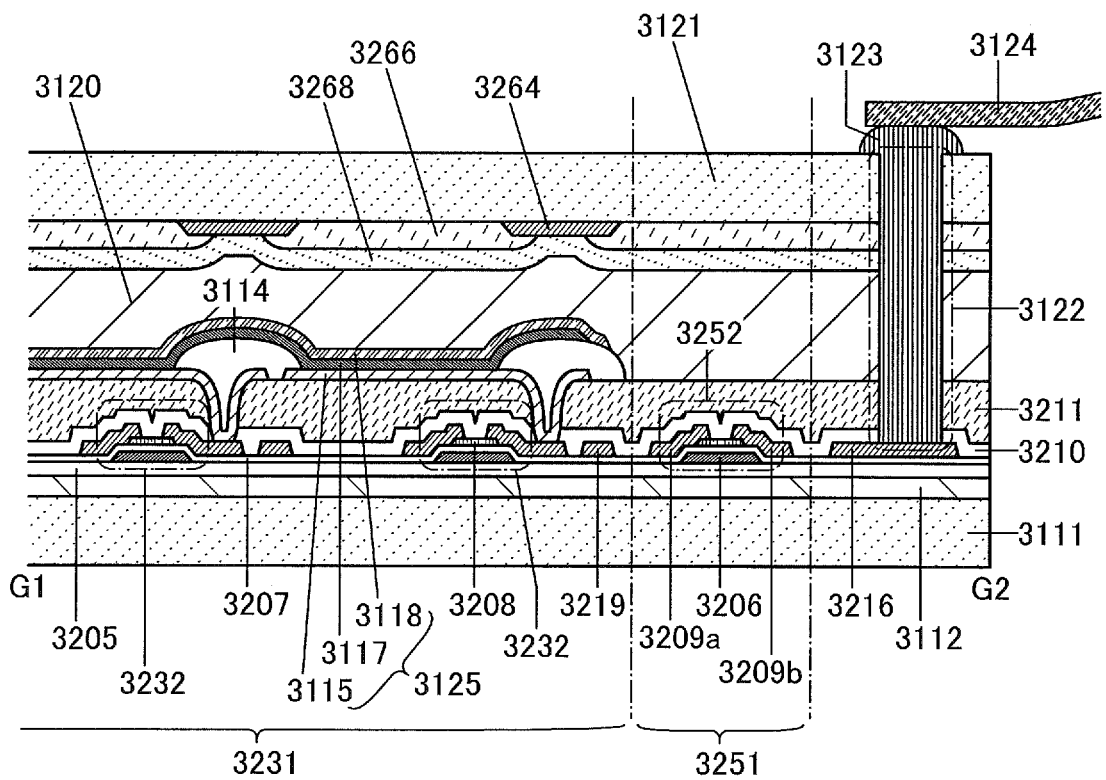

In this embodiment, a light-emitting device 3200 having a structure different from the structure of the light-emitting device 3100 described in the above embodiment is described with reference to FIGS. 27A and 27B. FIG. 27A is a top view of the light-emitting device 3200, and FIG. 27B is a cross-sectional view of a portion taken along the dashed-dotted line G1-G2 in FIG. 27A.

<Structure of Light-Emitting Device>

The light-emitting device 3200 described in this embodiment includes a display area 3231 and a peripheral circuit 3251. The light-emitting device 3200 also includes a terminal electrode 3216 and the light-emitting element 3125 including the electrode 3115, the EL layer 3117, and the electrode 3118. A plurality of light-emitting elements 3125 are formed in the display area 3231. A transistor 3232 for controlling the amount of light emitted from the light-emitting element 3125 is connected to each light-emitting element 3125.

The terminal electrode 3216 is electrically connected to the external electrode 3124 through the anisotropic conductive connection layer 3123 formed in the opening 3122. In addition, the terminal electrode 3216 is electrically connected to the peripheral circuit 3251.

The peripheral circuit 3251 includes a plurality of transistors 3252. The peripheral circuit 3251 has a function of determining which of the light-emitting elements 3125 in the display area 3231 is supplied with a signal from the external electrode 3124.

In the light-emitting device 3200 illustrated in FIGS. 27A and 27B, the substrate 3111 and the substrate 3121 are attached to each other with the bonding layer 3120 provided therebetween. An insulating layer 3205 is formed over the substrate 3111 with the bonding layer 3112 provided therebetween. The insulating layer 3205 can be formed using a material and a method similar to those of the insulating layer 205 disclosed in the above embodiment.

Note that the insulating layer 3205 functions as a base layer and can prevent or reduce diffusion of impurity elements from the substrate 3111, the bonding layer 3112, or the like to the transistor or the light-emitting element.

In addition, the transistor 3232, the transistor 3252, the terminal electrode 3216, and a wiring 3219 are formed over the insulating layer 3205. Note that although a channel-etched transistor that is a type of bottom-gate transistor is illustrated as the transistor 3232 and the transistor 3252 in this embodiment, a channel-protective transistor, a top-gate transistor, or the like can also be used. It is also possible to use a dual-gate transistor, in which a semiconductor layer in which a channel is formed is interposed between two gate electrodes.

The transistor 3232 and the transistor 3252 may have the same structure. However, the size (e.g., channel length and channel width) or the like of each transistor can be adjusted as appropriate.

The transistor 3232 and the transistor 3252 each include a gate electrode 3206, a gate insulating layer 3207, a semiconductor layer 3208, a source electrode 3209a, and a drain electrode 3209b.

The terminal electrode 3216, the wiring 3219, the gate electrode 3206, the source electrode 3209a, and the drain electrode 3209b can be formed using a material and a method similar to those of the terminal electrode 3116. In addition, the gate insulating layer 3207 can be formed using a material and a method similar to those of the insulating layer 3205.

The semiconductor layer 3208 can be formed using a material and a method similar to those of the semiconductor layer 208 disclosed in the above embodiment.

In the case where an oxide semiconductor is used for the semiconductor layer 3208, an insulating layer containing oxygen is preferably used as an insulating layer that is in contact with the semiconductor layer 3208.

In addition, an insulating layer 3210 is formed over the transistor 3232 and the transistor 3252, and an insulating layer 3211 is formed over the insulating layer 3210. The insulating layer 3210 functions as a protective insulating layer and can prevent or reduce diffusion of impurity elements from a layer above the insulating layer 3210 to the transistor 3232 and the transistor 3252. The insulating layer 3210 can be formed using a material and a method similar to those of the insulating layer 3205.

Planarization treatment may be performed on the insulating layer 3211 to reduce unevenness of a surface on which the light-emitting element 3125 is formed. The planarization treatment may be, but not particularly limited to, polishing treatment (e.g., chemical mechanical polishing) or dry etching treatment.

Forming the insulating layer 3211 using an insulating material with a planarization function can omit polishing treatment. As the insulating material with a planarization function, for example, an organic material such as a polyimide resin or an acrylic resin can be used. Other than the above-described organic materials, it is also possible to use a low-dielectric constant material (low-k material) or the like. Note that the insulating layer 3211 may be formed by stacking a plurality of insulating films formed of these materials.

In addition, over the insulating layer 3211, the light-emitting element 3125 and the partition 3114 for separating the adjacent light-emitting elements 3125 are formed.

In addition, the substrate 3121 is provided with a light-shielding film 3264, a coloring layer 3266, and an overcoat layer 3268. The light-emitting device 3200 is what is called a top-emission light-emitting device in which light emitted from the light-emitting element 3125 is extracted from the substrate 3121 side through the coloring layer 3266.

The light-emitting element 3125 is electrically connected to the transistor 3232 through the opening formed in the insulating layer 3211 and the insulating layer 3210.

Although an active matrix light-emitting device is described as an example of the light-emitting device in this embodiment, the present invention can also be applied to a passive matrix light-emitting device.

One embodiment of the present invention can be applied to display devices such as a liquid crystal display device including a liquid crystal element as a display element, an electronic paper, DMD, PDP, FED, and SED, without limitation to a light-emitting device including a light-emitting element as a display element.

An example of a liquid crystal element can be similar the liquid crystal element disclosed in the above embodiment. A driving method of a liquid crystal element can be similar to any of the driving methods of the liquid crystal element disclosed in the above embodiment.

A display method of an electronic paper can be similar to any of the display methods of the electronic paper disclosed in the above embodiment.

This embodiment can be implemented in an appropriate combination with any of the structures described in the other embodiments.

Embodiment 9

In this embodiment, structure examples of a light-emitting element that can be applied to the light-emitting element 125, the light-emitting element 2125, and the light-emitting element 3125 are described. Note that an EL layer 320 described in this embodiment corresponds to the EL layer 117, the EL layer 2117, and the EL layer 3117 described in the above embodiments.

<Structure of Light-Emitting Element>

Figure 28A:
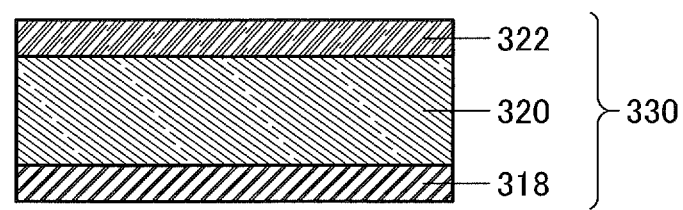
FIGS. 28A and 28B illustrate structure examples of light-emitting elements.

In a light-emitting element 330 illustrated in FIG. 28A, the EL layer 320 is interposed between a pair of electrodes (a first electrode 318 and a second electrode 322). Note that the first electrode 318 is used as an anode and the second electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, and an electron-injection layer can be used in combination as appropriate.

The light-emitting element 330 illustrated in FIG. 28A emits light when current flows because of a potential difference generated between the first electrode 318 and the second electrode 322 and holes and electrons are recombined in the EL layer 320. That is, the light-emitting region is formed in the EL layer 320.

In the present invention, light emitted from the light-emitting element 330 is extracted to the outside from the first electrode 318 side or the second electrode 322 side. Therefore, one of the first electrode 318 and the second electrode 322 is formed of a light-transmitting substance.

Figure 28B:
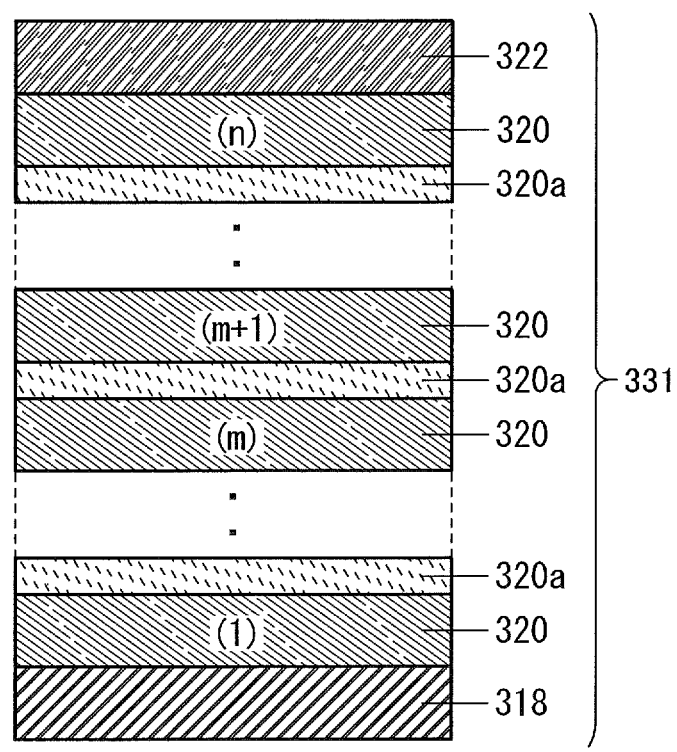

Note that a plurality of EL layers 320 may be stacked between the first electrode 318 and the second electrode 322 as in a light-emitting element 331 illustrated in FIG. 28B. In the case where n (n is a natural number of 2 or more) layers are stacked, a charge generation layer 320a is preferably provided between an m-th EL layer 320 and an (m+1)-th EL layer 320. Note that m is a natural number greater than or equal to 1 and less than n.

The charge generation layer 320a can be formed using a composite material of an organic compound and a metal oxide, a metal oxide, a composite material of an organic compound and an alkali metal, an alkaline earth metal, or a compound thereof; alternatively, these materials can be combined as appropriate. Examples of the composite material of an organic compound and a metal oxide include composite materials of an organic compound and a metal oxide such as vanadium oxide, molybdenum oxide, and tungsten oxide. As the organic compound, a variety of compounds can be used; for example, low molecular compounds such as an aromatic amine compound, a carbazole derivative, and aromatic hydrocarbon and high molecular compounds (e.g., oligomer, dendrimer, and polymer). As the organic compound, it is preferable to use the organic compound which has a hole-transport property and has a hole mobility of $10^{-6}$ cm$^2$/Vs or higher. However, substances other than the substances given above may also be used as long as the substances have higher hole-transport properties than electron-transport properties. These materials used for the charge generation layer 320a have excellent carrier-injection properties and carrier-transport properties; thus, the light-emitting element 330 can be driven with low current and with low voltage.

Note that the charge generation layer 320a may be formed with a combination of a composite material of an organic compound and a metal oxide and another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

The light-emitting element 331 having such a structure is unlikely to have problems such as energy transfer and quenching and has an expanded choice of materials, and thus can easily have both high emission efficiency and a long lifetime. Moreover, it is easy to obtain phosphorescence from one EL layer and fluorescence from the other EL layer.

The charge generation layer 320a has a function of injecting holes to one of the EL layers 320 that is in contact with the charge generation layer 320a and a function of injecting electrons to the other EL layer 320 that is in contact with the charge generation layer 320a, when voltage is applied to the first electrode 318 and the second electrode 322.

The light-emitting element 331 illustrated in FIG. 28B can provide a variety of emission colors by changing the type of the light-emitting substance used for the EL layer 320. In addition, a plurality of light-emitting substances emitting light of different colors may be used as the light-emitting substances, whereby light emission having a broad spectrum or white light emission can be obtained.

In the case of obtaining white light emission using the light-emitting element 331 illustrated in FIG. 28B, as for the combination of a plurality of EL layers, a structure for emitting white light including red light, green light, and blue light may be used; for example, the structure may include a first light-emitting layer containing a blue fluorescent substance as a light-emitting substance and a second light-emitting layer containing red and green phosphorescent substances as light-emitting substances. Alternatively, a structure including a first light-emitting layer emitting red light, a second light-emitting layer emitting green light, and a third light-emitting layer emitting blue light may be employed. Further alternatively, with a structure including light-emitting layers emitting light of complementary colors, white light emission can be obtained. When light emitted from the first light-emitting layer and light emitted from the second light-emitting layer have complementary colors to each other in a stacked-layer element including two light-emitting layers, the combinations of colors are as follows: blue and yellow, blue-green and red, and the like.

Note that in the structure of the above-described stacked-layer element, by providing the charge generation layer between the stacked light-emitting layers, the element can have a long lifetime in a high-luminance region while keeping the current density low. In addition, the voltage drop due to the resistance of the electrode material can be reduced, whereby uniform light emission in a large area is possible.

This embodiment can be implemented in an appropriate combination with any of the structures described in the other embodiments.

Embodiment 10

In this embodiment, examples of an electronic appliance and a lighting device including the light-emitting device of one embodiment of the present invention are described with reference to drawings.

As examples of electronic appliances with flexibility, the following can be given: television devices (also called televisions or television receivers), monitors of computers or the like, digital cameras, digital video cameras, digital photo frames, mobile phones (also called cellular phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 29A:
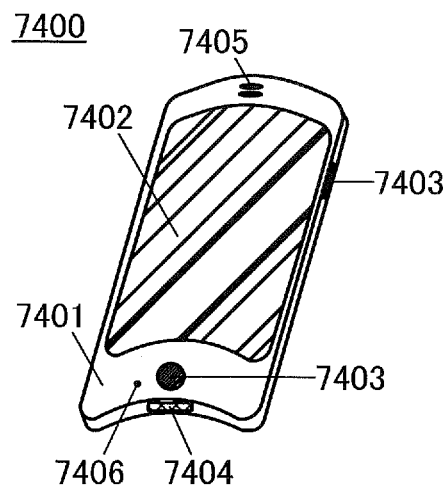
FIGS. 29A to 29E illustrate examples of electronic appliances and lighting devices.

FIG. 29A illustrates an example of a mobile phone. A mobile phone 7400 is provided with a display portion 7402 incorporated in a housing 7401, an operation button 7403, an external connection port 7404, a speaker 7405, a microphone 7406, and the like. Note that the mobile phone 7400 is manufactured using the light-emitting device in the display portion 7402.

When the display portion 7402 of the mobile phone 7400 illustrated in FIG. 29A is touched with a finger or the like, data can be input to the mobile phone 7400. Further, operations such as making a call and inputting a character can be performed by touch on the display portion 7402 with a finger or the like.

The power can be turned on or off with the operation button 7403. In addition, types of images displayed on the display portion 7402 can be switched; for example, switching images from a mail creation screen to a main menu screen.

Here, the display portion 7402 includes the light-emitting device of one embodiment of the present invention. Thus, the mobile phone can have a curved display portion and high reliability.

Figure 29B:
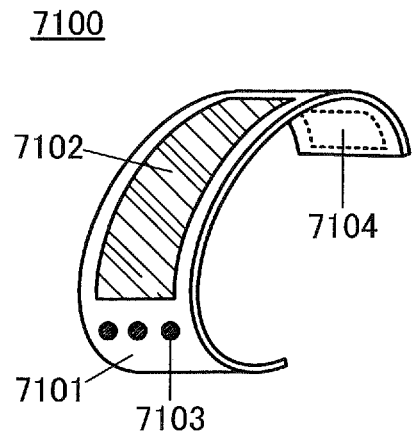

FIG. 29B is an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

Here, the display portion 7102 includes the light-emitting device of one embodiment of the present invention. Thus, the portable display device can have a curved display portion and high reliability.

Figure 29C:
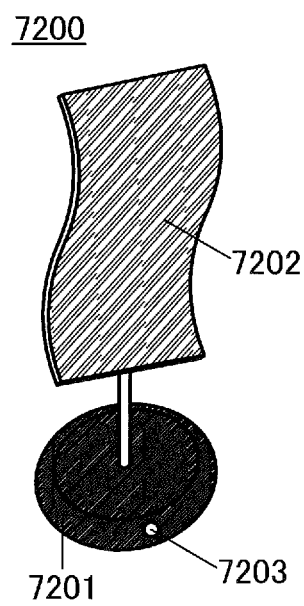
Figure 29D:
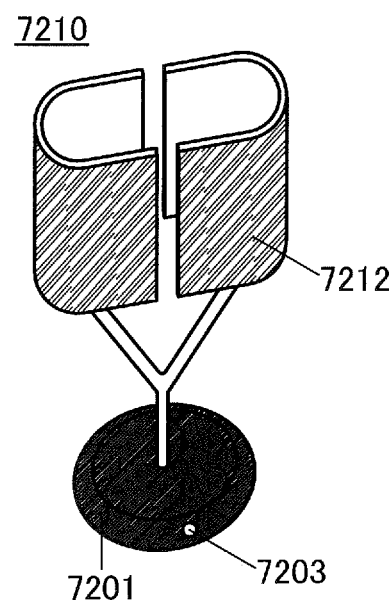
Figure 29E:
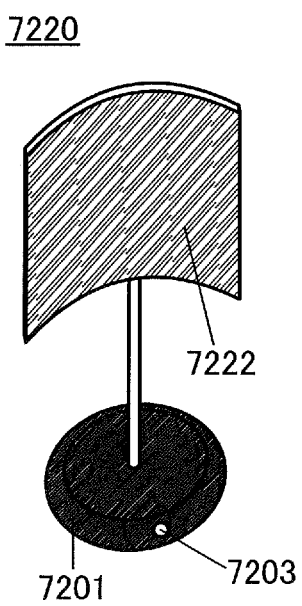

FIGS. 29C to 29E illustrate examples of lighting devices. A lighting device 7200, a light-emitting device 7210, and a light-emitting device 7220 each include a stage 7201 provided with an operation switch 7203 and a light-emitting portion supported by the stage 7201.

The lighting device 7200 illustrated in FIG. 29C includes a light-emitting portion 7202 with a wave-shaped light-emitting surface and thus is a good-design lighting device.

A light-emitting portion 7212 included in the lighting device 7210 illustrated in FIG. 29D has two convex-curved light-emitting portions symmetrically placed. Thus, light radiates from the lighting device 7210.

The lighting device 7220 illustrated in FIG. 29E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

The light-emitting portions included in the lighting devices 7200, 7210, and 7220 each include the light-emitting device of one embodiment of the present invention. Thus, the lighting devices can have curved light-emitting portions and high reliability.

Figure 30A:
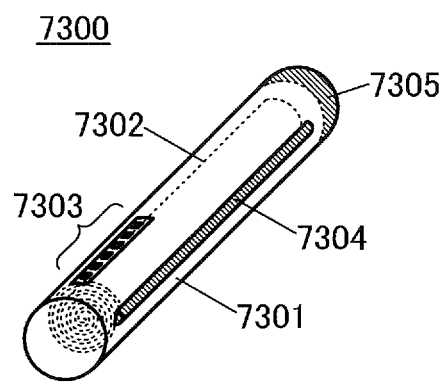
FIGS. 30A and 30B illustrate an example of an electronic appliance.

FIG. 30A illustrates an example of a portable display device. A display device 7300 includes a housing 7301, a display portion 7302, operation buttons 7303, a display portion pull 7304, and a control portion 7305.

The display device 7300 includes a rolled flexible display portion 7102 in the cylindrical housing 7301.

The display device 7300 can receive a video signal with the control portion 7305 and can display the received video on the display portion 7302. In addition, a battery is included in the control portion 7305. Moreover, a connector may be included in the control portion 7305 so that a video signal or power can be supplied directly.

With the operation buttons 7303, power ON/OFF, switching of displayed videos, and the like can be performed.

Figure 30B:
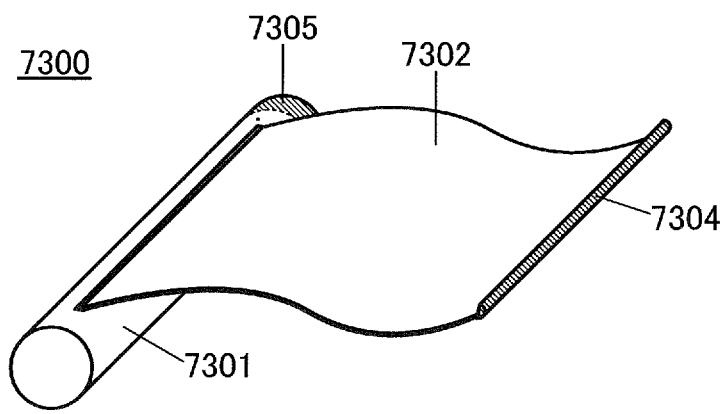

FIG. 30B illustrates a state in which the display portion 7302 is pulled out with the display portion pull 7304. Videos can be displayed on the display portion 7302 in this state. Further, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes the light-emitting device of one embodiment of the present invention. Thus, the display portion 7302 is a flexible, highly reliable display portion, which makes the display device 7300 lightweight and highly reliable.

It is needless to say that one embodiment of the present invention is not limited to the above-described electronic appliances and lighting devices as long as the light-emitting device of one embodiment of the present invention is included.

This embodiment can be combined with any of the other embodiments disclosed in this specification as appropriate.

This application is based on Japanese Patent Application serial no. 2013-051231 filed with the Japan Patent Office on Mar. 14, 2013, Japanese Patent Application serial no. 2013-093328 filed with the Japan Patent Office on Apr. 26, 2013, and Japanese Patent Application serial no. 2013-120369 filed with the Japan Patent Office on Jun. 7, 2013, the entire contents of which are hereby incorporated by reference.

What is claimed is:

1. A method for forming a light-emitting device comprising the steps of:

forming a first layer over and in contact with a terminal electrode;

forming an EL layer over and in contact with a first electrode;

forming a second layer over and in contact with the first layer;

forming a second electrode over and in contact with the EL layer;

forming a first resin layer comprising a first opening over the second electrode;

forming a substrate comprising a second opening over the first resin layer;

forming a second resin layer over the second layer and in a region where the first opening and the second opening overlap with each other;

removing the second resin layer, the first layer, and the second layer to expose a surface of the terminal electrode; and forming a conductive layer in contact with the surface of the terminal electrode through the first opening and the second opening, wherein a light-emitting element comprises the first electrode, the EL layer, and the second electrode, wherein the first layer and the EL layer comprise a first material, and wherein the second layer and the second electrode comprise a second material.

2. A method for forming a light-emitting device according to claim 1, wherein the first material is an organic material.

3. A method for forming a light-emitting device according to claim 1, wherein the second material is a metal material, a conductive oxide material, or a semiconductor material.

4. A method for forming a light-emitting device comprising the steps of:

forming a first layer over and in contact with a terminal electrode;

forming an EL layer over and in contact with a first electrode;

forming a second layer over and in contact with the first layer;

forming a second electrode over and in contact with the EL layer;

forming a first resin layer comprising a first opening over the second electrode;

forming a substrate comprising a second opening over the first resin layer;

forming a second resin layer over the second layer and in a region where the first opening and the second opening overlap with each other;

removing the second resin layer and the second layer;

removing the first layer by using an organic solvent to expose a surface of the terminal electrode; and forming a conductive layer in contact with the surface of the terminal electrode through the first opening and the second opening, wherein a light-emitting element comprises the first electrode, the EL layer, and the second electrode, wherein the first layer and the EL layer comprise a first material, and wherein the second layer and the second electrode comprise a second material.

5. A method for forming a light-emitting device according to claim 4, wherein the first material is an organic material.

6. A method for forming a light-emitting device according to claim 4, wherein the second material is a metal material, a conductive oxide material, or a semiconductor material.

* * * * *